US011011209B2

(12) United States Patent
Kim et al.

(10) Patent No.: US 11,011,209 B2
(45) Date of Patent: May 18, 2021

(54) THREE-DIMENSIONAL MEMORY DEVICE INCLUDING CONTACT-LEVEL BIT-LINE-CONNECTION STRUCTURES AND METHODS OF MAKING THE SAME

(71) Applicant: SANDISK TECHNOLOGIES LLC, Addison, TX (US)

(72) Inventors: Jee-Yeon Kim, San Jose, CA (US); Kwang-Ho Kim, Pleasanton, CA (US); Yuki Mizutani, San Jose, CA (US); Fumiaki Toyama, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 52 days.

(21) Appl. No.: 16/589,404

(22) Filed: Oct. 1, 2019

(65) Prior Publication Data
US 2021/0098029 A1    Apr. 1, 2021

(51) Int. Cl.
*H01L 29/76*    (2006.01)
*G11C 5/06*    (2006.01)
(Continued)

(52) U.S. Cl.
CPC .......... *G11C 5/063* (2013.01); *H01L 23/5226* (2013.01); *H01L 23/5283* (2013.01);
(Continued)

(58) Field of Classification Search
None
See application file for complete search history.

(56) References Cited

U.S. PATENT DOCUMENTS 5,915,167 A    6/1999 Leedy
9,356,034 B1    5/2016 Yada et al.
(Continued)

FOREIGN PATENT DOCUMENTS

KR    1020180001296 A    1/2018
WO    WO2013078068 A1    5/2013

OTHER PUBLICATIONS

Notification of Transmittal of the International Search Report and Written Opinion of the International Search Authority for International Patent Application No. PCT/US2020/023012, dated Jul. 10, 2020, 9 pages.
(Continued)

*Primary Examiner* — Angel Roman
(74) *Attorney, Agent, or Firm* — The Marbury Law Group PLLC

(57) ABSTRACT

A semiconductor structure includes a memory die, which includes an alternating stack of insulating layers and electrically conductive layers located over a substrate and memory stack structures vertically extending through the alternating stacks. A contact-level dielectric layer embeds drain contact via structures that are electrically connected to a respective drain region and contact-level metal interconnects, and a via-level dielectric embedding drain-to-bit-line connection via structures, bit-line-connection via structures, and pad-connection via structures. A bit-line-level dielectric layer overlies the via-level dielectric layer, and embeds bit lines that contact a respective subset of the drain-to-bit-line connection via structures, and embeds metal pads that contact a respective one of the pad-connection via structures. Each metal pad is electrically connected to a respective bit line through a series connection of a respective pad-connection via structure, a respective contact-level metal interconnect, and a respective bit-line-connection via structure.

20 Claims, 41 Drawing Sheets

(51) Int. Cl.
- *H01L 23/522* (2006.01)
- *H01L 23/528* (2006.01)
- *H01L 23/00* (2006.01)
- *H01L 27/11582* (2017.01)
- *H01L 27/11524* (2017.01)
- *H01L 27/11556* (2017.01)
- *H01L 27/11565* (2017.01)
- *H01L 27/1157* (2017.01)
- *H01L 27/11519* (2017.01)

(52) U.S. Cl.
CPC .......... *H01L 24/09* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 27/11582* (2013.01)

(56) References Cited

U.S. PATENT DOCUMENTS

| | | |
|---|---|---|
| 9,806,093 B2 | 10/2017 | Toyama et al. |
| 9,818,693 B2 | 11/2017 | Toyama et al. |
| 9,818,759 B2 | 11/2017 | Kai et al. |
| 10,038,006 B2 | 7/2018 | Furihata et al. |
| 10,115,681 B1 | 10/2018 | Ariyoshi |
| 10,256,248 B2 | 4/2019 | Lu et al. |
| 10,269,620 B2 | 4/2019 | Yu et al. |
| 10,283,493 B1 | 5/2019 | Nishida |
| 10,319,680 B1 | 6/2019 | Sel et al. |
| 10,354,980 B1 | 7/2019 | Mushiga et al. |
| 10,354,987 B1 | 7/2019 | Mushiga et al. |
| 10,355,009 B1 | 7/2019 | Kai et al. |
| 10,381,322 B1 | 8/2019 | Azuma et al. |
| 10,381,362 B1 | 8/2019 | Cui et al. |
| 10,381,371 B2 | 8/2019 | Ogawa et al. |
| 10,388,666 B1 | 8/2019 | Kai et al. |
| 2003/0214022 A1 | 11/2003 | Yang et al. |
| 2004/0072407 A1 | 4/2004 | Lung |
| 2004/0124466 A1 | 7/2004 | Walker et al. |
| 2004/0125629 A1 | 7/2004 | Scheuerlein et al. |
| 2008/0232181 A1 | 9/2008 | Higashi et al. |
| 2010/0238699 A1 | 9/2010 | Miyakawa et al. |
| 2011/0299340 A1 | 12/2011 | Samachisa et al. |
| 2013/0016557 A1 | 1/2013 | Kim |
| 2013/0201744 A1 | 8/2013 | Pagliato et al. |
| 2013/0265814 A1 | 10/2013 | Shin |
| 2014/0022848 A1 | 1/2014 | Samachisa et al. |
| 2014/0056072 A1 | 2/2014 | Hung |
| 2016/0276360 A1 | 9/2016 | Doda et al. |
| 2017/0125433 A1 | 5/2017 | Ogawa et al. |
| 2017/0179026 A1 | 6/2017 | Toyama et al. |
| 2017/0179151 A1 | 6/2017 | Kai et al. |
| 2017/0179152 A1 | 6/2017 | Toyama et al. |
| 2017/0179153 A1 | 6/2017 | Ogawa et al. |
| 2017/0179154 A1 | 6/2017 | Furihata et al. |
| 2017/0236746 A1 | 8/2017 | Yu et al. |
| 2017/0352678 A1 | 12/2017 | Lu et al. |
| 2018/0130818 A1* | 5/2018 | Kim .................... H01L 27/1157 |
| 2018/0158834 A1 | 6/2018 | Ogawa et al. |
| 2018/0166142 A1 | 6/2018 | Cai et al. |
| 2019/0221557 A1 | 7/2019 | Kim et al. |
| 2019/0221574 A1 | 7/2019 | Shimabukuro et al. |
| 2019/0252361 A1 | 8/2019 | Nishida |
| 2019/0259698 A1 | 8/2019 | Takahashi et al. |
| 2019/0280003 A1 | 9/2019 | Mushiga et al. |
| 2020/0357814 A1* | 11/2020 | Kim .................. H01L 27/11558 |

OTHER PUBLICATIONS

U.S. Appl. No. 16/213,180, filed Dec. 7, 2018, SanDisk Technologies LLC.
U.S. Appl. No. 16/213,382, filed Dec. 7, 2018, SanDisk Technologies LLC.
U.S. Appl. No. 16/231,752, filed Dec. 24, 2018, SanDisk Technologies LLC.
U.S. Appl. No. 16/242,216, filed Jan. 8, 2019, SanDisk Technologies LLC.
U.S. Appl. No. 16/248,923, filed Jan. 16, 2019, SanDisk Technologies LLC.
U.S. Appl. No. 16/249,423, filed Jan. 16, 2019, SanDisk Technologies LLC.
U.S. Appl. No. 16/251,782, filed Jan. 18, 2019, SanDisk Technologies LLC.
U.S. Appl. No. 16/255,413, filed Jan. 23, 2019, SanDisk Technologies LLC.
U.S. Appl. No. 16/269,301, filed Feb. 6, 2019, SanDisk Technologies LLC.
U.S. Appl. No. 16/274,687, filed Feb. 13, 2019, SanDisk Technologies LLC.
U.S. Appl. No. 16/275,668, filed Feb. 14, 2019, SanDisk Technologies LLC.
U.S. Appl. No. 16/278,372, filed Feb. 18, 2019, SanDisk Technologies LLC.
U.S. Appl. No. 16/284,502, filed Feb. 18, 2019, SanDisk Technologies LLC.
U.S. Appl. No. 16/288,656, filed Feb. 28, 2019, SanDisk Technologies LLC.
U.S. Appl. No. 16/291,457, filed Mar. 4, 2019, SanDisk Technologies LLC.
U.S. Appl. No. 16/291,504, filed Mar. 4, 2019, SanDisk Technologies LLC.
U.S. Appl. No. 16/291,577, filed Mar. 4, 2019, SanDisk Technologies LLC.
U.S. Appl. No. 16/295,292, filed Mar. 7, 2019, SanDisk Technologies LLC.
U.S. Appl. No. 16/366,245, filed Mar. 27, 2019, SanDisk Technologies LLC.
U.S. Appl. No. 16/366,330, filed Mar. 27, 2019, SanDisk Technologies LLC.
U.S. Appl. No. 16/372,908, filed Apr. 2, 2019, SanDisk Technologies LLC.
U.S. Appl. No. 16/385,010, filed Apr. 16, 2019, SanDisk Technologies LLC.
U.S. Appl. No. 16/391,632, filed Apr. 23, 2019, SanDisk Technologies LLC.
U.S. Appl. No. 16/404,844, filed May 7, 2019, SanDisk Technologies LLC.
U.S. Appl. No. 16/404,961, filed May 7, 2019, SanDisk Technologies LLC.
U.S. Appl. No. 16/409,593, filed May 10, 2019, SanDisk Technologies LLC.
U.S. Appl. No. 16/417,913, filed May 21, 2019, SanDisk Technologies LLC.
U.S. Appl. No. 16/440,183, filed Jun. 13, 2019, SanDisk Technologies LLC.
U.S. Appl. No. 16/521,849, filed Jul. 25, 2019, SanDisk Technologies LLC.
Endoh et al., "Novel Ultra High Density Memory with a Stacked-Surrounding Gate Transistor (S-SGT) Structured Cell," IEDM Proc., (2001), 33-36.

* cited by examiner

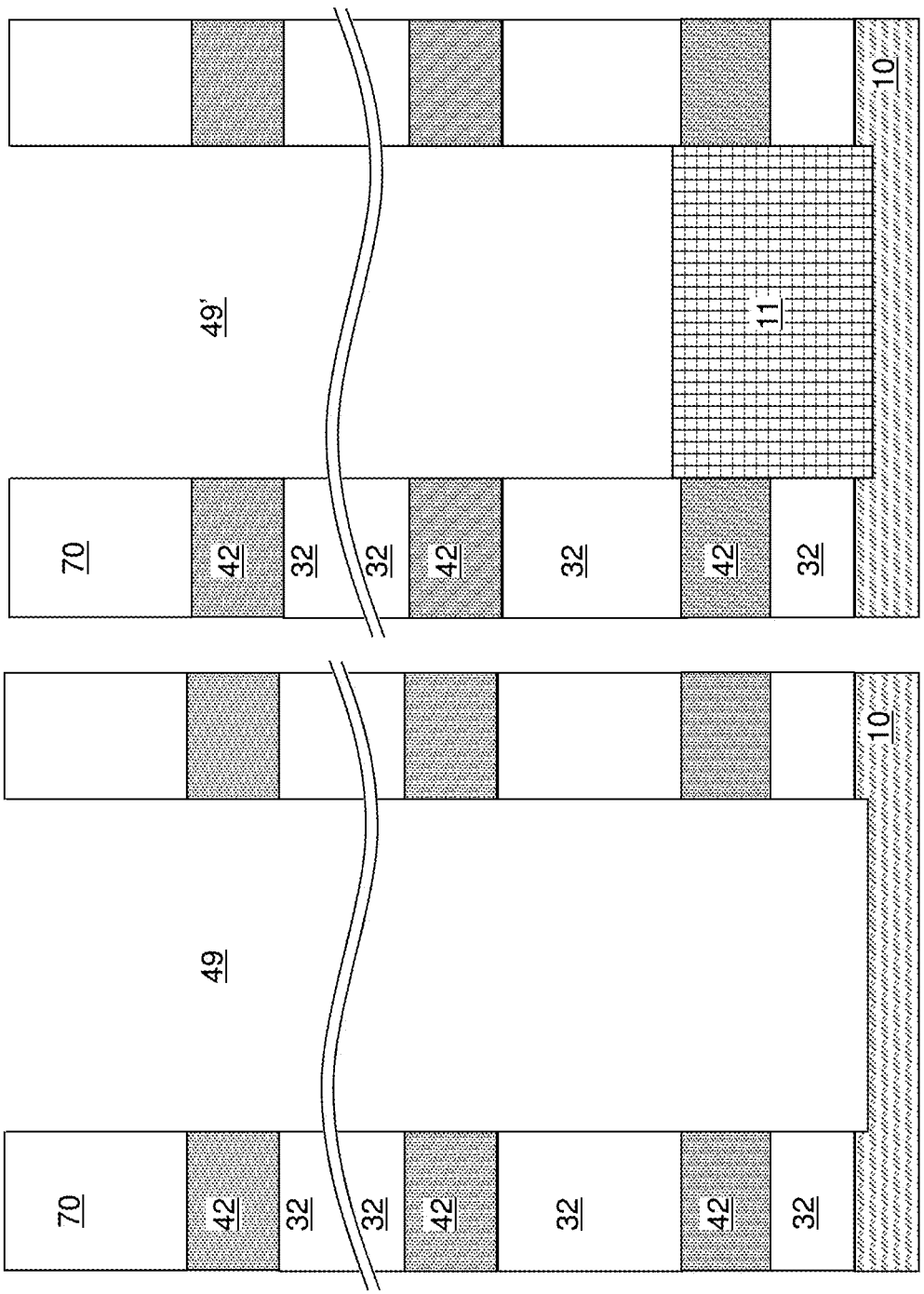

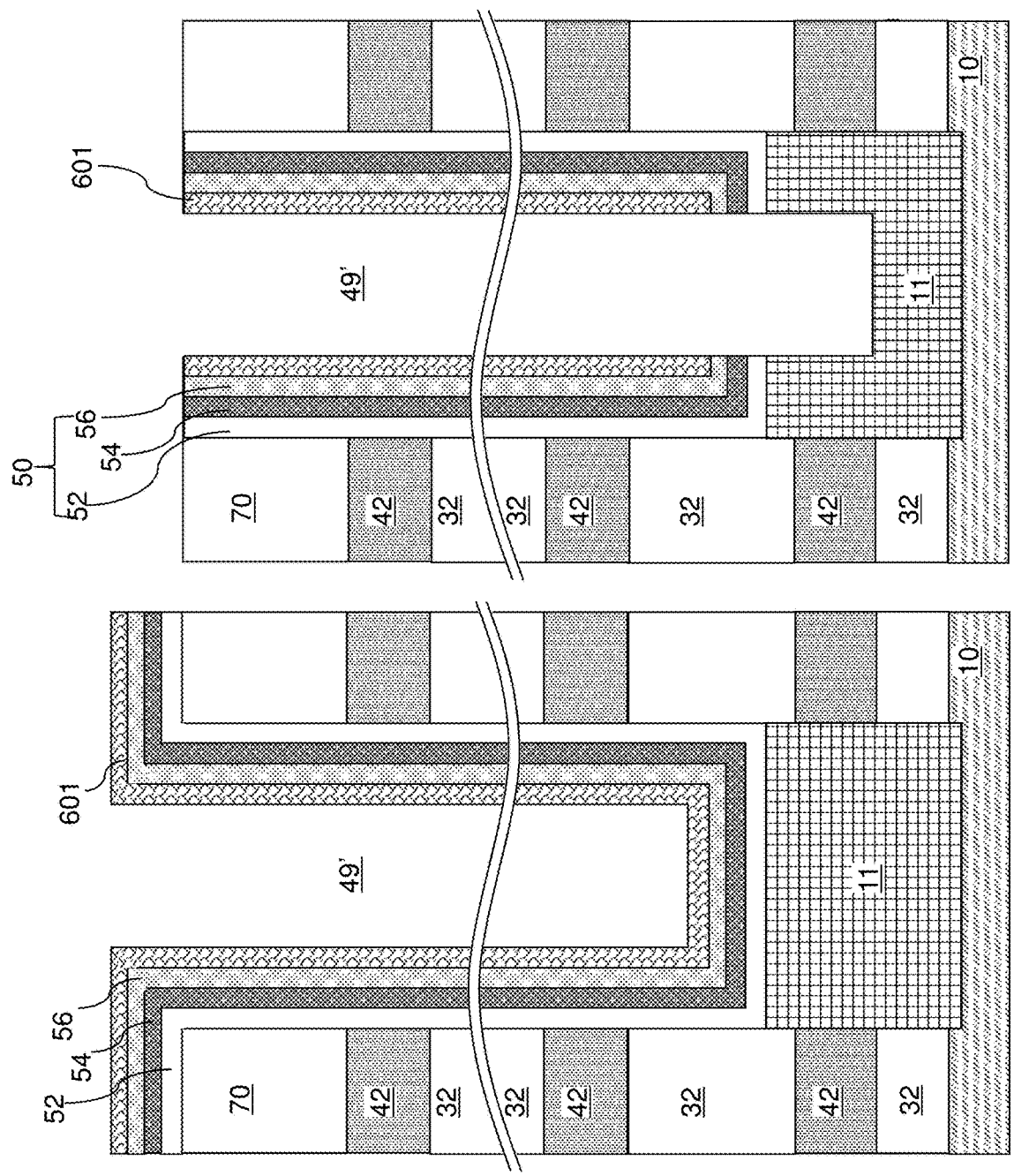

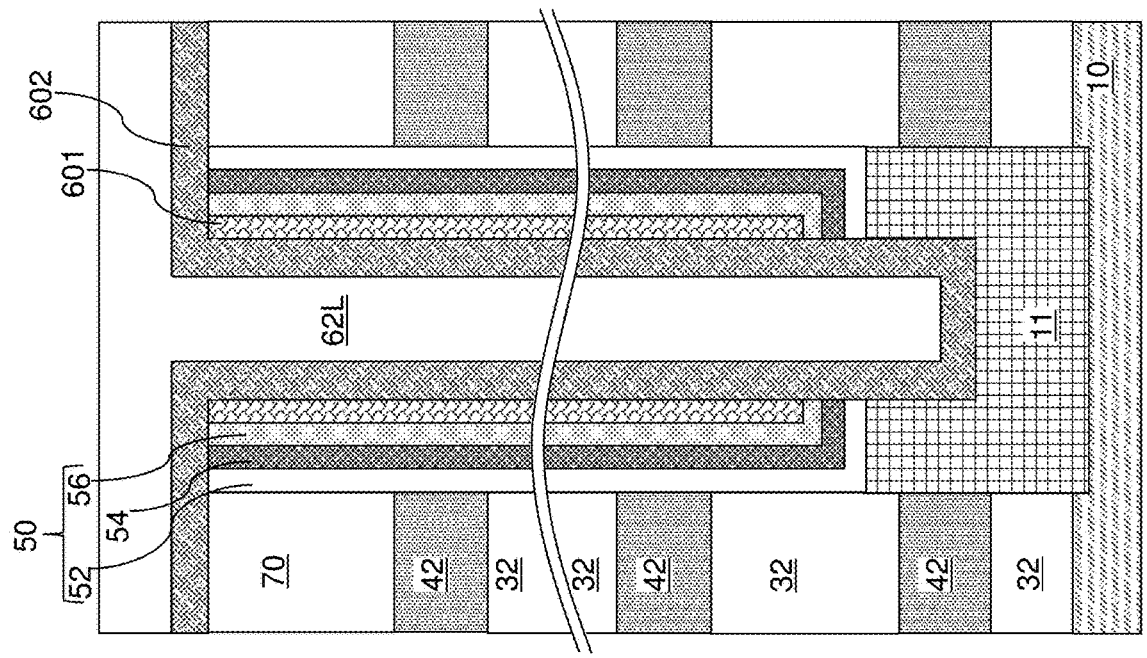
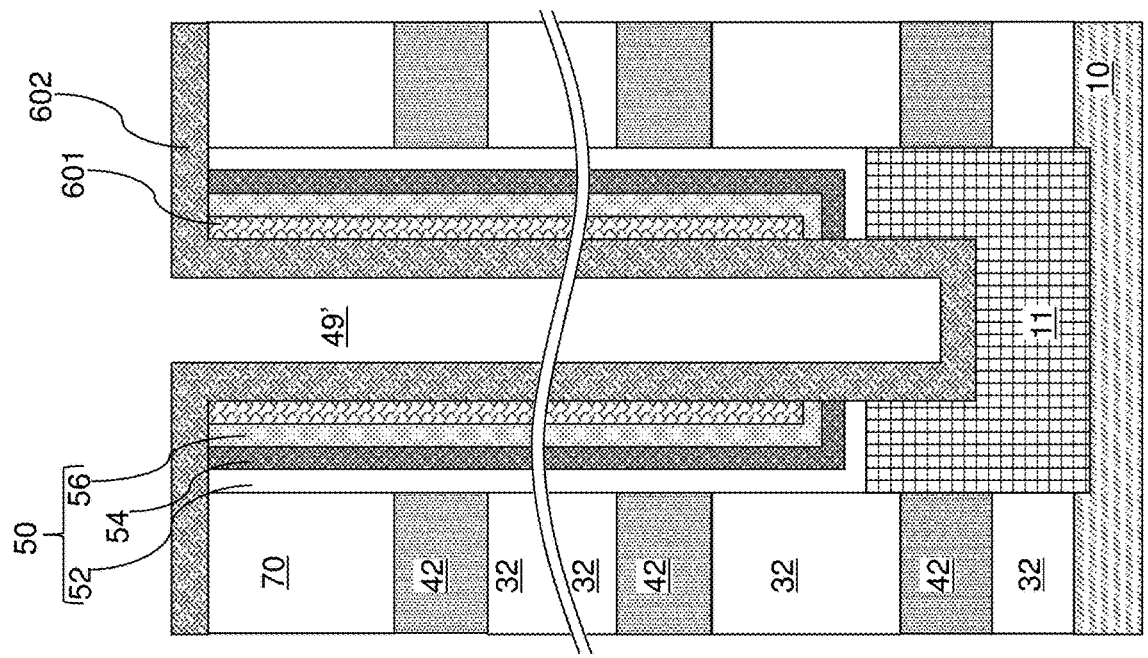
FIG. 5F
FIG. 5E

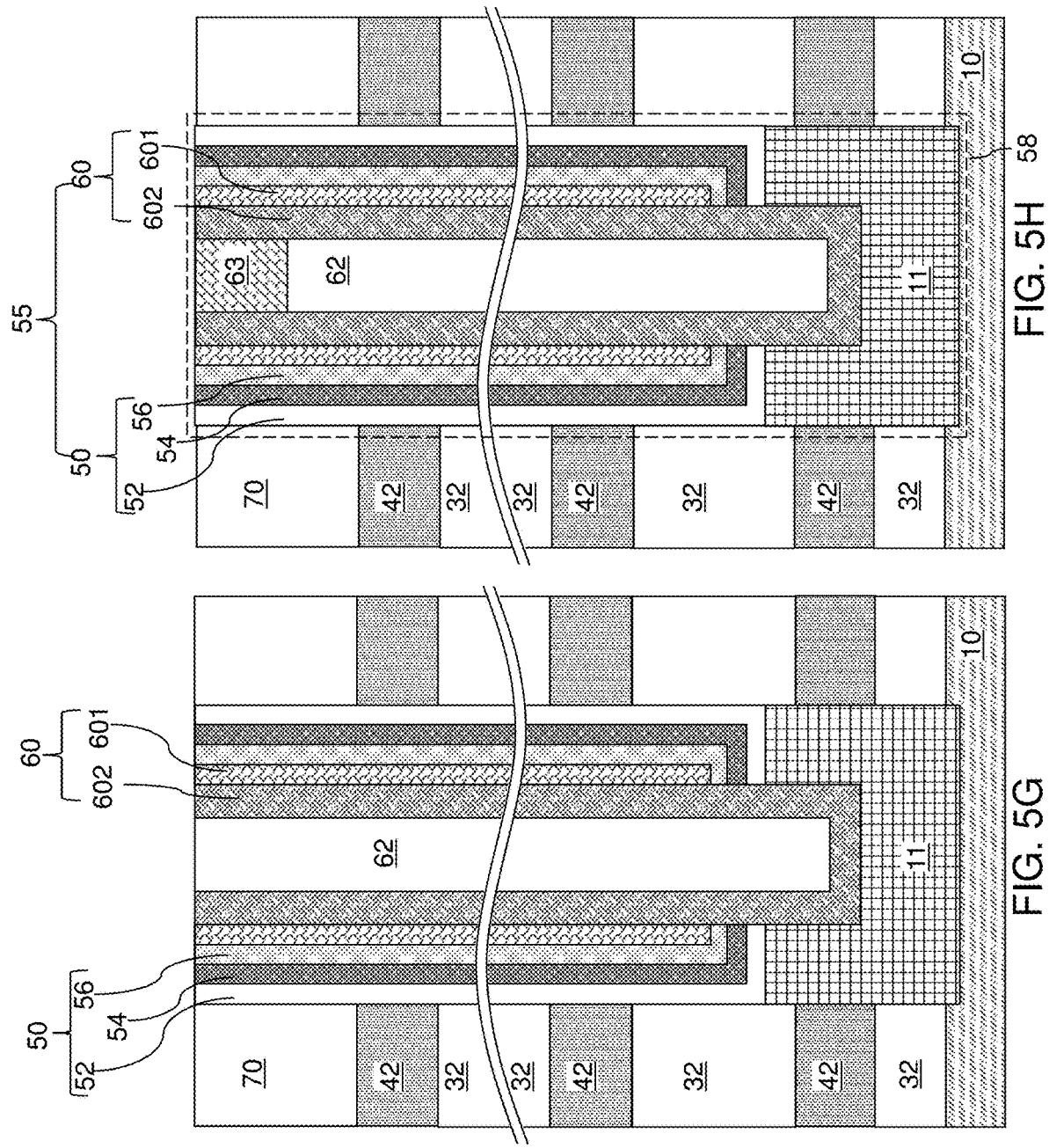

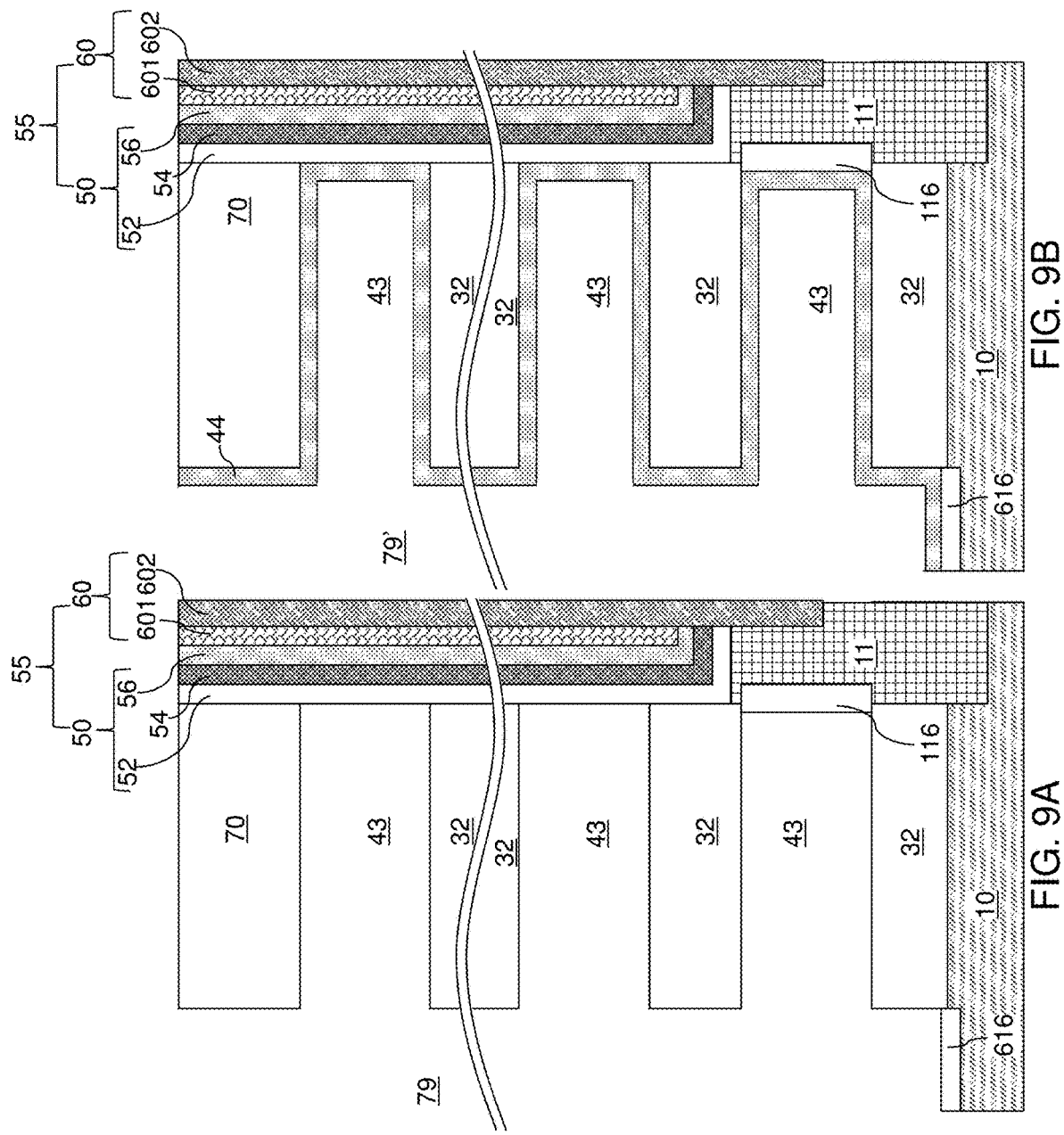

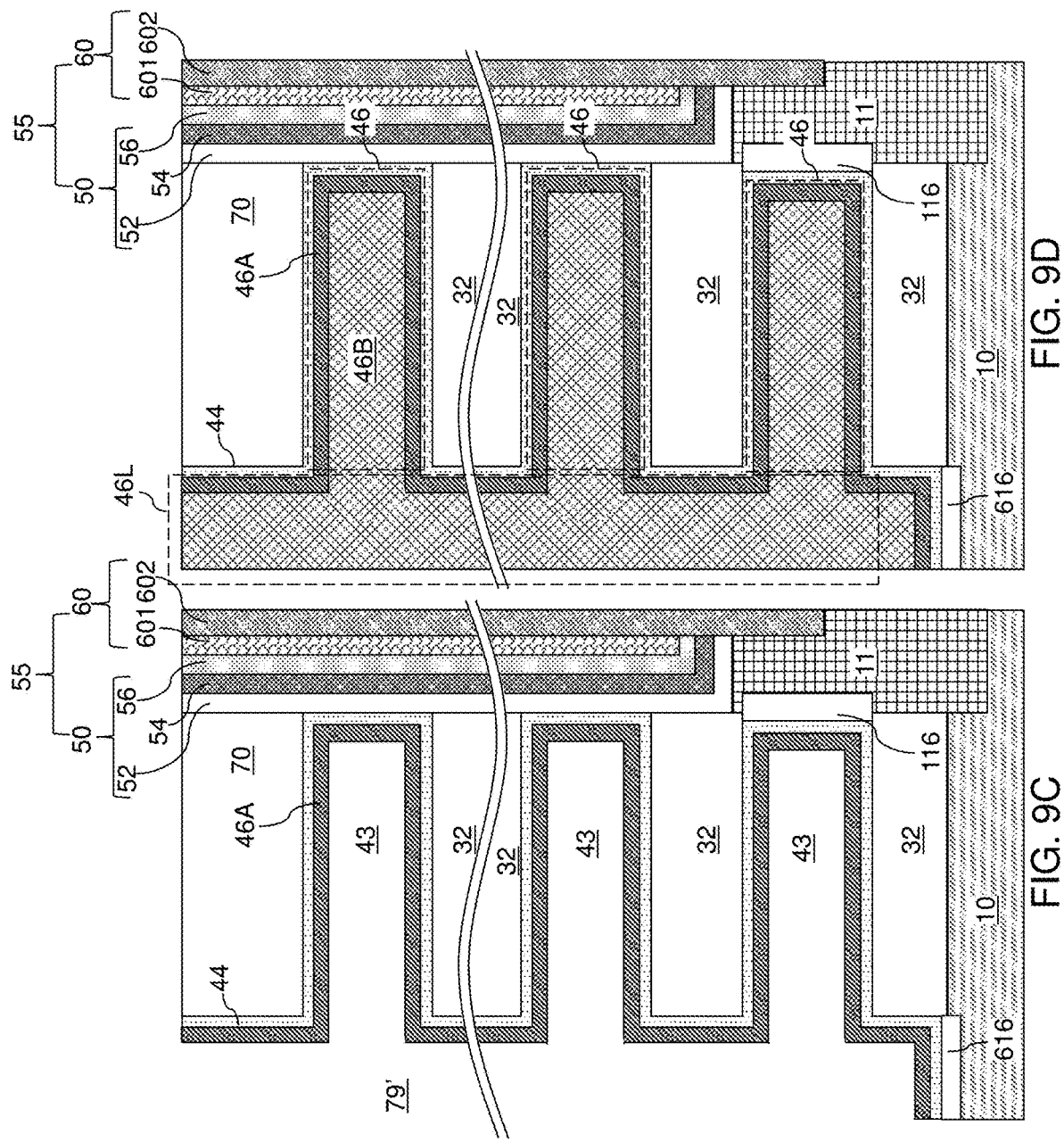

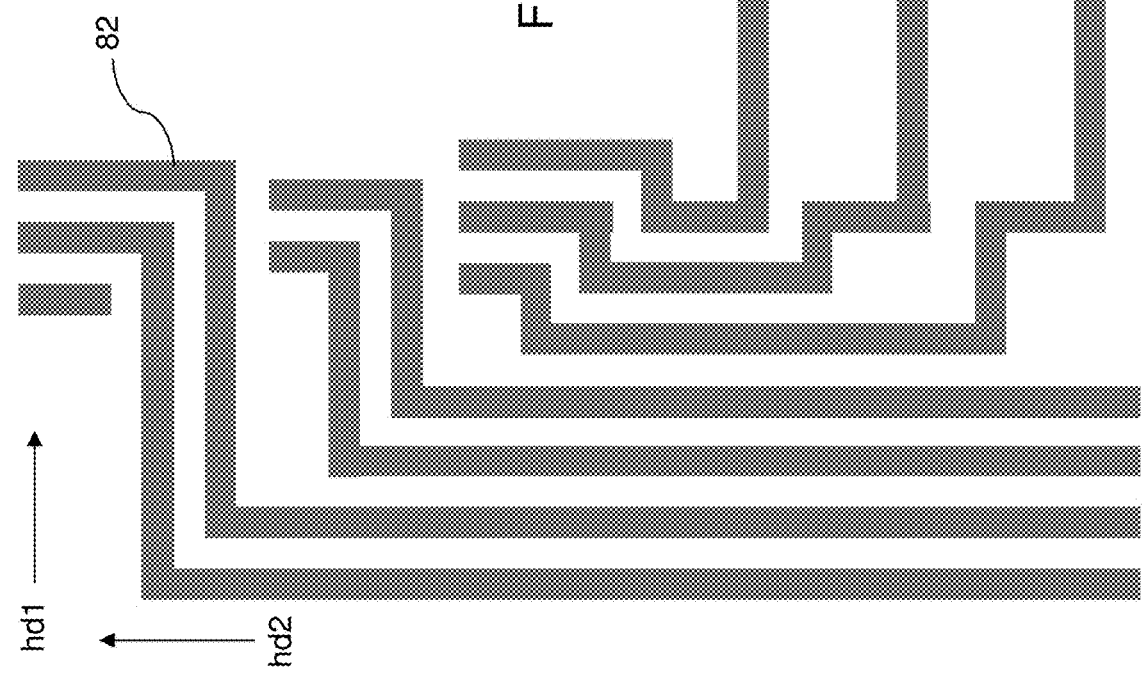
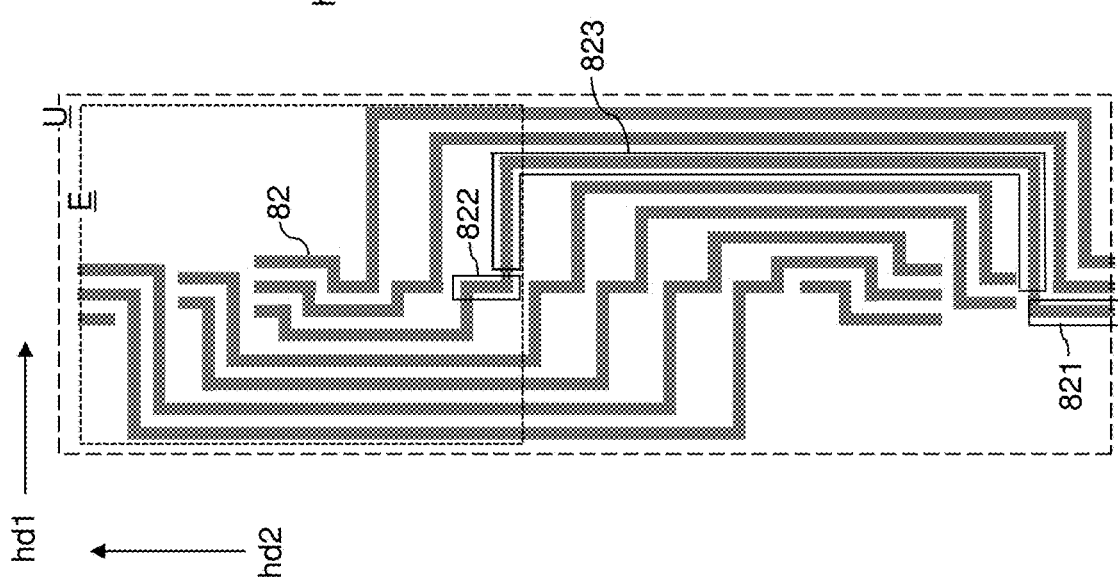

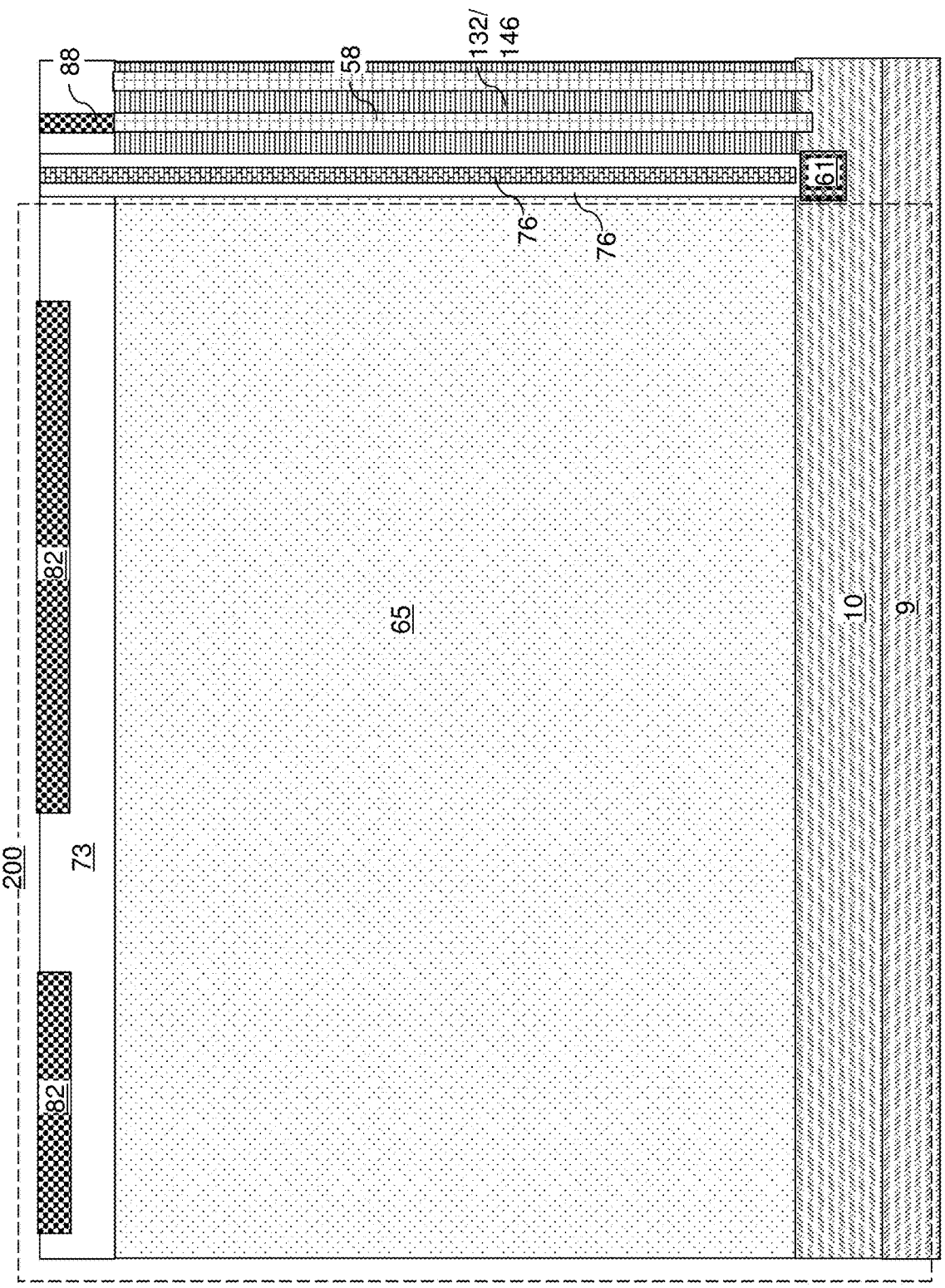

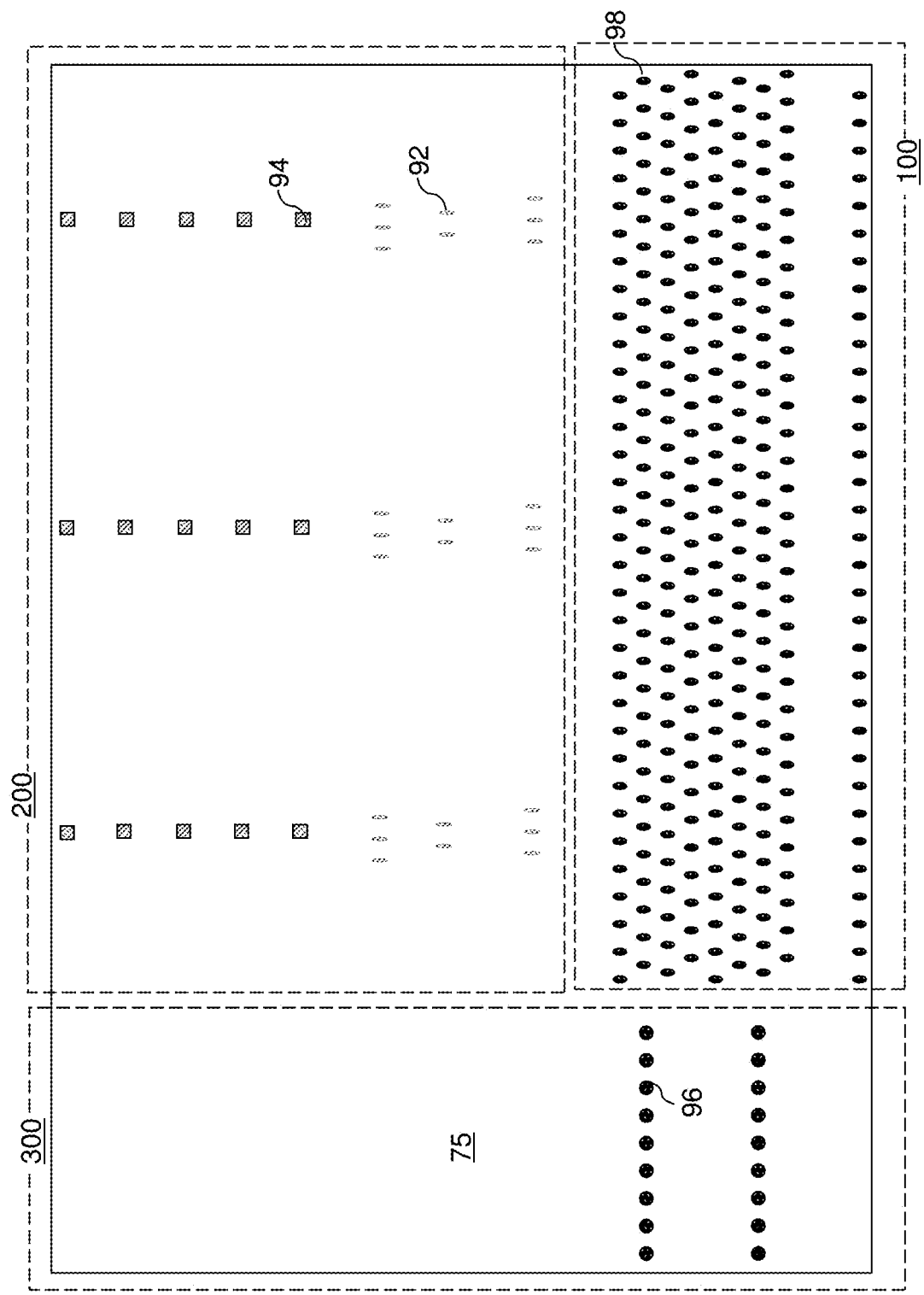

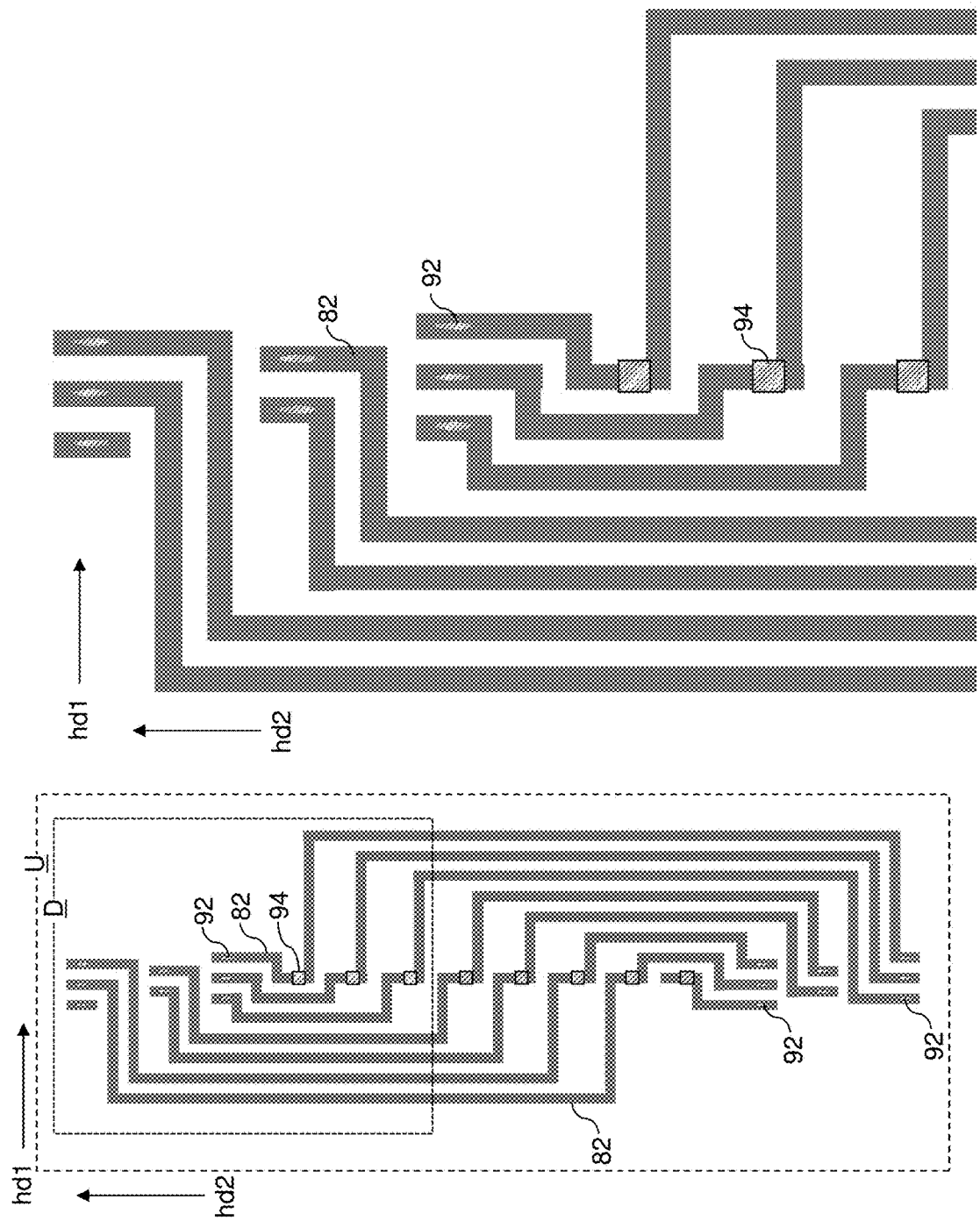

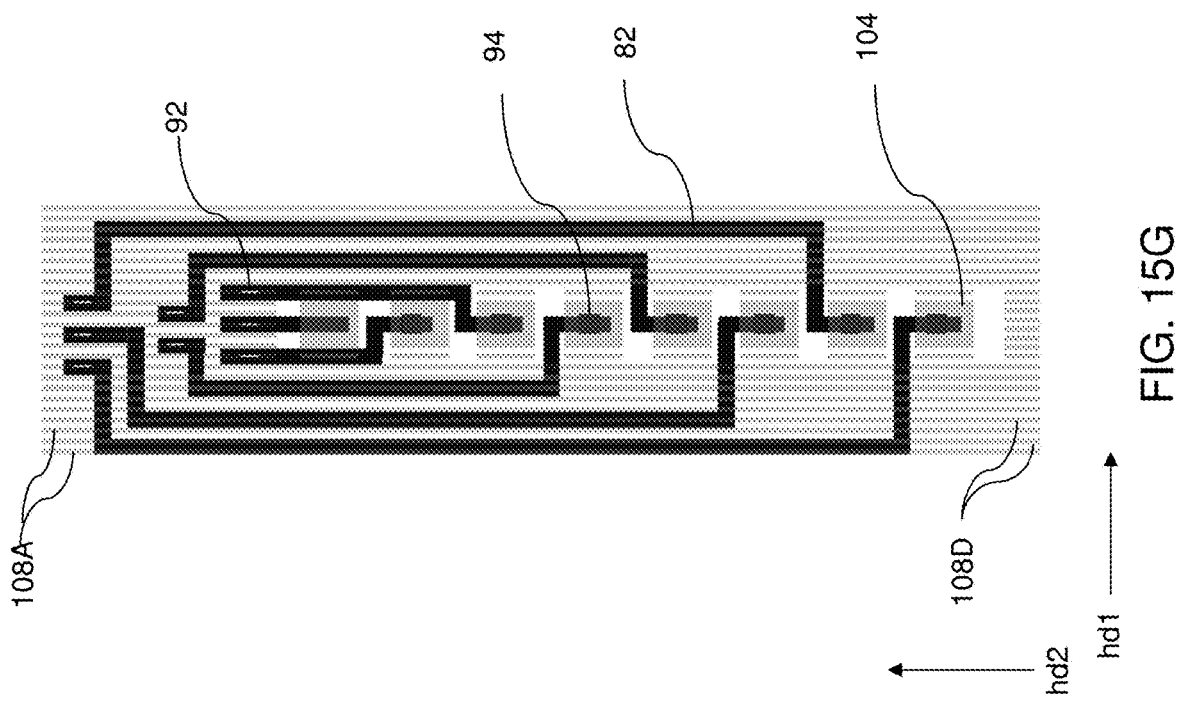
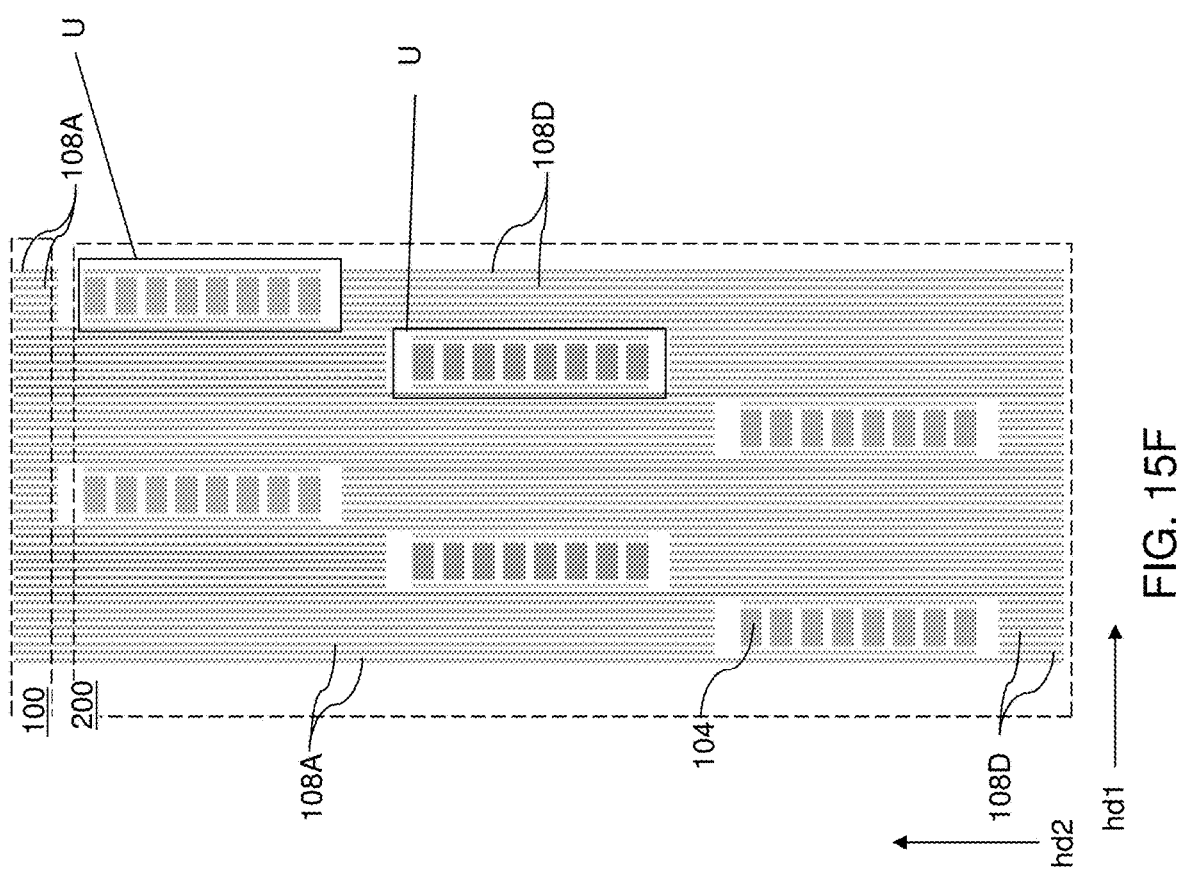
FIG. 15G
FIG. 15F

THREE-DIMENSIONAL MEMORY DEVICE INCLUDING CONTACT-LEVEL BIT-LINE-CONNECTION STRUCTURES AND METHODS OF MAKING THE SAME

FIELD

The present disclosure relates generally to the field of semiconductor devices, and particular to a three-dimensional memory device including contact-level bit-line-connection structures and methods of manufacturing the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a semiconductor structure comprising a memory die that includes a three-dimensional memory array, wherein the memory die comprises: an alternating stack of insulating layers and electrically conductive layers located over a substrate; memory stack structures vertically extending through the alternating stacks, wherein each memory stack structure comprises a memory film, a vertical semiconductor channel located adjacent to the memory film and a drain region adjoined to a top end of the vertical semiconductor channel; a contact-level dielectric layer overlying the alternating stack and the memory stack structures, embedding drain contact via structures that are electrically connected to a respective drain region, and embedding contact-level metal interconnects; a via-level dielectric layer overlying the contact-level dielectric layer, embedding drain-to-bit-line connection via structures that contact a respective one of the drain contact via structures, and embedding bit-line-connection via structures and pad-connection via structures that contact the contact-level metal interconnects; a bit-line-level dielectric layer overlying the via-level dielectric layer, embedding bit lines that contact a respective subset of the drain-to-bit-line connection via structures, and embedding metal pads that contact a respective one of the pad-connection via structures and have a respective width that is at least twice a width of each of the bit lines, wherein each of the metal pads is electrically connected to a respective bit line through a series connection of a respective pad-connection via structure, a respective contact-level metal interconnect, and a respective bit-line-connection via structure.

According to another embodiment of the present disclosure, a method of forming a semiconductor structure is provided. The method comprises forming a memory die by forming an alternating stack of insulating layers and spacer material layers over a substrate, wherein the spacer material layers are formed as, or are replaced with, electrically conductive layers; forming memory stack structures vertically extending through the alternating stacks, wherein each memory stack structure comprises a memory film, a vertical semiconductor channel located adjacent to the memory film and a drain region adjoined to a top end of the vertical semiconductor channel; forming a contact-level dielectric layer over the alternating stack and the memory stack structures, wherein the contact-level dielectric layer embeds drain contact via structures that are electrically connected to a respective drain region, and embedding contact-level metal interconnects; forming a via-level dielectric layer over the contact-level dielectric layer, wherein the via-level dielectric layer embeds drain-to-bit-line connection via structures that contact a respective one of the drain contact via structures, and embeds bit-line-connection via structures and pad-connection via structures that contact the contact-level metal interconnects; and forming a bit-line-level dielectric layer over the via-level dielectric layer, wherein the bit-line-level dielectric layer embeds bit lines that contact a respective subset of the drain-to-bit-line connection via structures, and embeds metal pads that contact a respective one of the pad-connection via structures and have a respective width that is at least twice a width of each of the bit lines, wherein each of the metal pads is electrically connected to a respective bit line through a series connection of a respective pad-connection via structure, a respective contact-level metal interconnect, and a respective bit-line-connection via structure.

BRIEF DESCRIPTION OF THE DRAWINGS

FIGS. 5A-5H are sequential schematic vertical cross-sectional views of a memory opening within the exemplary structure during formation of a memory stack structure, an optional dielectric core, and a drain region therein according to an embodiment of the present disclosure.

FIGS. 9A-9D are sequential vertical cross-sectional views of a region of the exemplary structure during formation of electrically conductive layers according to an embodiment of the present disclosure.

FIG. 13D is a top-down view of a unit connection region U within the bit line hookup region of FIG. 13C.

FIG. 13E is a magnified top-down view of a portion E of the unit connection region U of FIG. 13D.

FIG. 13G is a vertical cross-sectional view of a portion of a bit line hookup region and a memory array region of the exemplary structure of FIGS. 13A-13F.

FIG. 14B is a top-down view of the exemplary structure of FIG. 14A. The illustrated regions include a memory array region, a portion of a staircase region, and a portion of a bit line hookup region.

FIG. 14C is a top-down view of a unit connection region U within the bit line hookup region of FIG. 14B.

FIG. 14D is a magnified top-down view of a portion D of the unit connection region U of FIG. 14C.

FIG. 15F is a top-down view of a portion of the bit line hookup region of the exemplary structure of FIGS. 15A-15B according to the second embodiment of the present disclosure. Multiple instances of the unit connection region U are illustrated.

FIG. 15G is a see-through top-down view of a configuration for a unit connection region U at the processing steps of FIG. 15F according to the second embodiment of the present disclosure. Overlay of structures embedded in the contact-level dielectric layer, the via-level dielectric layer, and the bit-line-level dielectric layer is illustrated.

DETAILED DESCRIPTION

Figure 1A:
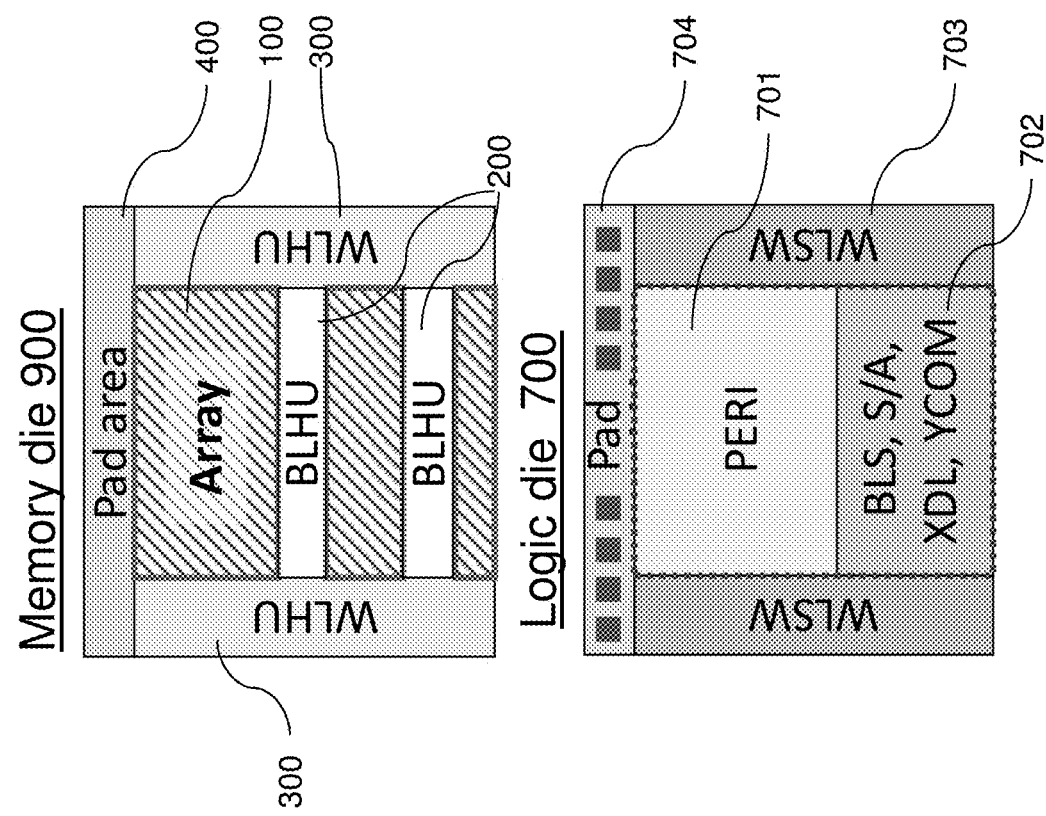
FIG. 1A is a layout of a memory die and a logic die for forming a bonded assembly according to a first embodiment of the present disclosure.

A bonded assembly of a memory die and a logic die may be used to increase areal density of memory elements. In order to form such a bonded assembly, bit line hookup regions and word line hookup regions of a memory die containing memory-side bonding pads are bonded to logic-side bonding pads of a logic die during formation of the bonded assembly. Formation of reliable interconnect routing structures on the bit lines is difficult because the bit lines are formed at a minimum lithographic pitch, and barrier metals used for the bit lines are prone to attack by wet clean processes.

An embodiment of the present disclosure provides a metal interconnect configuration with a reliable bit line connection. Thus, an embodiment of the present disclosure is directed to a three-dimensional memory device including contact-level bit-line-connection structures and methods of manufacturing the same, the various embodiments of which are described herein in detail. The embodiments of the present disclosure can be used to form various semiconductor structures such as a bonded assembly including a memory die and a logic die, in which a three-dimensional memory array is provided in the memory die and a peripheral circuitry configured to operate the three-dimensional memory array is provided in the logic die.

The drawings are not drawn to scale. Multiple instances of an element can be duplicated where a single instance of the element is illustrated, unless absence of duplication of elements is expressly described or clearly indicated otherwise. Ordinals such as "first," "second," and "third" can be used merely to identify similar elements, and different ordinals can be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element can be located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, or can have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction. As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" can be a heavily doped semiconductor material, or can be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material can be semiconducting or conductive, and can be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is an array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays can be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates can be thinned or removed from the memory levels before bonding, but as the memory levels are initially formed over separate substrates, such memories are not true monolithic three-dimensional memory arrays.

Generally, a semiconductor package (or a "package") refers to a unit semiconductor device that can be attached to a circuit board through a set of pins or solder balls. A semiconductor package can include a semiconductor chip (or a "chip") or a plurality of semiconductor chips that are bonded throughout, for example, by flip-chip bonding or another chip-to-chip bonding. A package or a chip can include a single semiconductor die (or a "die") or a plurality of semiconductor dies. A die is the smallest unit that can independently execute external commands or report status. Typically, a package or a chip with multiple dies is capable of simultaneously executing as many external commands as the total number of planes therein. Each die includes one or more planes. Identical concurrent operations can be executed in each plane within a same die, although there can be some restrictions. In cases where the die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected to a read operation.

Figure 1B:
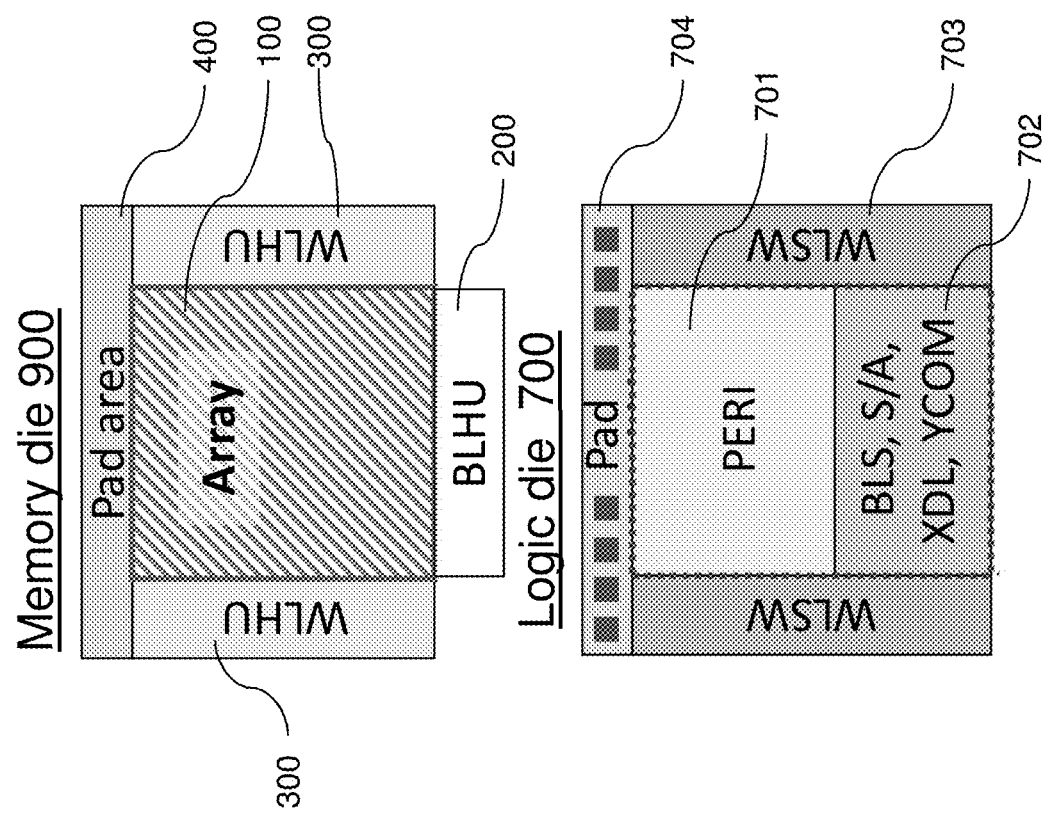
FIG. 1B is a layout of a memory die and a logic die for forming a bonded assembly according to a second embodiment of the present disclosure.

FIGS. 1A and 1B illustrate layouts for a memory die 900 and a logic die 700 according to first and second embodiments of the present disclosure. Generally, the memory die 900 includes at least one memory array region 100, word line hookup regions (WLHU) (e.g., staircase regions 300) including metal interconnect structures and bonding pads for providing electrical connections to word lines, and at least one bit line hookup region 200 (BLHU) including metal interconnect structures and bonding pads for providing electrical connections to bit lines. In the first embodiment shown in FIG. 1A, the bit line hookup region 200 is located between portions of the memory array region 100. There may be more than one bit line hookup region 200 which located between portions of the memory array region 100. In the second embodiment shown in FIG. 1B, the bit line hookup region 200 is located outside (e.g., adjacent to one side of) the memory array region 100. The memory die 900 can include a pad area 400 that overlaps with a pad area 400 of the logic die after bonding the memory die 900 to the logic die 700. A general circuit area (701, 702) of the logic die 700 that in the bonded assembly overlaps with the areas of the memory array regions 100 and the bit line hookup regions 200 (BLHU) of the memory die 900 includes various other circuits that are used to operate the memory die. For example, the first portion 701 of the general circuit area labeled "PERI" can include additional peripheral circuits, such as source power supply circuits (also referred to as shunt circuits), well bias voltage supply circuits, word line decoder circuits, and other miscellaneous circuits. The second portion 702 of the general circuit area can include sense amplifier and bit line driver circuits "BLS," sense amplifier circuits "S/A," a latch circuit "XDL" that functions as a cache memory of the NAND flash device, and column direction logic control circuits "YLOG." The logic die 700 can also include word line switch circuits 703 (WLSW) in areas that overlap with the areas of the word line hookup regions 300 (WLHU) of the memory die 900, and a logic die pad area 704 in an area that overlaps with the pad area 400 of the memory die in the bonded assembly after bonding the memory die 900 to the logic die 700. The logic die pad area 704 includes external bonding pads that can be used to provide external electrical connection to the bonded assembly of the memory die and the logic die. The logic die pad area can also include input/output control circuits.

Figure 2:
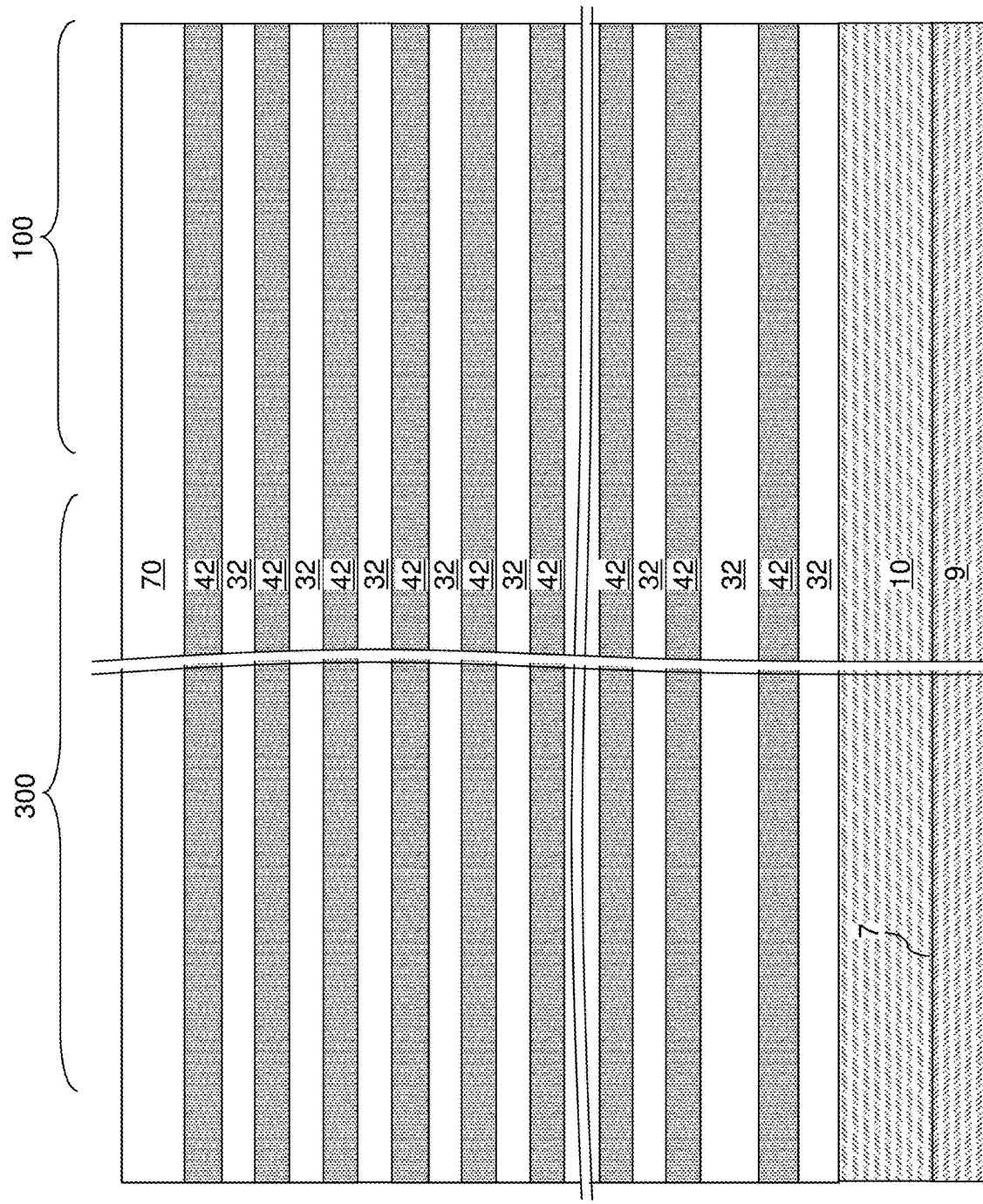
FIG. 2 is a schematic vertical cross-sectional view of the exemplary structure after formation of an alternating stack of insulating layers and spacer material layers according to an embodiment of the present disclosure.

Referring to FIG. 2, an exemplary structure according to an embodiment of the present disclosure is illustrated, which can be used, for example, to fabricate a memory die containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

The optional semiconductor material layer 10 can be formed on the top surface of the substrate semiconductor layer 9, for example, by selective epitaxy. The deposited semiconductor material can be the same as, or can be different from, the semiconductor material of the substrate semiconductor layer 9. The deposited semiconductor material can be any material that can be used for the substrate semiconductor layer 9 as described above. The single crystalline semiconductor material of the semiconductor material layer 10 can be in epitaxial alignment with the single crystalline structure of the substrate semiconductor layer 9. The region in which a memory array is subsequently formed is herein referred to as a memory array region 100. A staircase region 300 for subsequently forming stepped terraces of electrically conductive layers can be provided.

A stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is used for the insulating layers 32, tetraethyl orthosilicate (TEOS) can be used as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be used for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be used. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be used for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
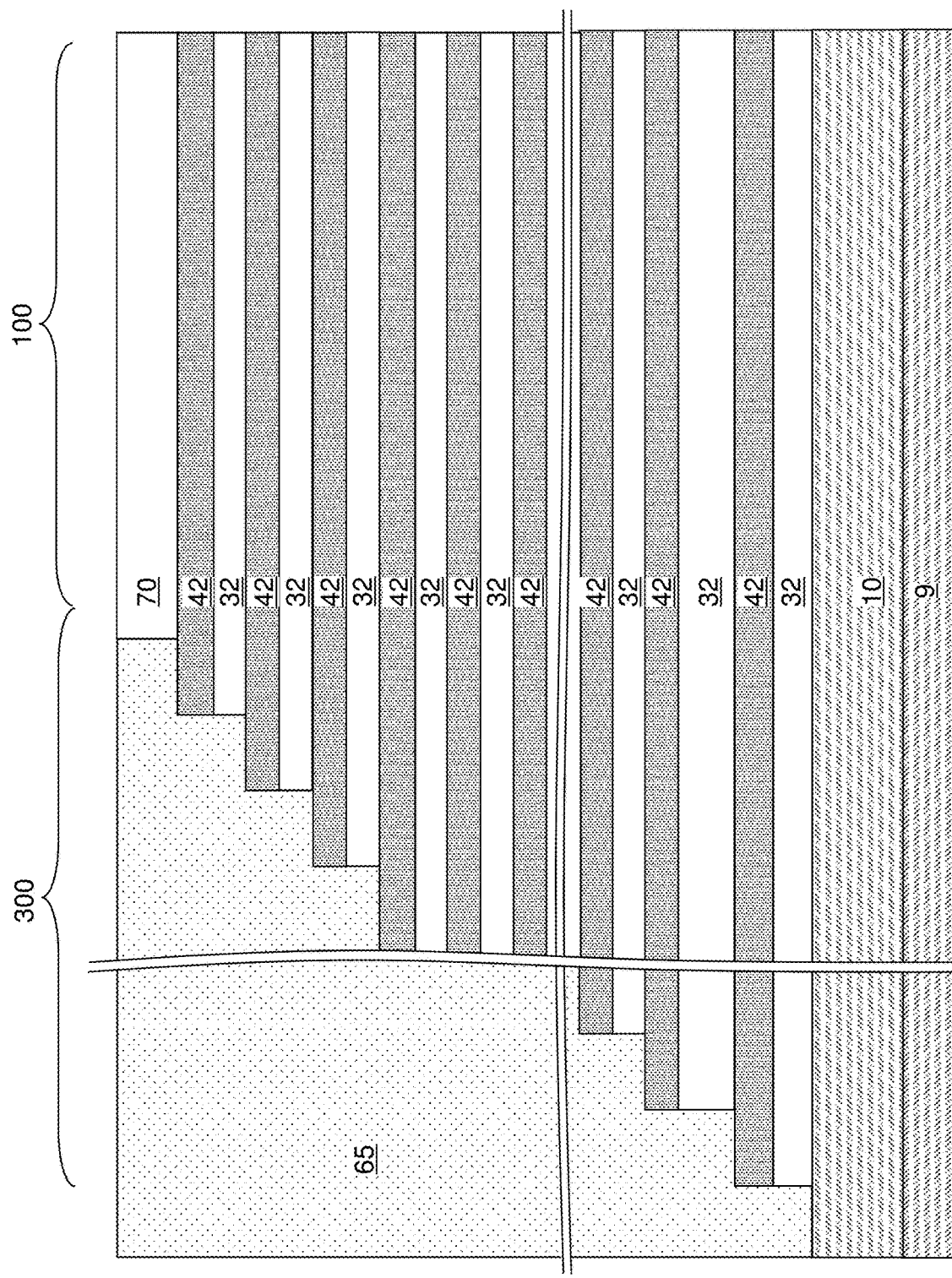
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset from each other such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom).

Configurations employing three, four, or more columns of staircases with a respective set of vertical offsets among the physically exposed surfaces of the sacrificial material layers 42 may also be used. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
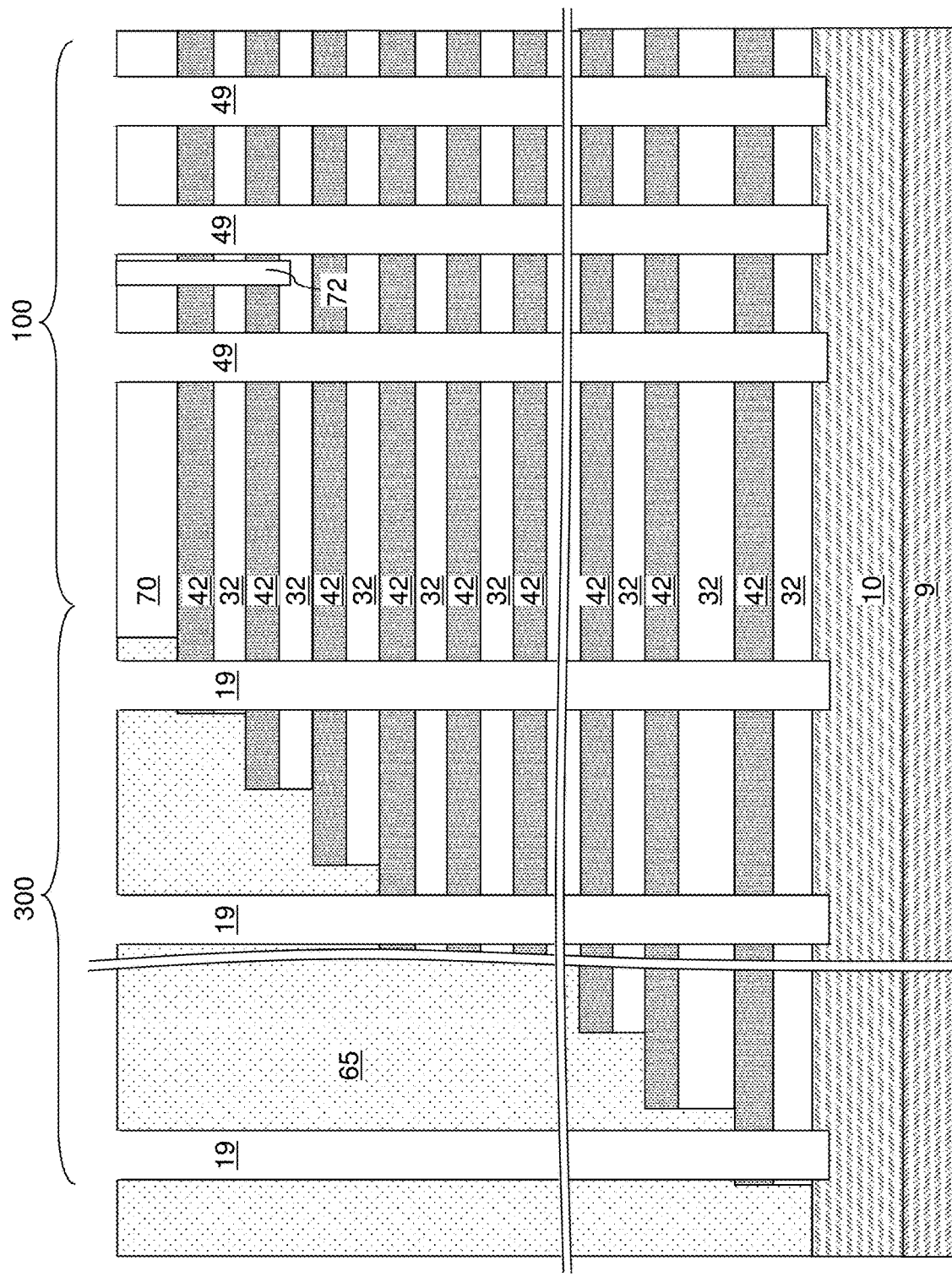
FIG. 4A is a schematic vertical cross-sectional view of the exemplary structure after formation of memory openings and support openings according to an embodiment of the present disclosure.
Figure 4B:
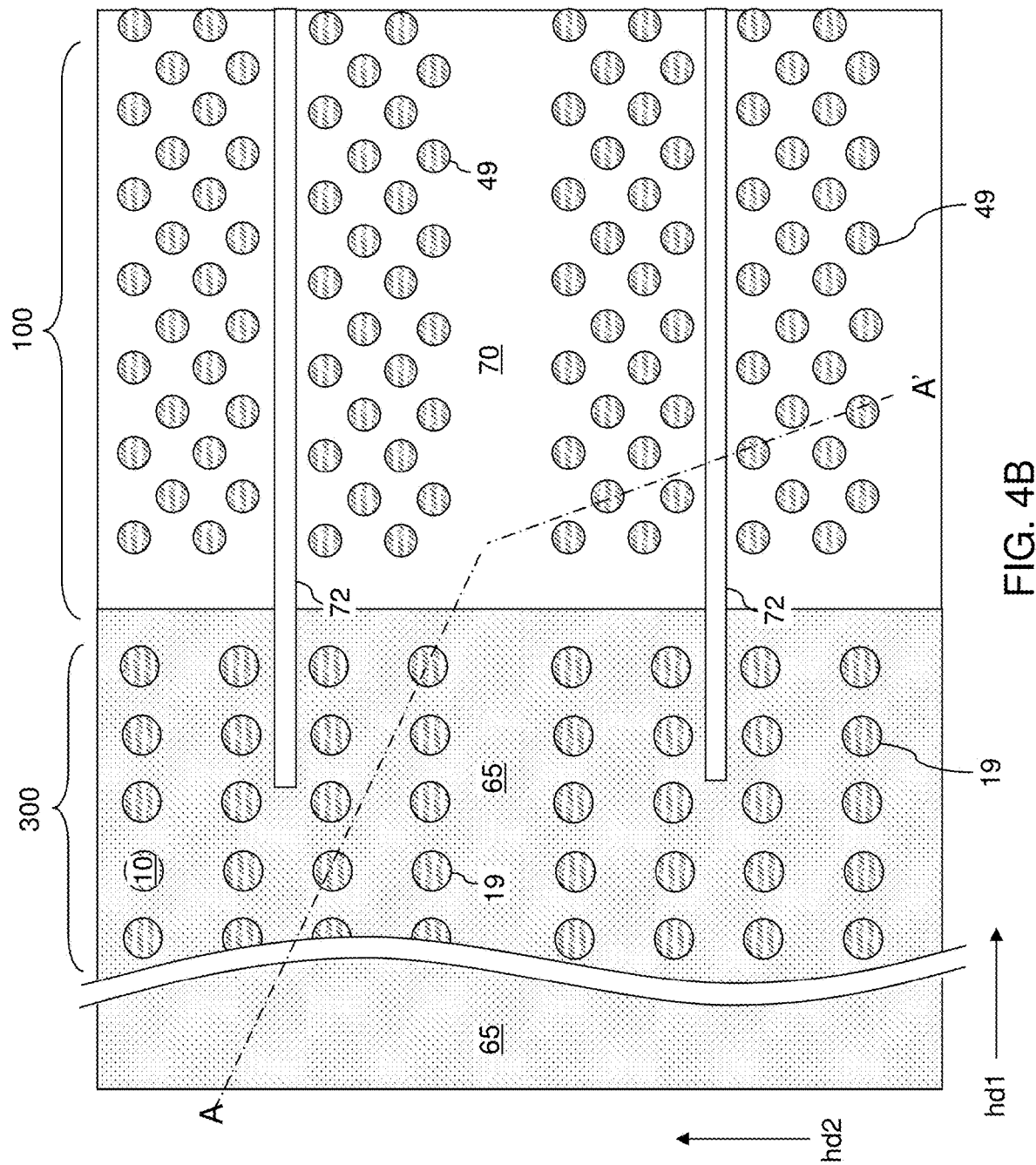
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be used. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

The drain select level isolation structures 72 can laterally extend along a first horizontal direction hd1. The memory openings 49 can be formed in clusters that are laterally spaced apart along the first horizontal direction hd1. The vertical steps of the stepped surfaces can be parallel to a second horizontal direction hd2 that is perpendicular to the first horizontal direction hd1. An interface between each memory array region 100 and a staircase region 300 can be parallel to the second horizontal direction hd2. The areas of the staircase regions 300 can be the same as the areas of the word line hookup regions 300 of the memory die illustrated in FIGS. 1A and 1B.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each of the support openings 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be used. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the top surface of each pedestal channel portion 11 can be formed above a horizontal plane including the top surface of a bottommost sacrificial material layer 42. In this case, a source select gate electrode can be subsequently formed by replacing the bottommost sacrificial material layer 42 with a conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. The thickness of the dielectric metal oxide layer can be in a range from 1 nm to 20 nm, although lesser and greater thicknesses can also be used. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. The thickness of the dielectric semiconductor compound can be in a range from 1 nm to 20 nm, although lesser and greater thicknesses can also be used. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be used to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if used, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be used.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be used.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be used. A memory cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, and the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not used) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not used) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 5E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be used. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be used. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements comprising portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
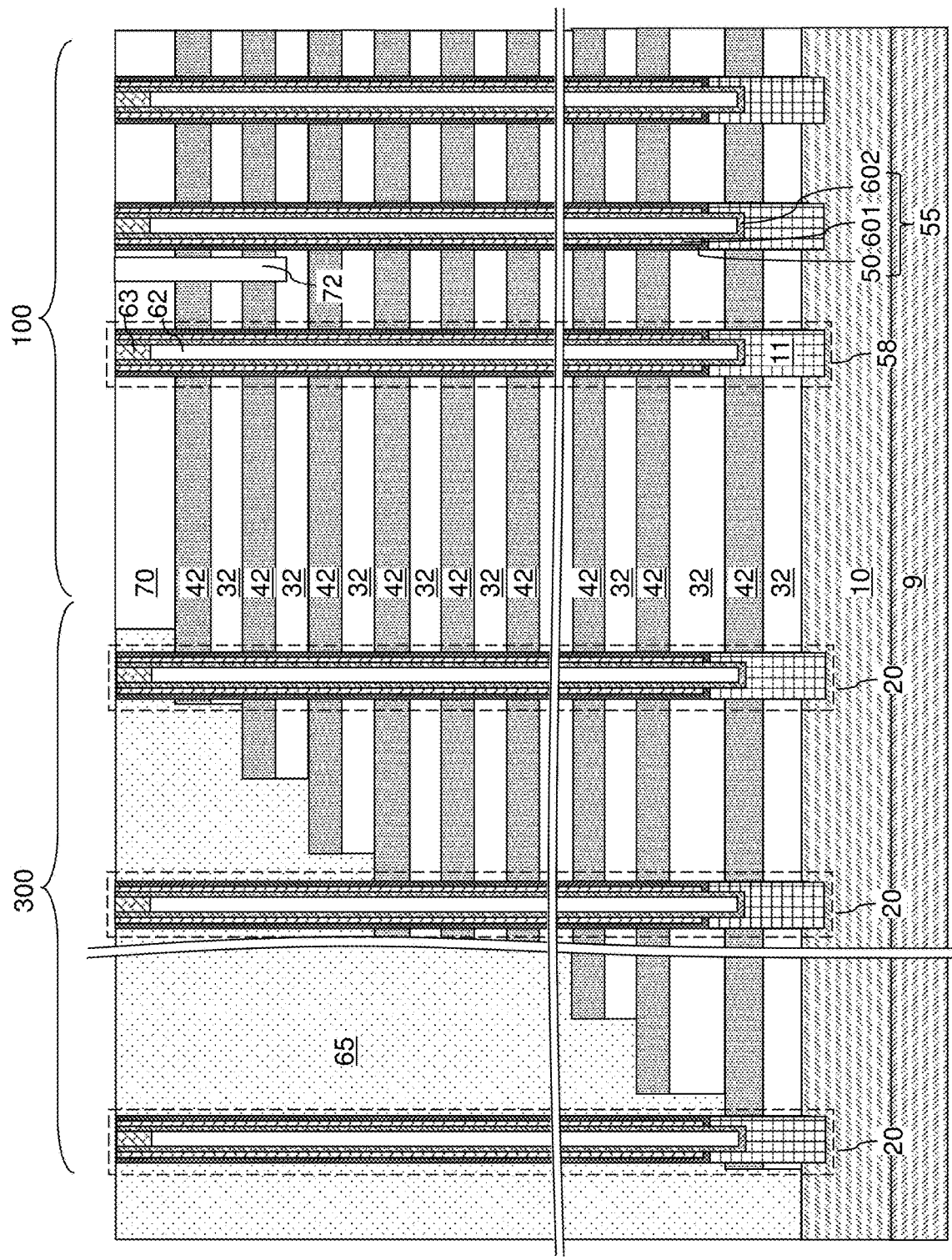
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60, a vertical stack of charge storage regions (comprising a charge storage layer 54) laterally surrounding the tunneling dielectric layer 56, and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
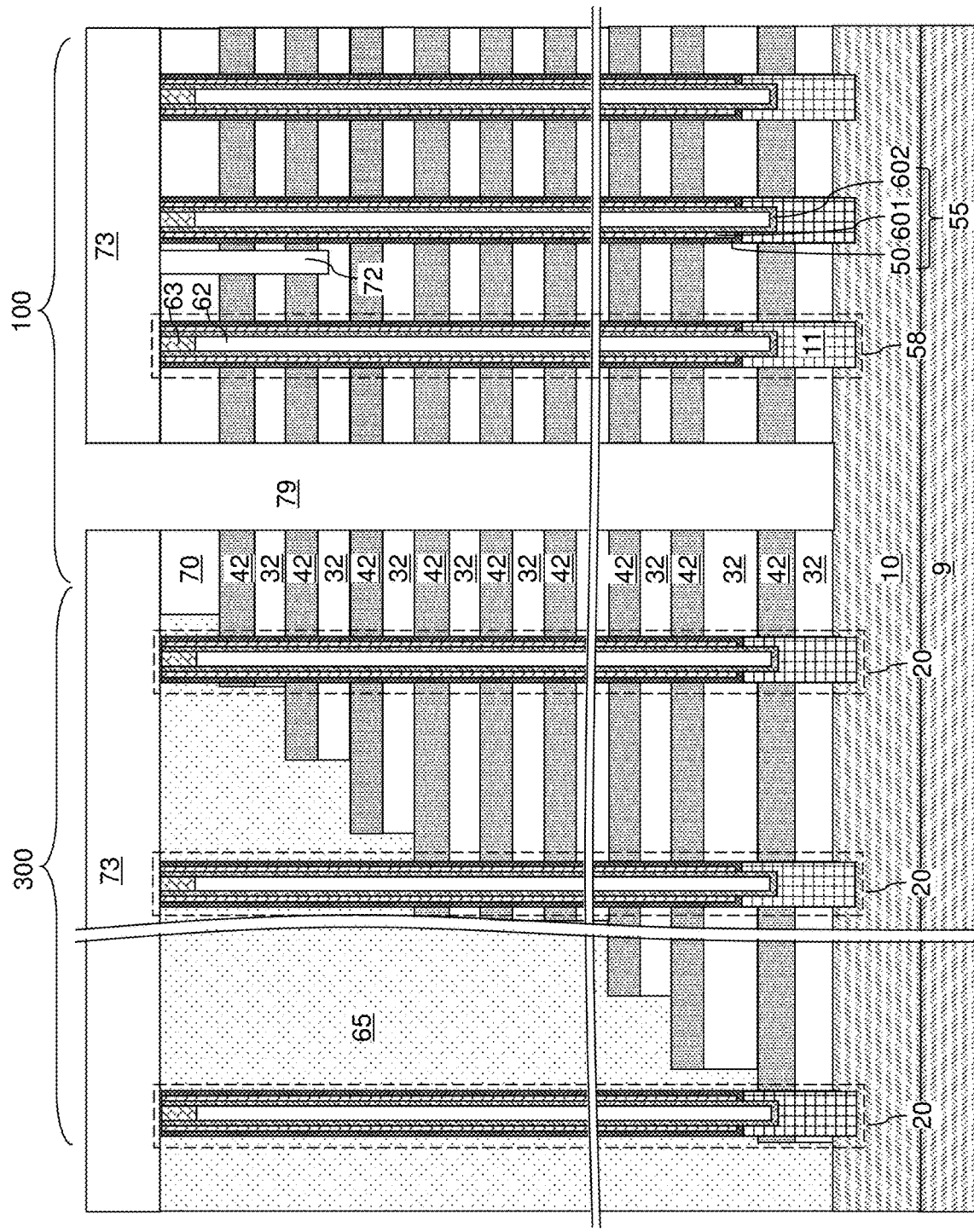
FIG. 7A is a schematic vertical cross-sectional view of the exemplary structure after formation of backside trenches according to an embodiment of the present disclosure.
Figure 7B:
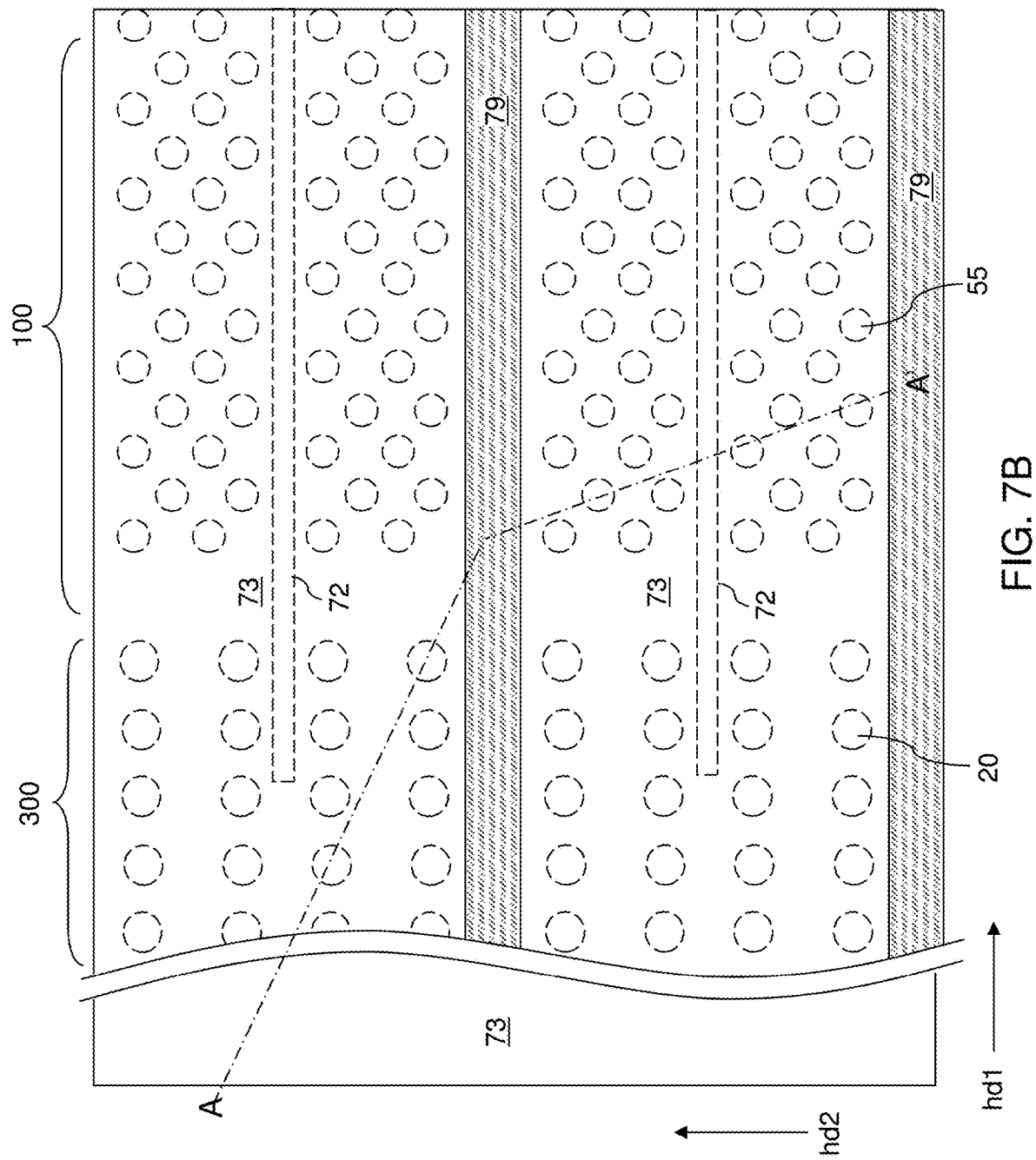
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact-level dielectric layer 73 can be formed over the alternating stack (32, 42) of insulating layer 32 and sacrificial material layers 42, and over the memory stack structures 55 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be used.

A photoresist layer (not shown) can be applied over the contact-level dielectric layer 73, and is lithographically patterned to form openings in areas between clusters of memory stack structures 55. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the staircase region 300.

In one embodiment, the backside trenches 79 can laterally extend along a first horizontal direction hd1 and can be laterally spaced apart from each other along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 8:
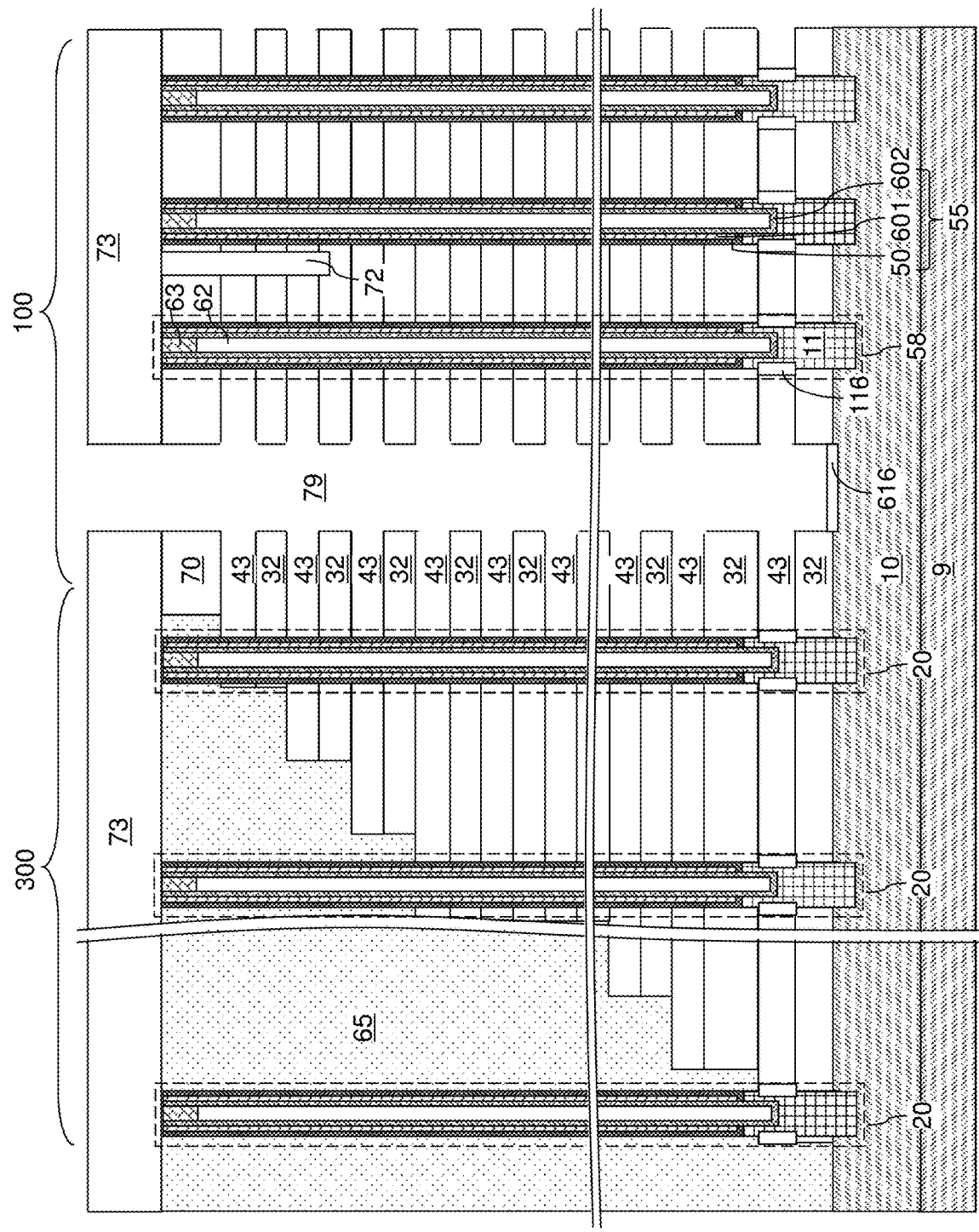
FIG. 8 is a schematic vertical cross-sectional view of the exemplary structure after formation of backside recesses according to an embodiment of the present disclosure.

Referring to FIGS. 8 and 9A, an etchant that selectively etches the second material of the sacrificial material layers 42 with respect to the first material of the insulating layers 32 can be introduced into the backside trenches 79, for example, employing an etch process. FIG. 9A illustrates a region of the exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials used in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be used to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be used.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 9C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be used. In one embodiment, the metallic barrier layer 46A can consist essentially of a conductive metal nitride such as TiN.

Figure 10:
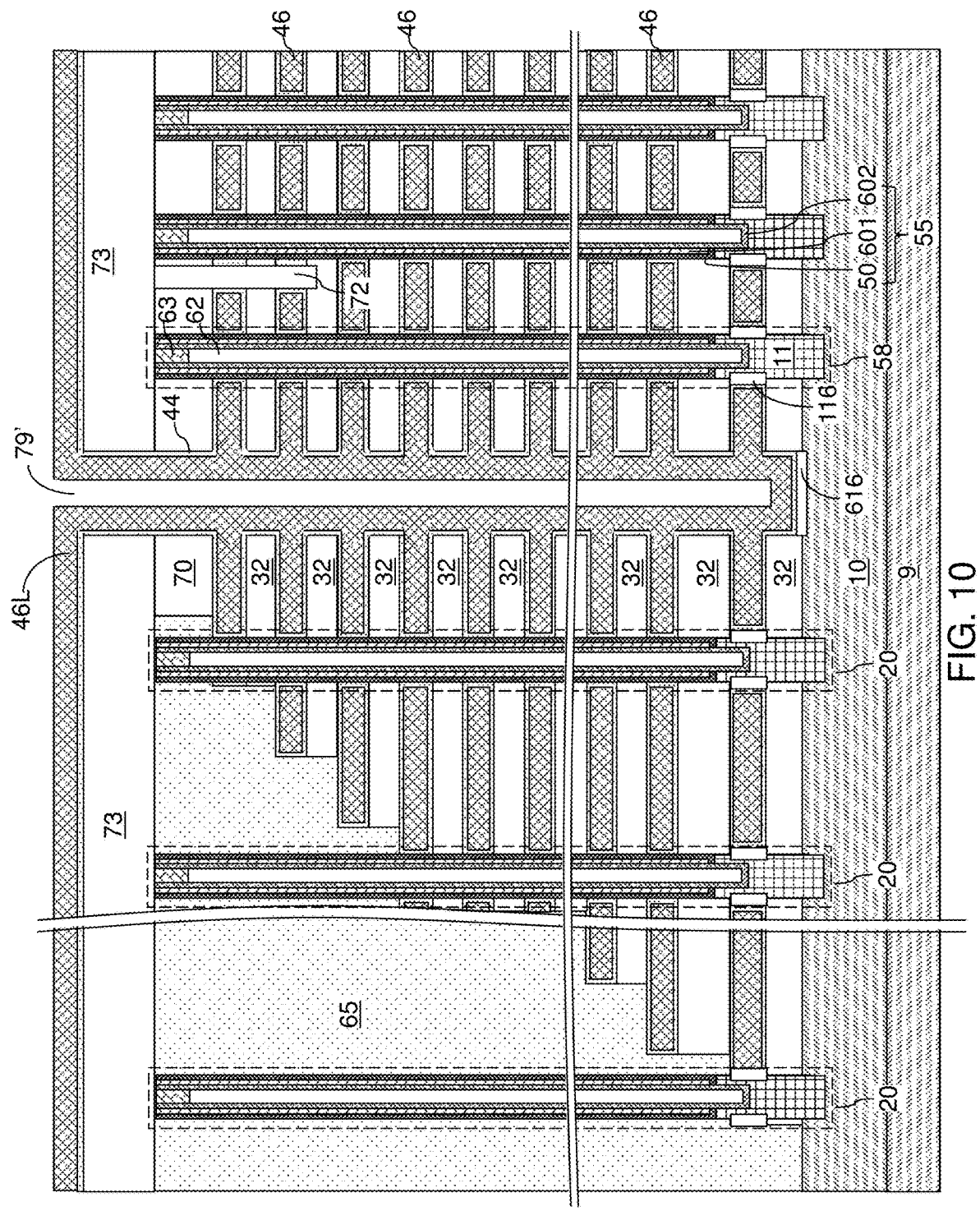
FIG. 10 is a schematic vertical cross-sectional view of the exemplary structure at the processing step of FIG. 9D.

Referring to FIGS. 9D and 10, a metal fill material is deposited in the plurality of backside recesses 43, on the sidewalls of the at least one the backside trench 79, and over the top surface of the contact-level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as WF6. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the contact-level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact-level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 11A:
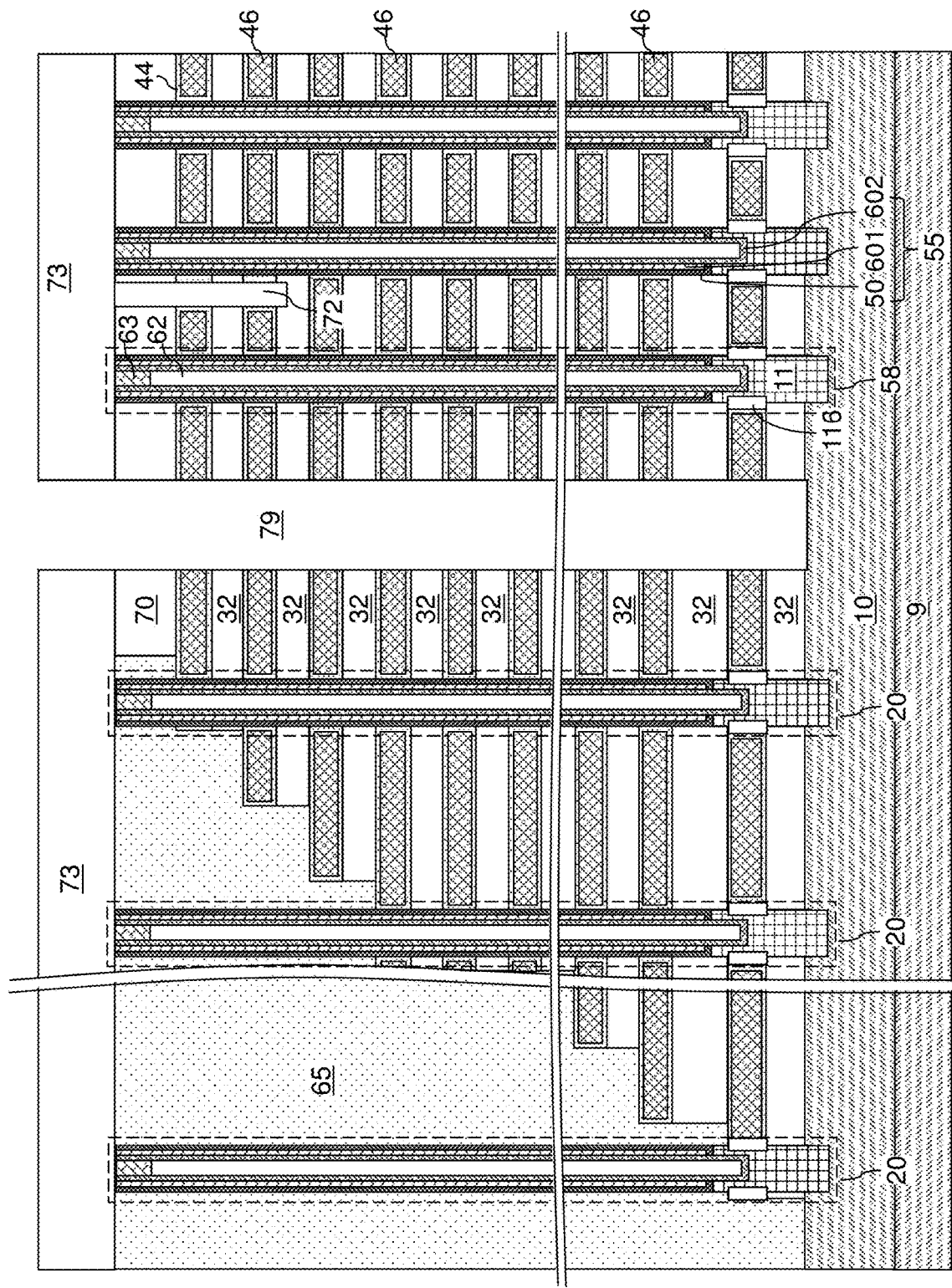
FIG. 11A is a schematic vertical cross-sectional view of the exemplary structure after removal of a deposited conductive material from within the backside trench according to an embodiment of the present disclosure.
Figure 11B:
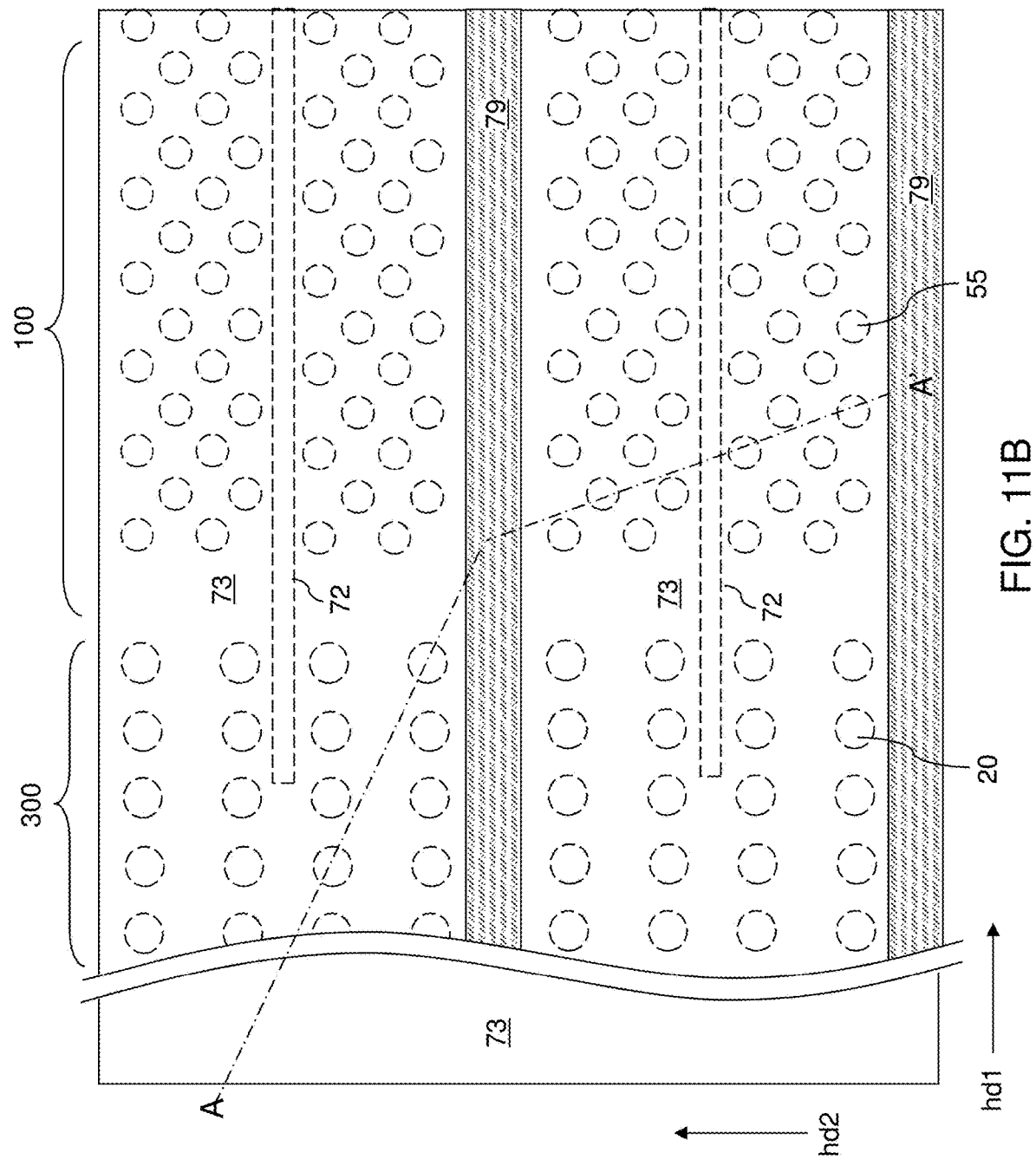
FIG. 11B is a partial see-through top-down view of the exemplary structure of FIG. 11A. The vertical plane A-A' is the plane of the schematic vertical cross-sectional view of FIG. 11A.

Referring to FIG. 11, the deposited metallic material of the continuous electrically conductive material layer 46L is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be used. The planar dielectric portions 616 can be removed during removal of the continuous electrically conductive material layer 46L. A backside cavity 79' is present within each backside trench 79.

Figure 12A:
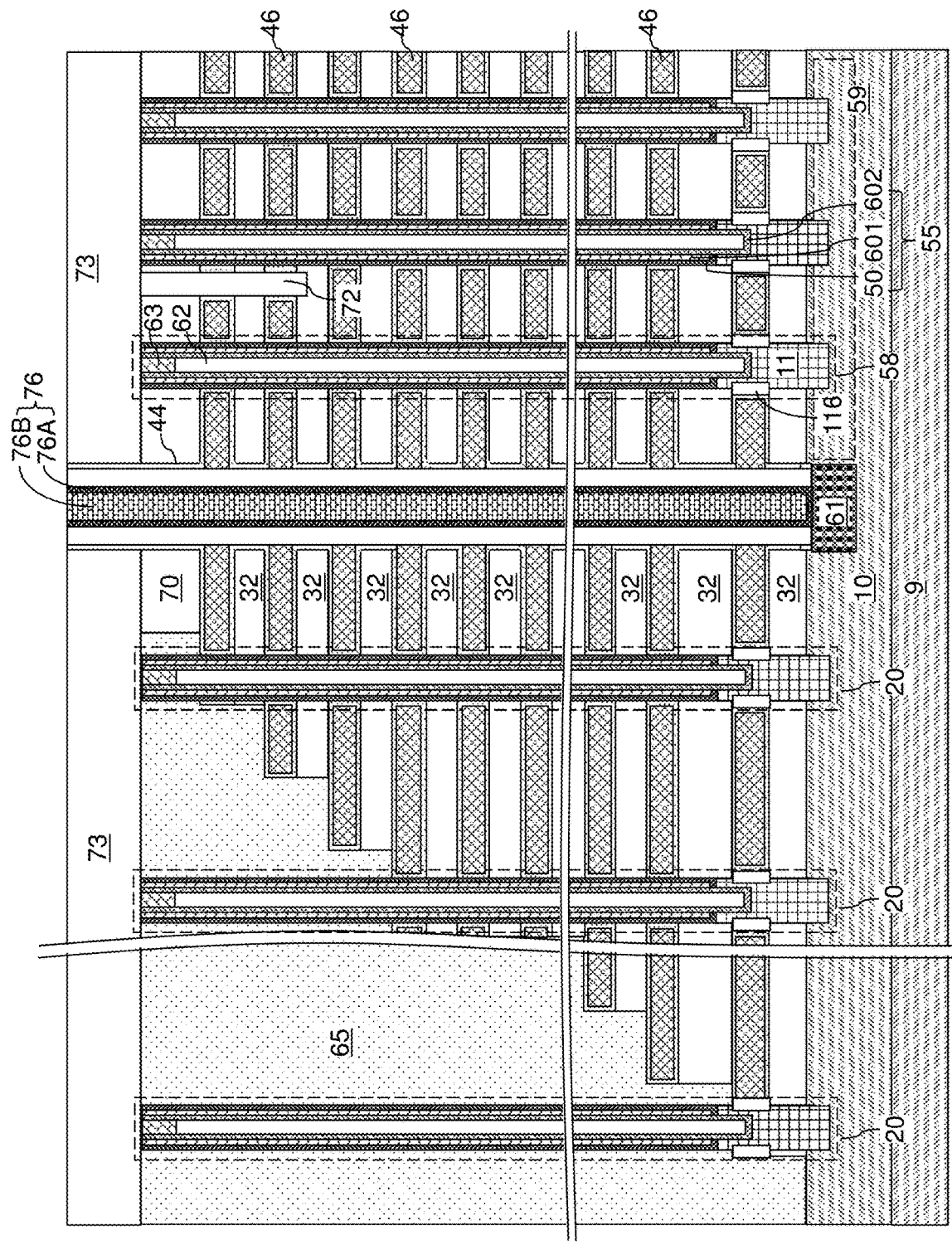
FIG. 12A is a schematic vertical cross-sectional view of the exemplary structure after formation of an insulating spacer and a backside contact structure according to an embodiment of the present disclosure.
Figure 12B:
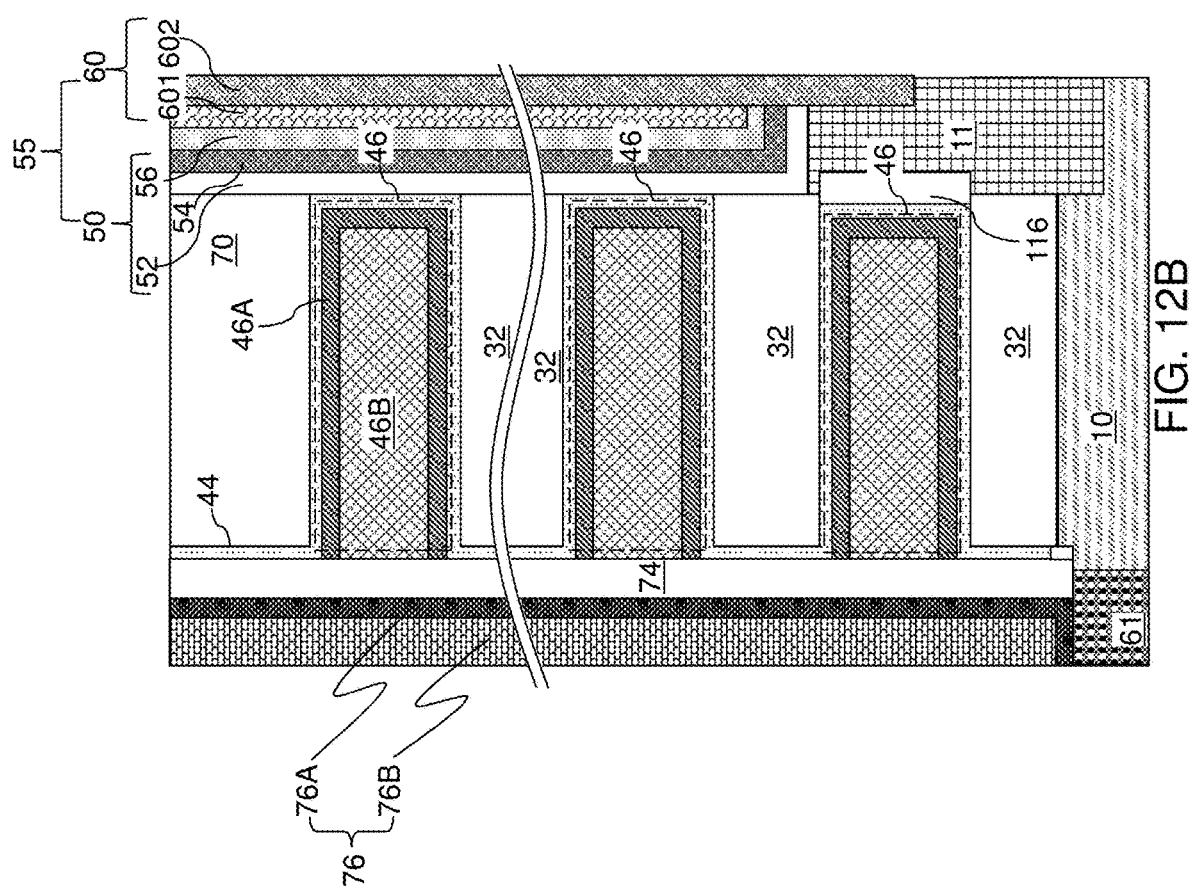
FIG. 12B is a magnified view of a region of the exemplary structure of FIG. 12A.
Figure 13A:
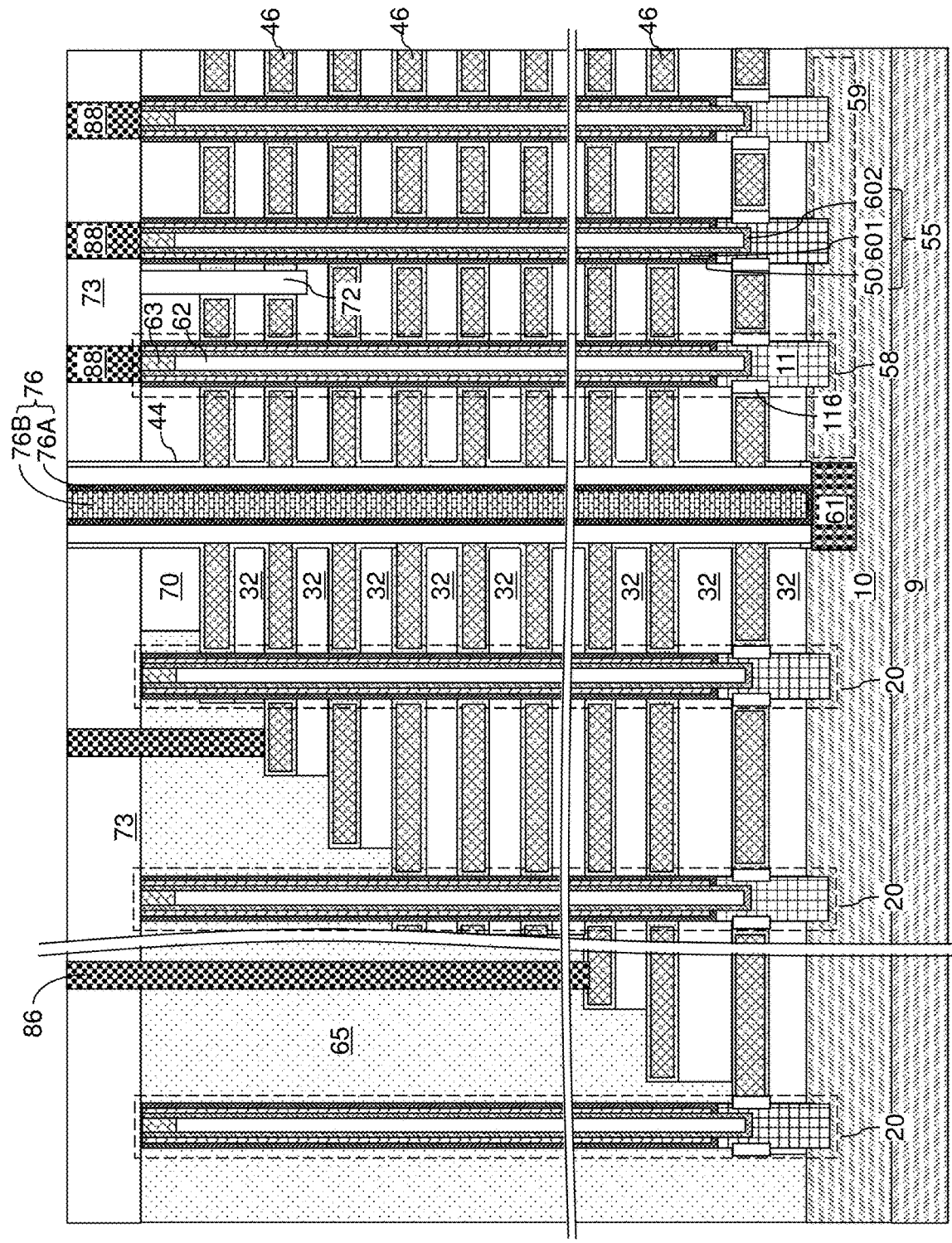
FIG. 13A is a schematic vertical cross-sectional view of a memory array region and a staircase region of the exemplary structure after formation of a contact-level dielectric layer, drain contact via structures, layer contact via structures, and contact-level metal interconnects according to first and second embodiments of the present disclosure.
Figure 13B:
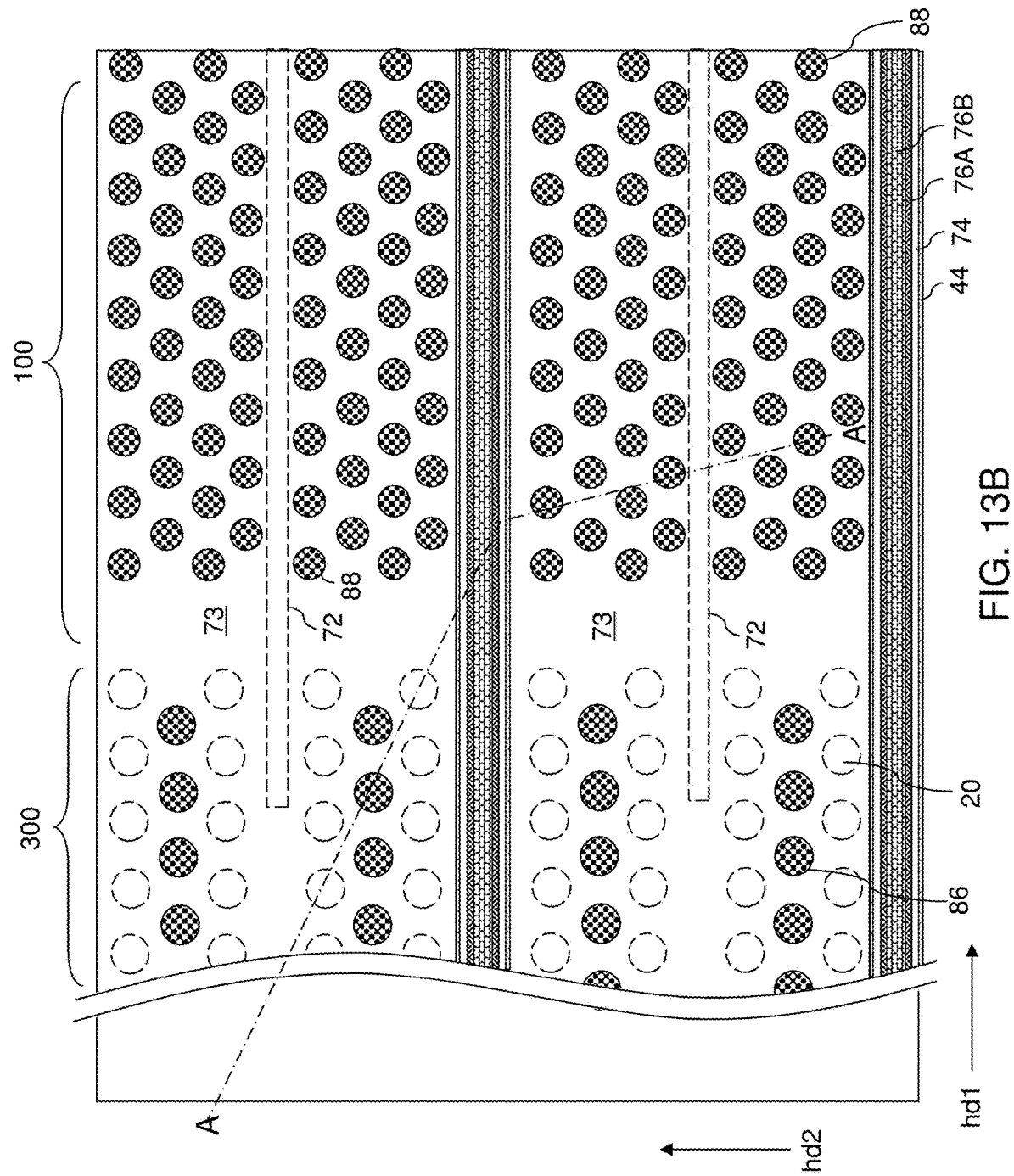
FIG. 13B is a top-down view of the memory array region and the staircase region of the exemplary structure of FIG. 13A. The vertical plane A-A' is the plane of the schematic vertical cross-sectional view of FIG. 13A.
Figure 13C:
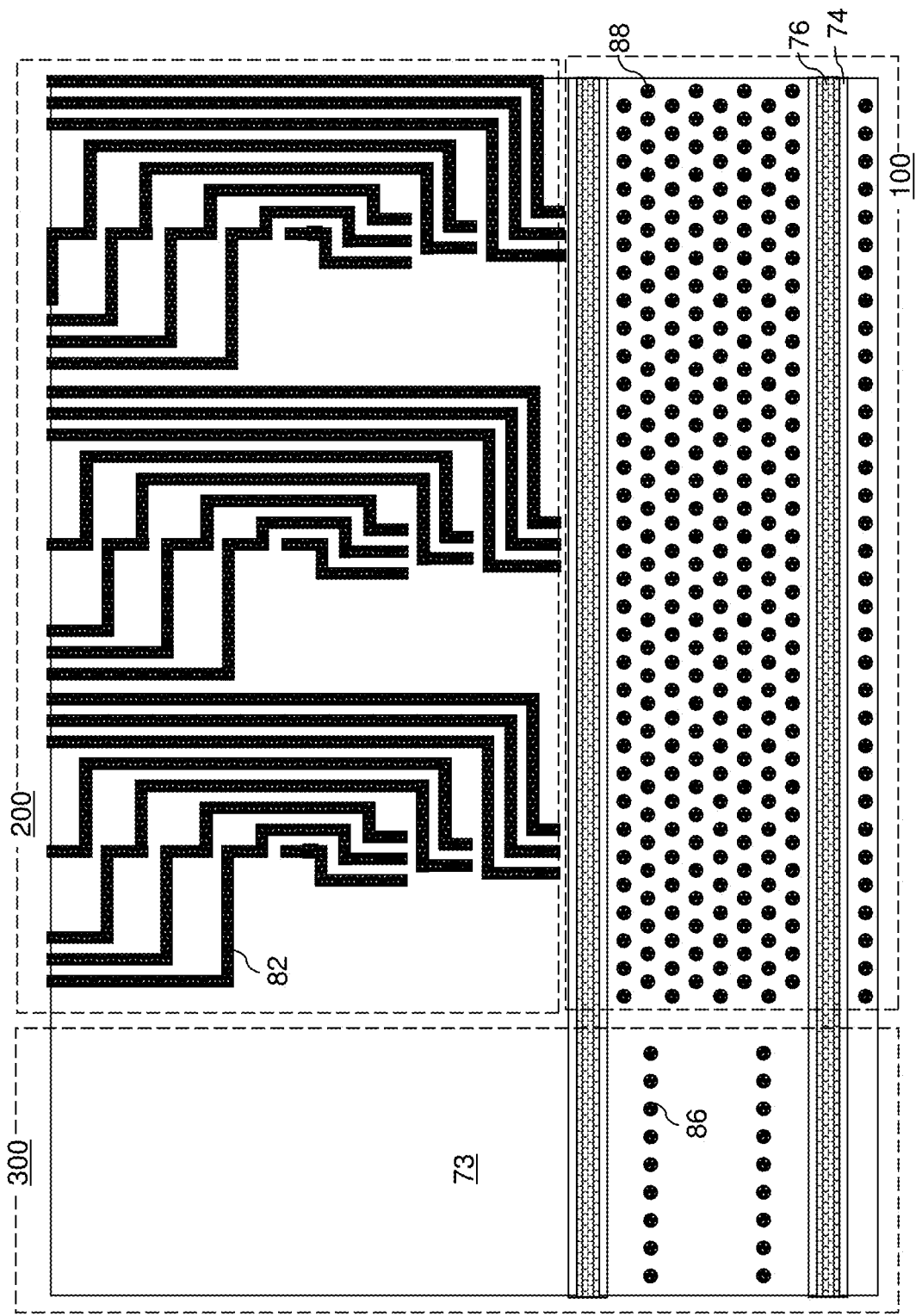
FIG. 13C is a top-down view of the exemplary structure of FIGS. 13A and 13B. The illustrated regions include a memory array region, a portion of a staircase region, and a portion of a bit line hookup region.
Figure 13F:
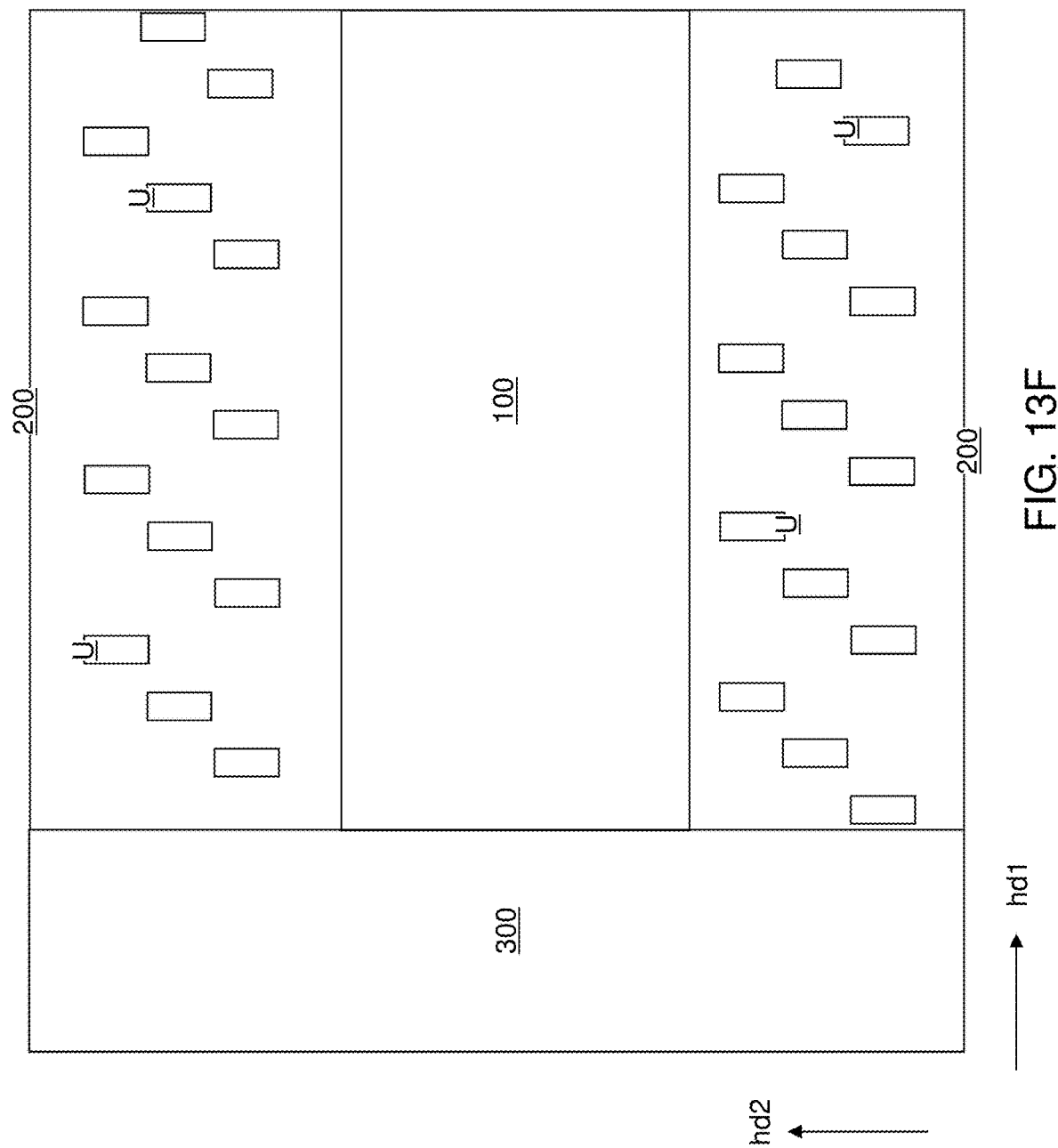
FIG. 13F is a top-down view of a larger area of the exemplary structure that includes the area of FIG. 13D.
Figure 14A:
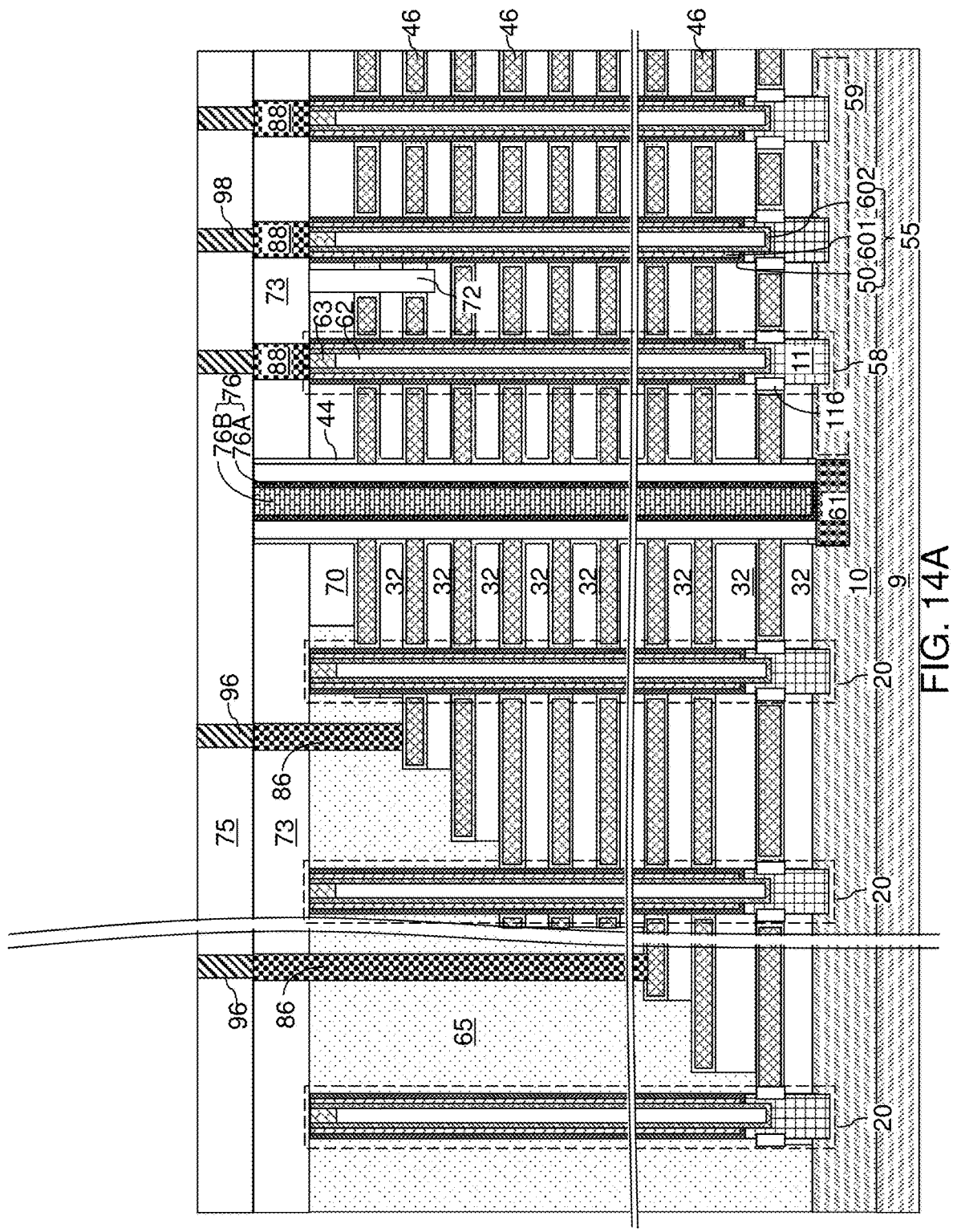
FIG. 14A is a schematic vertical cross-sectional view of a memory array region and a staircase region of the exemplary structure after formation of a via-level dielectric layer, drain-to-bit-line connection via structures, bit-line-connection via structures, and pad-connection via structures according to first and second embodiments of the present disclosure.
Figure 14E:
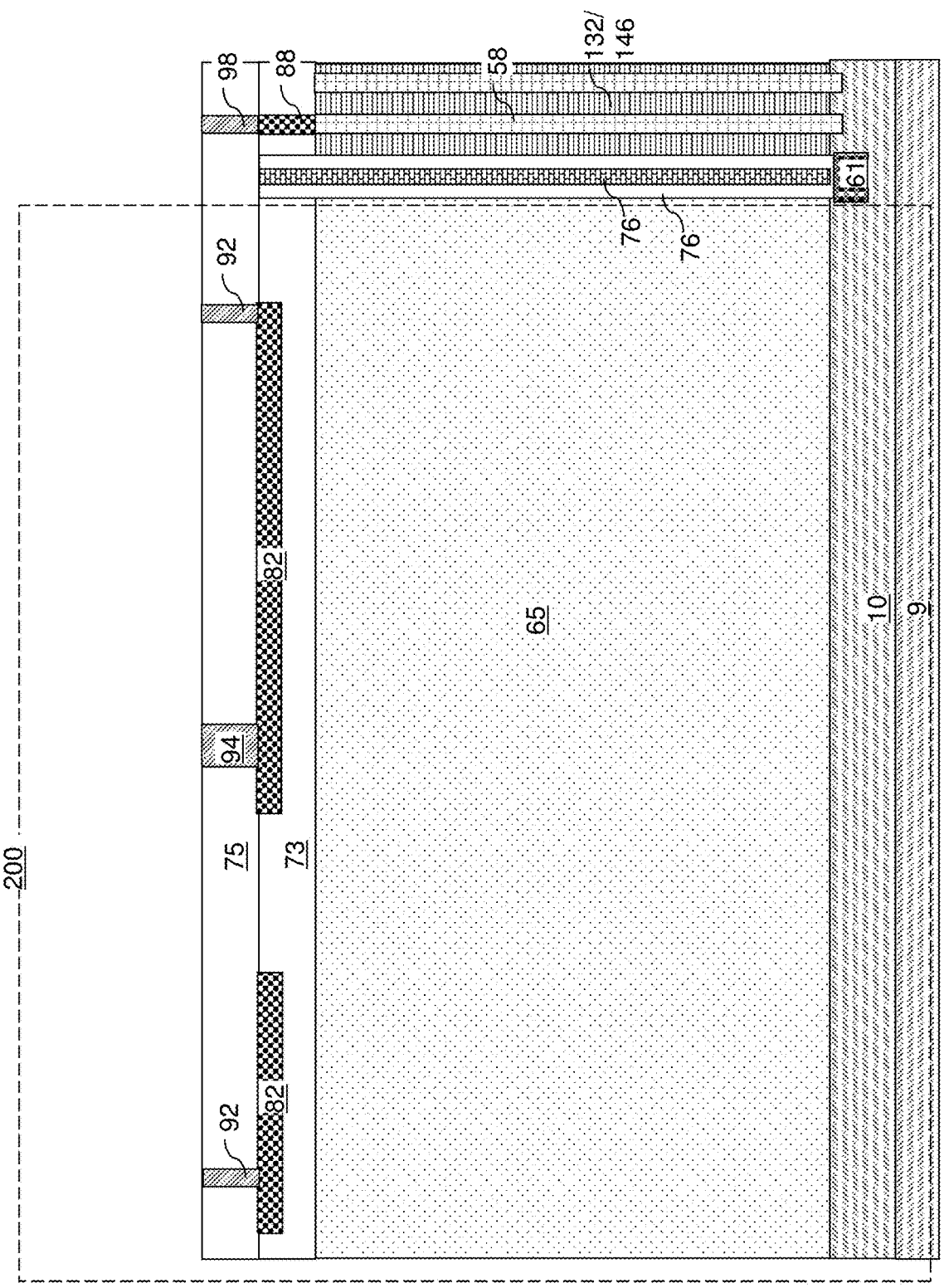
FIG. 14E is a vertical cross-sectional view of a portion of a bit line hookup region and a memory array region of the exemplary structure of FIGS. 14A-14D.

Referring to FIGS. 12A and 12B, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be used.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not used, the insulating material layer can be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74. While in the above embodiment of the present disclosure the source regions 61 are formed by implantation of dopants of the second conductivity type into upper portions of the semiconductor material layer 10, in an alternative embodiment, a source layer may be formed by replacing a source-level sacrificial layer that is provided in lieu of the semiconductor material layer 10. In this alternative embodiment, the source layer contacts the lower part of the sidewall and/or a bottom of the semiconductor channel. Suitable insulating layers and/or semiconductor material layers may be provided above and/or below the source layer as needed.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective backside cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be used. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is used, the contact-level dielectric layer 73 can be used as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is used, the backside contact via structure 76 can contact a sidewall of the backside blocking dielectric layer 44.

Generally, a memory die including a three-dimensional memory array can be formed. An alternating stack of insulating layers 32 and spacer material layers can be formed over a substrate (9, 10). The spacer material layers can be formed as, or can be subsequently replaced with, electrically conductive layers 46. The alternating stack can be patterned to provide stepped surfaces in a staircase region 300 such that the spacer material layers have lateral extents that decrease with a vertical distance from the substrate (9, 10) in the staircase region 300. Memory stack structures 58 vertically extending through the alternating stacks are formed. Each memory stack structure comprises a memory film 50, a vertical semiconductor channel 60 located adjacent to the memory film 50, and a drain region 63 adjoined to a top end of the vertical semiconductor channel 60. The memory stack structures are formed in a memory array region 100 in which all layers of the alternating stack are present. The alternating stack (32, 46) includes stepped surfaces in a staircase region 300 that is laterally offset from the memory array region 100. Electrically conductive layers 46 have lateral extents that decrease with a vertical distance from the substrate (32, 46) in the staircase region 300. A retro-stepped dielectric material portion 65 can be formed over each stepped surfaces. The contact-level dielectric layer 73 is formed over the retro-stepped dielectric material portion 65. A retro-stepped dielectric material portion 65 overlies the stepped surfaces and underlies the contact-level dielectric layer 73 in the staircase region 300.

Referring to FIGS. 13A-13G, a first photoresist layer (not shown) can be applied over the contact-level dielectric material layer 73, and can be lithographically patterned to form discrete via opening therethrough. The discrete via openings can include drain contact via openings that are formed in areas that overlie a respective one of the drain regions 63 and layer contact via openings that that are formed in area that overlie a respective horizontal surface within stepped surfaces of the staircase regions 300. The drain contact via openings are formed in a memory array region 100, and the layer contact via openings are formed in one of the staircase regions 300.

A first anisotropic etch process can be performed to etch through underlying portions of the contact-level dielectric layer 73 and the retro-stepped dielectric material portion 65 underneath each of the drain contact via openings and the layer contact via openings. The patterned first photoresist layer can be used as an etch mask during the first anisotropic etch process. The anisotropic etch process can remove the materials of the contact-level dielectric layer 73 and the retro-stepped dielectric material portion 65 selective to the materials of the drain regions 63 and the electrically conductive layers 46. In other words, the drain regions 63 and the electrically conductive layers 46 can function as etch stop structures during the first anisotropic etch process.

A drain contact via cavity is formed through the contact-level dielectric layer 73 underneath each drain contact via opening in the first photoresist layer by the first anisotropic etch process. A layer contact via cavity can be formed through the contact-level dielectric layer 73 and the retro-stepped dielectric material portion 65 underneath each layer contact via opening in the first photoresist layer by the first anisotropic etch process. A top surface of a drain region 63 is physically exposed at the bottom of each drain contact via cavity. A top surface of an electrically conductive layer 46 is physically exposed at the bottom of each layer contact via cavity. The first photoresist layer can be subsequently removed, for example, by ashing.

A second photoresist layer (not shown) can be applied over the contact-level dielectric material layer 73, and can be lithographically patterned to form contact-level openings, which may comprise discrete line-shaped openings, therethrough. The discrete line-shaped openings can include multiple instances of a unit connection region U that are formed in the bit line hookup regions 200. In one embodiment, each of the discrete line-shaped openings can be formed in a respective one of the bit line hookup region 200. Each line-shaped opening can include a plurality of line segments that are adjoined to each other and laterally extend along the first horizontal direction hd1 (e.g., word line direction) or along the second horizontal direction hd2 (e.g., bit line direction). Each line-shaped opening can include a first end and a second end such that the first end is more proximal to a respective memory array region 100 than the second end is to the respective memory array region 100.

If the bit line hookup region 200 is located between two portions of the memory array region 100 of the first embodiment as shown in FIG. 1A, then the first end and the second end of each discrete line-shaped opening may be aligned along the second horizontal direction hd2. For example, a discrete line-shaped opening may have a first straight short edge extending along the first horizontal direction hd1 at the first end, and may have a second straight short edge extending along the first horizontal direction hd1 at the second end. A line connecting the center point of the first straight edge and the center point of the second straight edge can be parallel to the second horizontal direction hd2.

A second anisotropic etch process can be performed to transfer the pattern of the contact-level openings, such as discrete line-shaped openings, through an upper portion of the contact-level dielectric layer 73. The patterned second photoresist layer can be used as an etch mask during the second anisotropic etch process. The anisotropic etch process can remove unmasked portions of the contact-level dielectric layer 73 down to a depth, which may be the same as, or may be less than, the thickness of the contact-level dielectric layer 73. A contact-level cavity, such as a line cavity is formed through at least an upper portion of the contact-level dielectric layer 73 underneath each discrete line-shaped opening in the second photoresist layer by the second anisotropic etch process. The second photoresist layer can be subsequently removed, for example, by ashing.

While an embodiment is described in which contact-level cavities are formed by the second anisotropic etch process has a depth that is less than the thickness of the contact-level dielectric layer 73, embodiments are expressly contemplated herein in which the depth of each contact-level cavity is the same as the thickness of the contact-level dielectric layer 73. In this case, the same first photoresist layer may be used ask a mask to etch all of the above described cavities and openings. Furthermore, the contact-level cavities are not limited to line shaped cavities, and may also include curved and/or polygonal shaped cavities.

At least one conductive material can be deposited within each opening in the contact-level dielectric layer 73 and the retro-stepped dielectric material portions 65. For example, a conductive metallic liner including a conductive metallic nitride material (such as TiN, TaN, or WN) can be conformally deposited in each of the drain contact via cavities, layer contact via cavities, and the contact-level cavities. Subsequently, a metallic fill material including an elemental metal or an intermetallic alloy (such as W, Co, Ru, Mo, Cu, etc.) may be deposited in remaining unfilled volumes of the drain contact via cavities, layer contact via cavities, and the contact-level cavities. A conformal deposition process (such as a chemical vapor deposition process) or an electroplating process may be used to deposit the metallic fill material. Portions of the metallic fill material and the conductive metallic nitride material that overlie a horizontal plane including the top surface of the contact-level dielectric layer 73 can be removed by a planarization process. The planarization process can employ chemical mechanical planarization (CMP) or a recess etch process.

Each of the drain contact via cavities, layer contact via cavities, and the contact-level cavities can be filled within a respective combination of a remaining portion of the at least one conductive material. A drain contact via structure 88 contacting an underlying drain region 63 can be formed in each of the drain contact via cavities. Each drain contact via structures 88 can be formed in a memory array region 100. A layer contact via structure (e.g., word line contact via structure) 86 contacting an underlying electrically conductive layer 46 (e.g., word line) can be formed in each of the layer contact via cavities. Each layer contact via structure 86 can be formed in a staircase region 300. A contact-level metal interconnect 82 (e.g., a contact-level local interconnect line) that is electrically isolated from underlying conductive structures and neighboring conductive structures can be formed in each of the contact-level cavities. Each contact-level metal interconnect 82 can be formed in a bit line hookup region 200. Each of the drain contact via structures 88, the layer contact via structures 86, and the contact-level metal interconnects 82 are embedded in, and are laterally surrounded by, the contact-level dielectric layer 73.

Generally, at least one layer of the alternating stack (32, 46) can be absent within each bit line hookup region 200. A dielectric material portion can be present at the level of the alternating stack (32, 46) within each bit line hookup region 200. In one embodiment, a retro-stepped dielectric material portion 65 can continuously extend from an adjacent staircase region 300 into a bit line hookup region 200. Alternatively, a dielectric material portion within a bit line hookup region 200 may be disjoined from an adjacent retro-stepped dielectric material portion 65. Generally, the dielectric material portion in each bit line hookup region 200 may be the same as, or may be different from, the dielectric material of the retro-stepped dielectric material portion 65. In one embodiment, all layers of the alternating stack (32, 46) may be absent within a bit line hookup region 200. In this case, the layers of the alternating stack (32, 46) do not extend into the bit line hookup region 200.

In one embodiment shown in FIG. 13D, at least one contact-level metal interconnect 82, such as a plurality of contact-level metal interconnects 82, can comprise a first segment 821 that extends along the second horizontal direction hd2 in an area proximal to the memory array region 100, a second segment 822 that extends along the second horizontal direction hd2 and is laterally offset from the first segment 821 along the second horizontal direction hd2 away from the memory array region 100, and at least one third segment 823 that connects the first segment 821 to the second segment 822. The at least one third segment 823 may extend along the first and/or second horizontal directions.

In one embodiment, the contact-level metal interconnects 82 can have a uniform width throughout, or in predominant portions thereof. The uniform width can be greater than the width of bit lines to be subsequently formed. In one embodiment, the uniform width of the contact-level metal interconnects 82 can be in a range from two times the width of the bit lines to be subsequently formed to four time the width of the bit lines to be subsequently formed. Typically, bit lines are formed with a minimum lithographically printable pitch for a line and space pattern, and with a minimum line width consistent with the minimum lithographically printable pitch. By patterning the contact-level metal interconnects 82 with a relaxed pitch and a relaxed line width (i.e., a pitch that is greater than the minimum lithographically printable pitch and a line width that is greater than the minimum printable line width), the contact-level metal interconnects 82 can be formed with a lower lithographic patterning cost and with higher reliability.

Referring to FIGS. 14A-14E, a via-level dielectric layer 75 can be formed over the contact-level dielectric layer 73. The via-level dielectric layer 75 includes a dielectric material such as undoped silicate glass, a doped silicate glass, or organosilciate glass. The via-level dielectric layer 75 can be formed by chemical vapor deposition. The thickness of the via-level dielectric layer 75 can be in a range from 75 nm to 600 nm, such as from 150 nm to 300 nm, although lesser and greater thicknesses can also be used.

A photoresist layer can be applied over the via-level dielectric layer 75, and can be lithographically patterned to form discrete openings therethrough by lithographic exposure and development. The discrete openings formed through the photoresist layer include drain-to-bit-line connection via openings, bit-line-connection via openings, word-line-connection via openings, and pad-connection via openings.

The drain-to-bit-line connection via openings are formed at locations at which drain-to-bit-line connection via structures are to be subsequently formed. The drain-to-bit-line connection via structures are conductive via structures that provide electrical connection between a drain region 63 and a bit line. The drain-to-bit-line connection via openings can be formed within a respective memory array region 100 in an area that overlies a respective one of the drain contact via structures 88. In one embodiment, the drain-to-bit-line connection via openings can be elongated along the lengthwise direction hd2 of bit lines to be subsequently formed. The width of each drain-to-bit-line connection via opening can be substantially the same as the width of the bit lines to be subsequently formed. In one embodiment, the area of each drain-to-bit-line connection via opening can be entirely within the area of an underlying drain contact via structure 88. In one embodiment, each drain contact via structure 88 can have a circular cylindrical shape, and the each drain-to-bit-line connection via openings can have an elliptical cylindrical shape having a maximum lateral dimension that does not exceed the diameter of the circular cylindrical shape.

The bit-line-connection via openings are formed at locations at which bit-line-connection via structures are to be subsequently formed. The bit-line-connection via structures are conductive via structures that provide electrical connection between a contact-level metal interconnect 82 and a bit line. The bit-line-connection via openings can be formed within a respective bit line hookup region 200 over a first segment of a respective one of the contact-level metal interconnects 82. The first segment of a contact-level metal interconnect 82 can be an end segment of the contact-level metal interconnect 82 that is proximal to an adjacent memory array region 100. In one embodiment, the entire area of each bit-line-connection via opening can be located entirely within the area of the first segment of the respective one of the contact-level metal interconnects 82. In one embodiment, the bit-line-connection via openings may be elongated along the second horizontal direction hd2, which is the lengthwise direction of the bit lines to be subsequently formed. In one embodiment, the width of each bit-line-connection via openings can be substantially the same as the width of the bit lines to be subsequently formed so that each bit-line-connection via structure to be subsequently formed therein contacts only one bit line.

The word-line connection via openings are formed directly over the layer contact via structures 86. The pad-connection via openings are formed at locations at which pad-connection via structures are to be subsequently formed. The pad-connection via structures are conductive via structures that provide electrical connection between a metal pad to be subsequently formed and a bit line to be subsequently formed. The pad-connection via openings can be formed within a respective bit line hookup region 200 over a second segment of a respective one of the contact-level metal interconnects 82. The second segment of a contact-level metal interconnect 82 can be a middle segment or an end segment of the contact-level metal interconnect 82 that is distal from an adjacent memory array region 100. In one embodiment, the entire area of each pad-connection via opening can be located entirely within the area of the second segment of the respective one of the contact-level metal interconnects 82. In one embodiment, the pad-connection via openings may have a width that is greater than the width of a bit line to be subsequently formed. In one embodiment, the pad-connection via openings can have a width that is about the same as the width of an underlying contact-level metal interconnect 82.

An anisotropic etch process can be performed to transfer the pattern of the openings in the photoresist layer through the via-level dielectric layer 75. Various via cavities are formed underneath the openings in the photoresist layer through the via-level dielectric layer 75. Specifically, drain-to-bit-line connection via cavities are formed through the via-level dielectric layer 75 underneath the drain-to-bit-line connection via openings in the photoresist layer. A top surface of a drain contact via structure 88 can be physically exposed at the bottom of each drain-to-bit-line connection via cavity. Bit-line-connection via cavities are formed through the via-level dielectric layer 75 underneath the bit-line-connection via openings in the photoresist layer. A top surface of a first segment of a contact-level metal interconnect 82 is physically exposed at the bottom of each bit-line-connection via cavity. Word-line-connection via cavities are formed through the via-level dielectric layer 75 underneath the word-line-connection via openings in the photoresist layer. Pad-connection via cavities are formed through the via-level dielectric layer 75 underneath the pad-connection via openings in the photoresist layer. A top surface of a second segment of a contact-level metal interconnect 82 is physically exposed at the bottom of each pad-connection via cavity. The photoresist layer can be subsequently removed, for example, by ashing.

At least one conductive material can be deposited within each via cavity through the via-level dielectric layer 75. For example, a conductive metallic liner including a conductive metallic nitride material (such as TiN, TaN, or WN) can be conformally deposited in each of the drain-to-bit-line connection via cavities, the bit-line-connection via cavities, the word-line-connection via cavities, and the pad-connection via cavities. Subsequently, a metallic fill material including an elemental metal or an intermetallic alloy (such as W, Co, Ru, Mo, Cu, etc.) may be deposited in remaining unfilled volumes of the drain-to-bit-line connection via cavities, the bit-line-connection via cavities, the word-line-connection via cavities, and the pad-connection via cavities. A conformal deposition process (such as a chemical vapor deposition process) or an electroplating process may be used to deposit the metallic fill material. Portions of the metallic fill material and the conductive metallic nitride material that overlie a horizontal plane including the top surface of the via-level dielectric layer 75 can be removed by a planarization process. The planarization process can employ chemical mechanical planarization (CMP) or a recess etch process.

Each of the drain-to-bit-line connection via cavities, the bit-line-connection via cavities, the word-line-connection via cavities, and the pad-connection via cavities can be filled within a respective combination of a remaining portion of the at least one conductive material. A drain-to-bit-line connection via structure 98 contacting an underlying drain contact via structure 88 can be formed in each of the drain-to-bit-line connection via cavities. Each drain-to-bit-line connection via structure 98 can be formed in a memory array region 100. A bit-line-connection via structure 92 contacting an underlying first segment of a contact-level metal interconnect 82 can be formed in each of the bit-line-connection via cavities. A word-line-connection via structure 96 contacting an underlying layer contact via structure 86 can be formed in each word-line-connection via cavity. A pad-connection via structure 94 contacting an underlying second segment of a contact-level metal interconnect 82 can be formed in each of the pad-connection via cavities. Each of the drain-to-bit-line connection via structure 98, the bit-line-connection via structures 92, the word-line-connection via structures 96, and the pad-connection via structures 94 can be embedded in, and are laterally surrounded by, the via-level dielectric layer 75. Each of the contact-level metal interconnects 82, the pad-connection via structures 94, and the bit-line-connection via structures 92 can be located in a respective bit line hookup region 200 that is laterally spaced from an adjacent memory array region 100.

Referring to FIGS. 15A-15H, a bit-line-level dielectric layer 77 can be formed over the via-level dielectric layer 75. The bit-line-level dielectric layer 77 includes a dielectric material such as undoped silicate glass, a doped silicate glass, or organosilciate glass. The bit-line-level dielectric layer 77 can be formed by chemical vapor deposition. The thickness of the bit-line-level dielectric layer 77 can be in a range from 75 nm to 600 nm, such as from 150 nm to 300 nm, although lesser and greater thicknesses can also be used.

A photoresist layer can be applied over the bit-line-level dielectric layer 77, and can be lithographically patterned to form line-shaped openings and pad-shaped openings by lithographic exposure and development. Optionally, assist techniques such as spacer assisted pitch reduction processes may be employed at least once to reduce the pitch of the line-shaped openings. A first subset of the line-shaped openings formed in any memory array region 100 and in any bit line hookup region 200 has the pattern of bit lines to be subsequently formed. A second subset of the line-shaped openings formed in a staircase region 300 (which overlaps with word line hookup regions WLHU) has the pattern of word-line-connection metal lines to be subsequently formed. The pad-shaped openings (e.g., round, oval or polygonal shaped openings) formed in a respective bit line hookup region 200 have the pattern of metal pads to be subsequently formed.

The first subset of the line-shaped openings for forming the bit lines can laterally extend along the second horizontal direction hd2, and can extend through the entire lateral extent of a memory array region 100 and into a proximal portion of an adjacent bit line hookup region 200. The line-shaped openings for formation of bit lines can have a uniform line and space pattern, i.e., a line and space pattern having a uniform pitch throughout. Each line-shaped opening can have a minimum lithographic printable width for a space in a line and space pattern. The uniform pitch of the line and space pattern may be the minimum lithographic printable pitch for a lithographic tool used to form the line and space pattern. Each line-shaped opening can overlie, and can have an areal overlap with, a set of bit-line-connection via structures 92.

The second subset of the line-shaped openings for forming the word-line-connection metal lines can generally extend along the first horizontal direction hd1, and may include segments that extend along the second horizontal direction hd2. The layout for the second subset of the line-shaped openings can be optimized for efficient electrical connection between the bonding pads to be connected to the word-line-connection metal lines and the electrically conductive layers (e.g., word lines) 46.

The pad-shaped openings can be formed in a respective bit line hookup region 200. In one embodiment, the pad-shaped openings can be formed within the areas of the unit connection regions U. Each pad-shaped opening can overlie, and can include the entire area of, an underlying one of the pad-connection via structures 94.

An anisotropic etch process can be performed to transfer the pattern of the openings in the photoresist layer through the bit-line-level dielectric layer 77. Bit line cavities are formed through the bit-line-level dielectric layer 77 underneath the first subset of the line-shaped openings in the photoresist layer. Word-line-connection line cavities are formed through the bit-line-level dielectric layer 77 underneath the second subset of the line-shaped openings in the photoresist layer. Pad cavities are formed through the bit-line-level dielectric layer 75 underneath the pad-shaped openings in the photoresist layer.

Top surfaces of a respective subset of drain-to-bit-line connection via structures 98 and a top surface of a bit-line-connection via structure 92 can be physically exposed at the bottom of each bit line cavity. A top surface of a word-line-connection via structure 96 can be physically exposed at the bottom of each word-line-connection line cavity. A top surface of a pad-connection via structure 94 is physically exposed at the bottom of each pad cavity. The photoresist layer can be subsequently removed, for example, by ashing.

At least one conductive material can be deposited within each cavity through the bit-line-level dielectric layer 77. For example, a metallic fill material including an elemental metal or an intermetallic alloy (such as W, Co, Ru, Mo, Cu, etc.) may be deposited in remaining unfilled volumes of the bit line cavities, the word-line-connection line cavities, and the pad cavities. Optionally, a conductive metallic liner including a conductive metallic nitride material (such as TiN, TaN, or WN) can be conformally deposited in each of the bit line cavities, the word-line-connection line cavities, and the pad cavities prior to the metallic fill material. Alternatively, the liner (i.e., diffusion barrier) may be omitted to avoid attack by the subsequent wet chemical cleaning step. A conformal deposition process (such as a chemical vapor deposition process) or an electroplating process may be used to deposit the metallic fill material. Portions of the metallic fill material and the conductive metallic nitride material that overlie a horizontal plane including the top surface of the bit-line-level dielectric layer 77 can be removed by a planarization process. The planarization process can employ chemical mechanical planarization (CMP) or a recess etch process.

Each of the bit line cavities, the word-line-connection line cavities, and the pad cavities can be filled within a respective combination of a remaining portion of the at least one conductive material. A bit line 108 contacting an underlying subset of drain-to-bit-line connection via structures 98 and a top surface of a bit-line-connection via structure 92 can be formed in each bit line cavity. Each bit line 108 can laterally extend through an entire lateral extent of a memory array region 100 along the second horizontal direction hd2, and can laterally extend into at least a proximal region of an adjoining bit line hookup region 200. A word-line-connection metal line 106 contacting an underlying word-line-connection via structure 96 can be formed in each of the word-line-connection line cavities. A metal pad 104 contacting an underlying pad-connection via structure 94 can be formed in each of the pad cavities. Each of the bit lines 108, the word-line-connection metal lines 96, and the metal pads 104 is embedded in, and are laterally surrounded by, the bit-line-level dielectric layer 77. Each of the contact-level metal interconnects 82, the pad-connection via structures 94, the bit-line-connection via structures 92, and the metal pads 104 can be located in a respective bit line hookup region 200 that is laterally spaced from an adjacent memory array region 100.

The bit-line-level dielectric layer 77 embeds bit lines 108 that contact a respective subset of the drain-to-bit-line connection via structures 98, and embeds metal pads 104 that contact a respective one of the pad-connection via structures 94. Each metal pad 104 can have a respective width that is at least twice the width of each of the bit lines 108. In one embodiment, the lateral dimension of each metal pad 104 along the first horizontal direction hd1 (i.e., along the widthwise direction of each bit line 108) can be in a range twice the width of each bit line 108 to 32 times the width of each bit line, such as from four times the width of each bit line 108 to 16 times the width of each bit line 108.

Figure 15A:
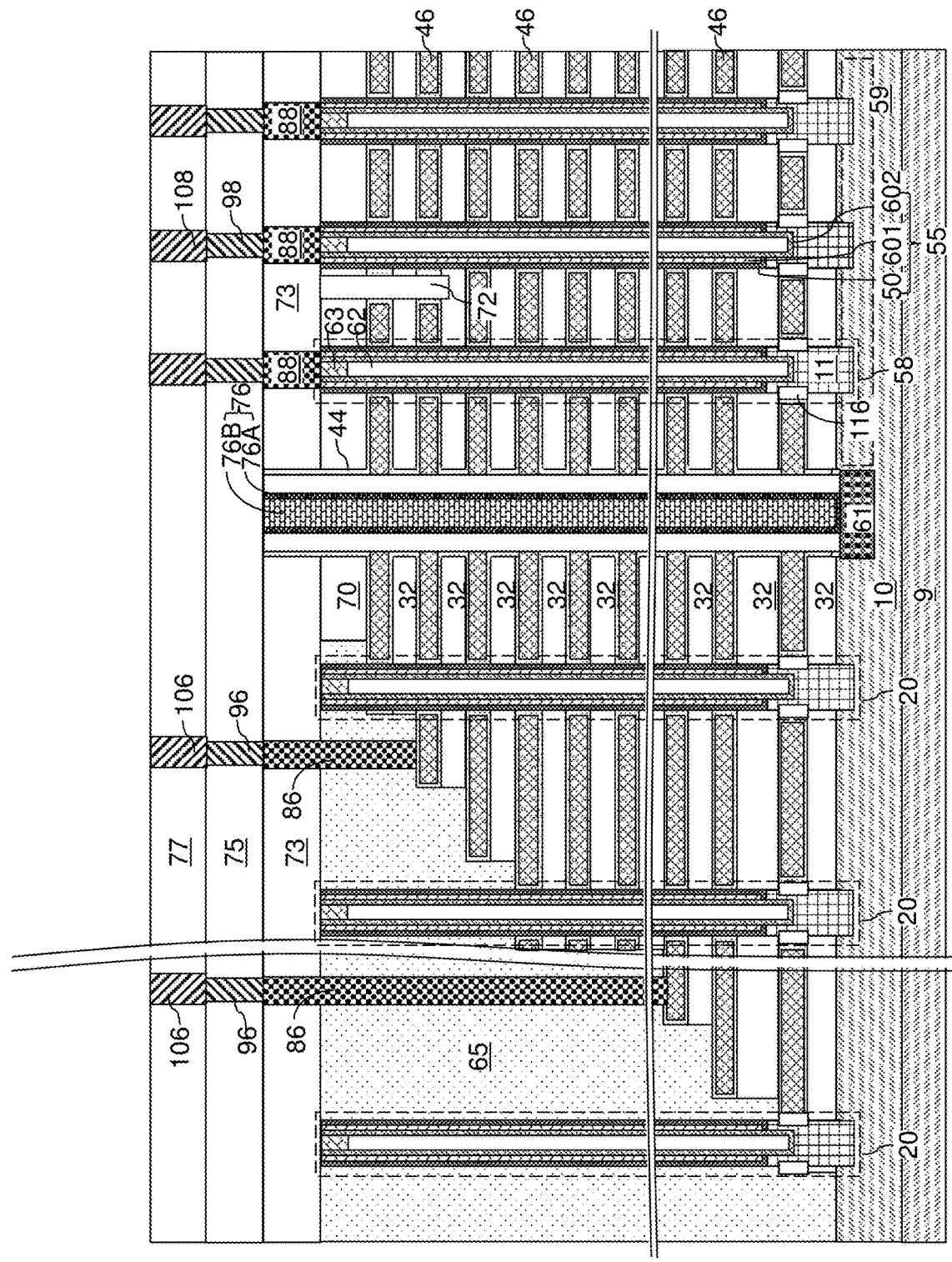
FIG. 15A is a vertical cross-sectional view of a memory array region and a staircase region of the exemplary structure after formation of a bit-line-level dielectric layer, bit lines, and metal pads according to first and second embodiments of the present disclosure.
Figure 15B:
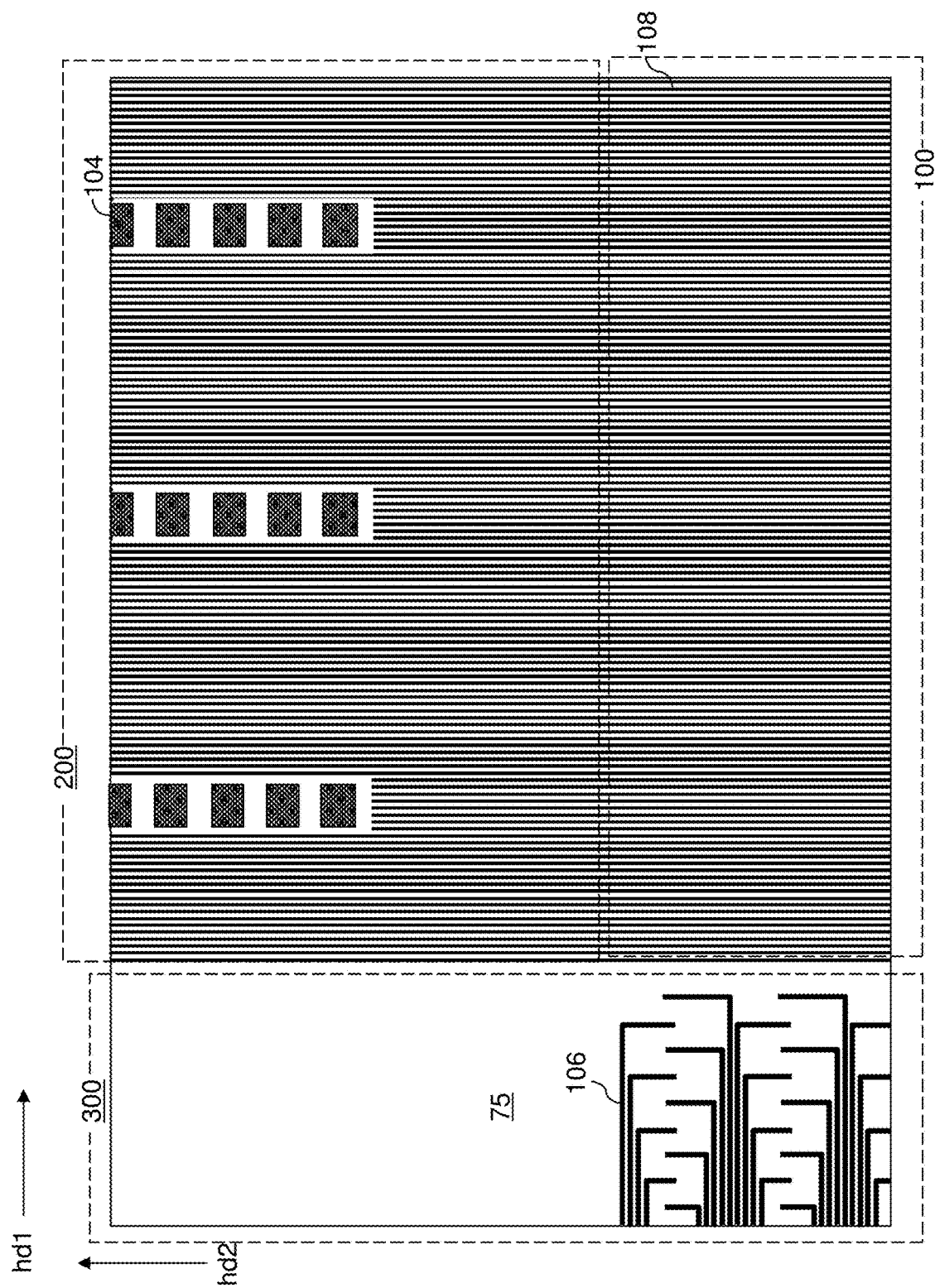
FIG. 15B is a top-down view of the exemplary structure of FIG. 15A. The illustrated regions include a memory array region, a portion of a staircase region, and a portion of a bit line hookup region.
Figure 15D:
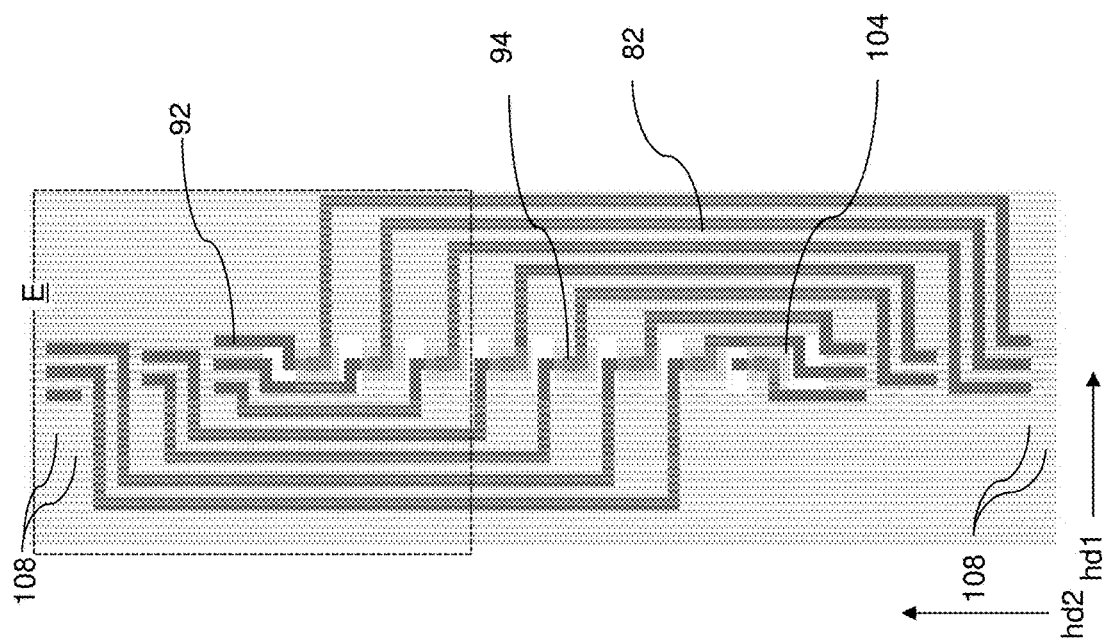
FIG. 15D is a see-through magnified top-down view of a portion of the unit connection region U of FIG. 15C according to the first embodiment of the present disclosure. Overlay of the structures embedded in the contact-level dielectric layer, the via-level dielectric layer, and the bit-line-level dielectric layer is illustrated.
Figure 15C:
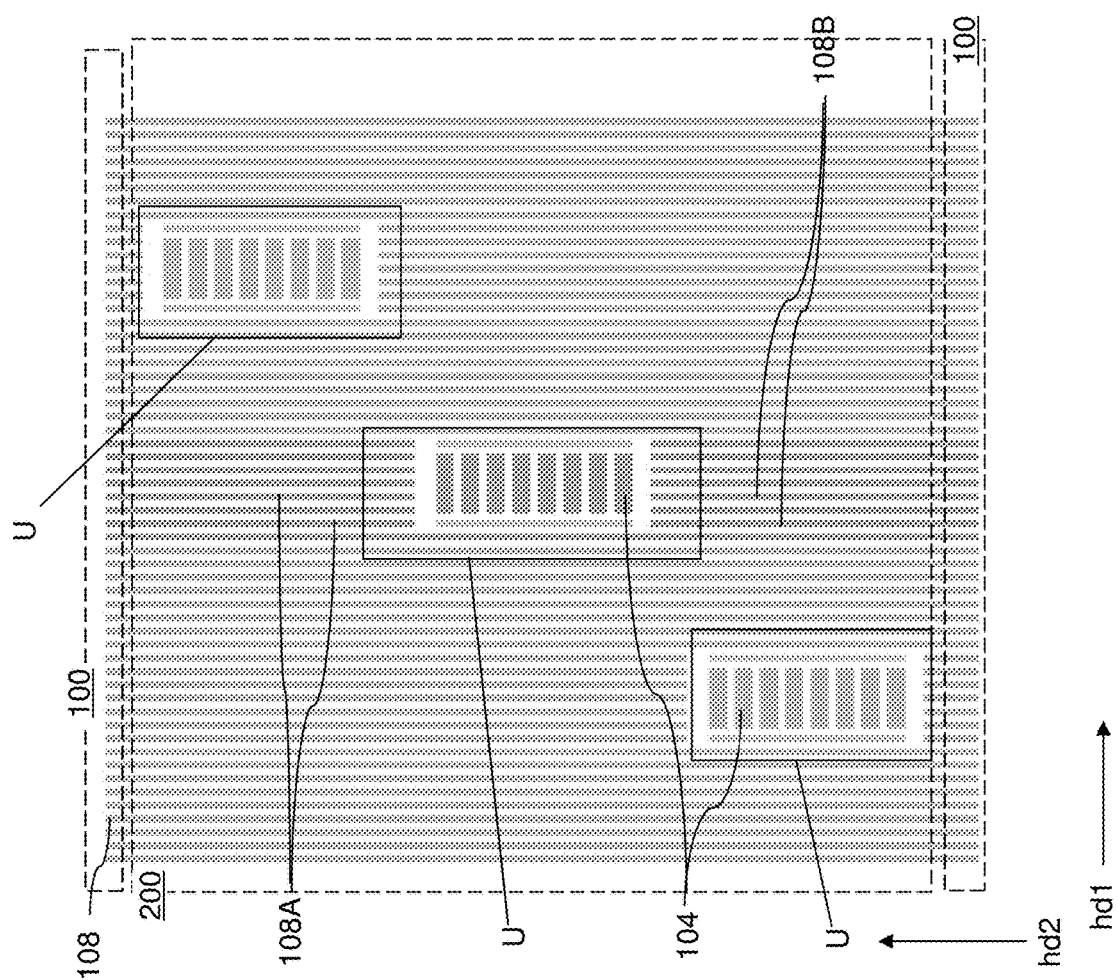
FIG. 15C is a top-down view of a portion of the bit line hookup region of the exemplary structure of FIGS. 15A-15B according to the first embodiment of the present disclosure. Multiple instances of the unit connection region U are illustrated.
Figure 15E:
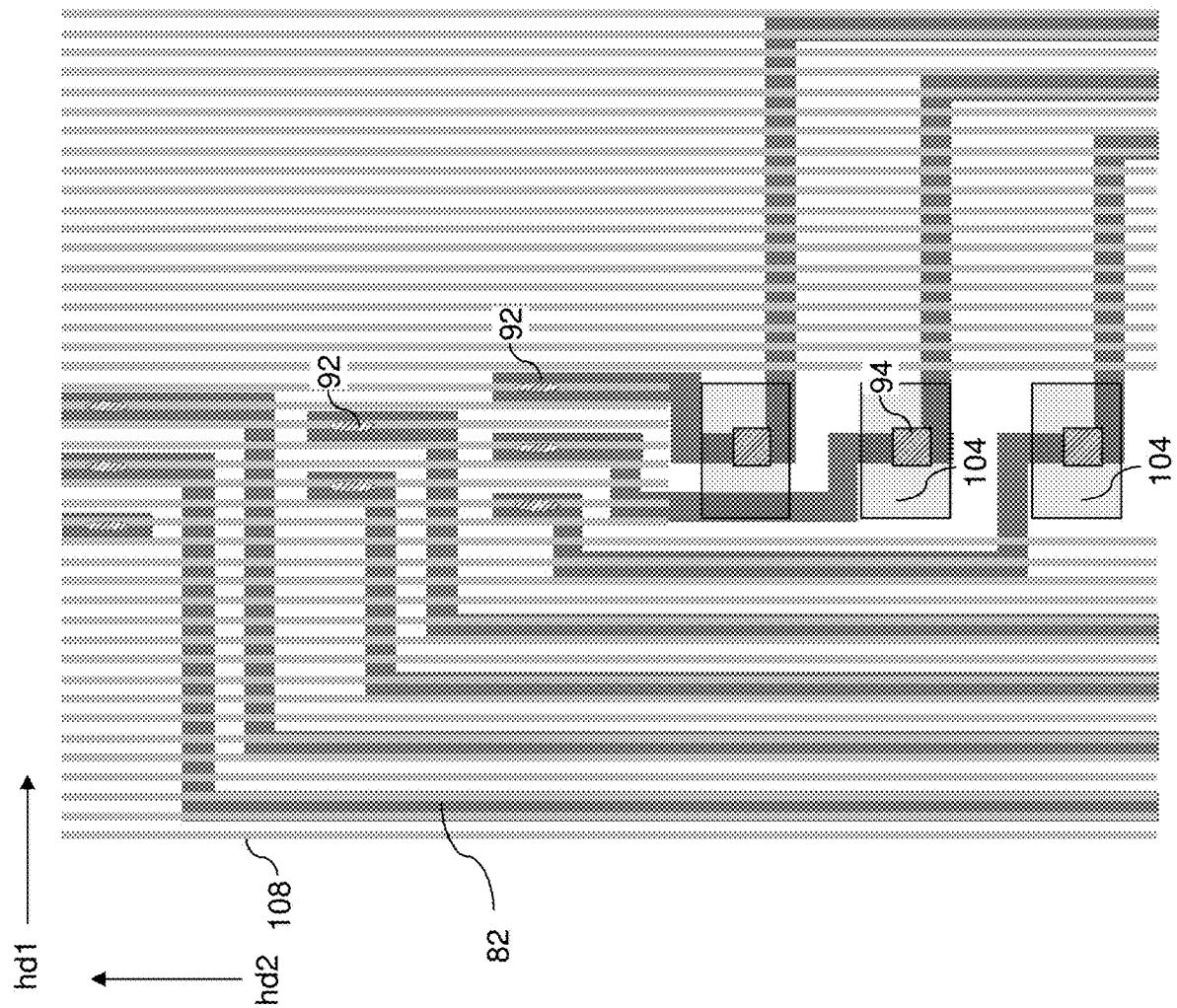
FIG. 15E is a magnified top-down view of a portion E of the unit connection region U of FIG. 15D according to the first embodiment of the present disclosure.
Figure 15H:
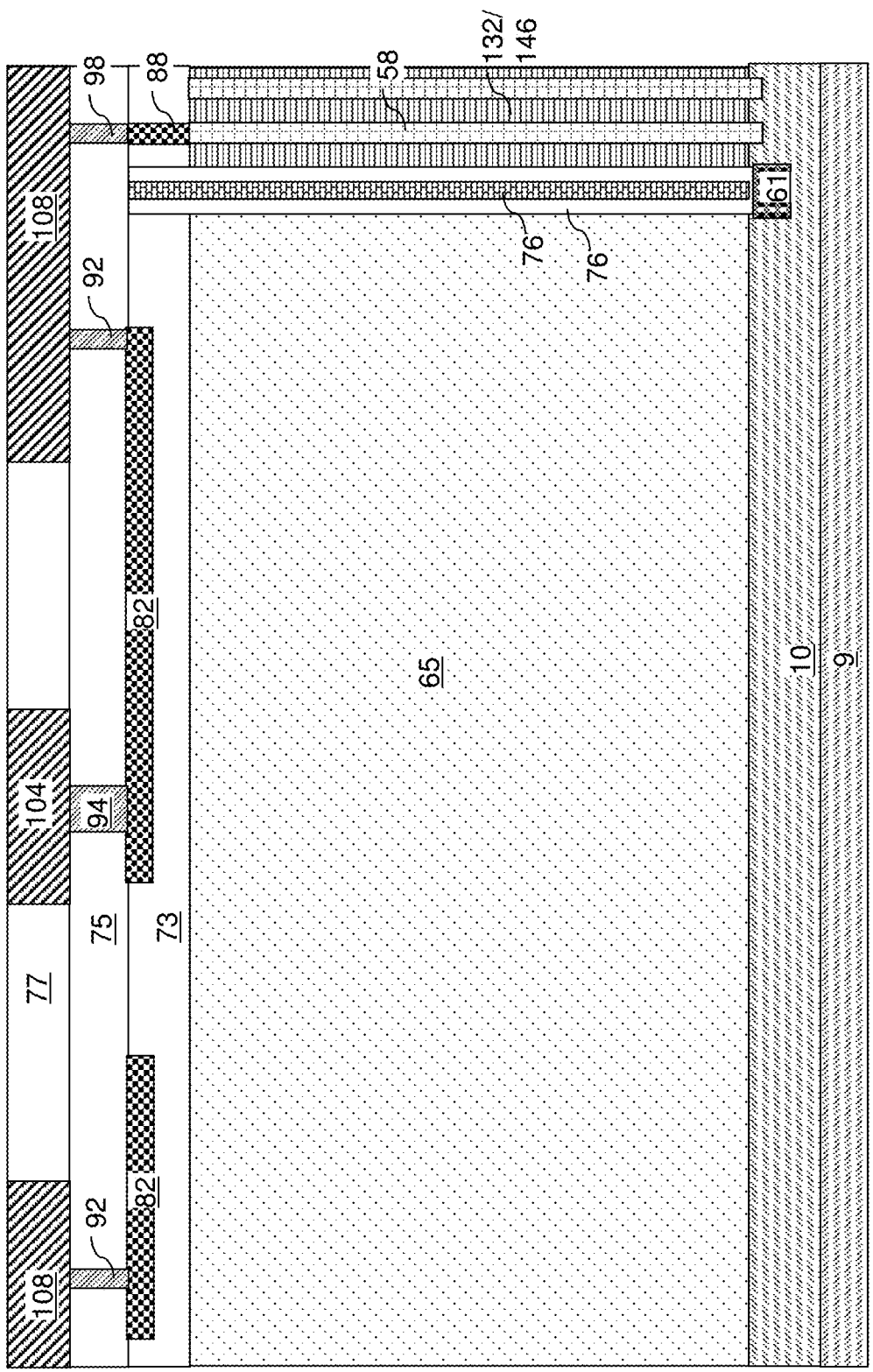
FIG. 15H is a vertical cross-sectional view of a portion of the bit line hookup region and memory array region of FIGS. 15A-15G.

In one embodiment shown in FIG. 15H, each of the metal pads 104 can be connected to a respective bit line 108 through a series connection of a respective pad-connection via structure 94, a respective contact-level metal interconnect 82, and a respective bit-line-connection via structure 92. In one embodiment, each of the bit lines 108 laterally extends across the memory array region 100 and into a bit line hookup region 200 that is adjacent to the memory array region 100. In one embodiment, the bit-line-connection via structures 92 contact a bottom surface of a respective one of the bit lines 108 in the bit line hookup region 200.

In one embodiment, the bit lines 108 have a uniform width along a first horizontal direction hd1 and laterally extend along a second horizontal direction hd2, and the metal pads 104 are arranged as multiple clusters. Each cluster of metal pads 104 can comprise a one-dimensional array of metal pads 104 that are arranged along the second horizontal direction hd2.

In one embodiment, the bit lines 108 have a uniform pitch along the first horizontal direction hd1, and each cluster of metal pads 104 has a lateral extent along the first horizontal direction hd1 that is at least three times the uniform pitch of the bit lines 108.

In one embodiment, each one-dimensional array of metal pads 104 overlies a portion of a respective one of the contact-level metal interconnects 82. At least one contact-level metal interconnect 82 that underlies a respective metal pad 104 can comprise a first segment 821 (shown in FIG. 13D) that extends along the second horizontal direction hd2 and contacting a respective bit-line-connection via structure 92, a second segment 822 (shown in FIG. 13D) contacting a pad-connection via structure 94, and at least one third segment 823 (shown in FIG. 13D) that connects the first segment 821 to the second segment 822. In one embodiment, the contact-level metal interconnects 82 can have a respective width that is at least twice the uniform width of the bit lines 108.

FIGS. 15C-15E illustrate the structure of the first embodiment of the present disclosure in which the bit line hook up region 200 is located between two portions of the memory array region 100, as shown in FIG. 1A. In this embodiment, the bit lines 108 are cut in the unit connection region U and continue on both sides of each unit connection region U. Thus, the two portions of each cut bit line 108 are electrically connected to opposite ends the contact-level metal interconnects 82.

Thus, in the first embodiment, the bit lines 108 are cut into first portions 108A and second portions 108B in a unit connection region U of the bit line hookup region 200, such that the first portions 108A of the bit lines 108 are located on the first side of the unit connection region U, and the second portions 108B of the bit lines 108 are located on the second side of the unit connection region U. The first portions 108A of the bit lines are electrically connected to first ends of the contact-level metal interconnects 82, and the second portions 108B of the bit lines are electrically connected to second ends of the contact-level metal interconnects 82 which are opposite to the first ends.

FIGS. 15F-15G illustrate the structure of the second embodiment of the present disclosure in which the bit line hook up region 200 is located outside the memory array region 100, as shown in FIG. 1B. In this embodiment, the bit lines 108 are cut in the unit connection region U. The active bit lines 108A are located only on the memory array region 100 side of each unit connection region U. Each active bit line 108A is electrically connected to the first end the contact-level metal interconnect 82 that is proximal to the memory array region 100. The remaining portions of the cut bit lines 108 comprise dummy bit lines 108D that are not electrically connected to the contact-level metal interconnects 82. Thus, the dummy bit lines 108D comprise floating portions of metal lines that are not electrically connected to an input or output connection.

Thus, in the second embodiment, the bit lines 108 are cut into first portions 108A and second portions 108D in a unit connection region U of the bit line hookup region 200, such that the first portions 108A of the bit lines 108 are located on the first side of the unit connection region U located proximal to (i.e., closer to) the memory array region 100, and the second portions 108B of the bit lines 108D comprise dummy bit lines that are not electrically connected to an input or output connection and that are located on the second side of the unit connection region U distal from (i.e., farther from) the memory array region 100. The first portions 108A of the bit lines are electrically connected to first ends of the contact-level metal interconnects 82, and the second portions 108D of the bit lines are not electrically connected to the contact-level metal interconnects 82.

Figure 16A:
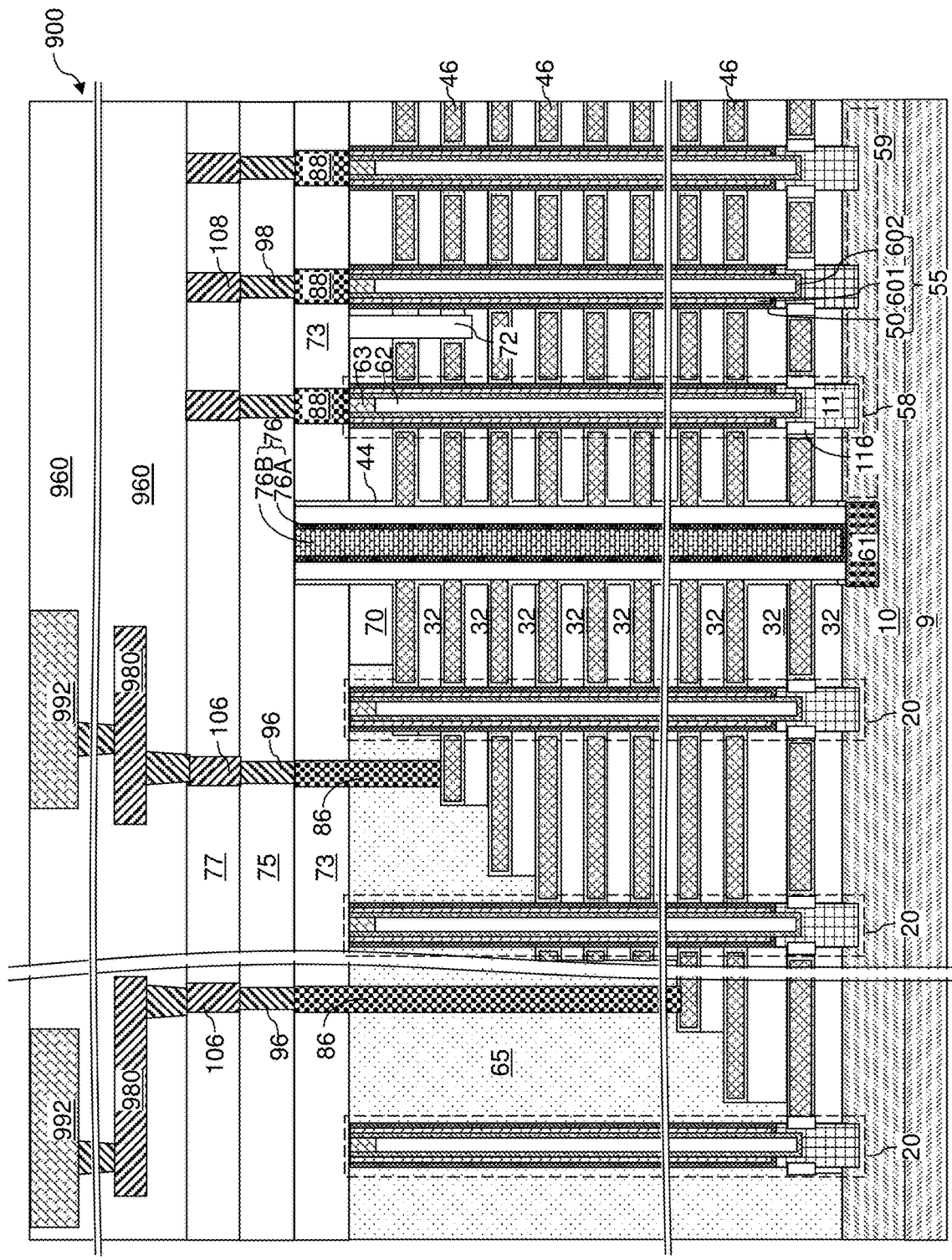
FIG. 16A is a vertical cross-sectional view of a memory array region and a staircase region of the exemplary structure after formation of interconnect-level dielectric material layers, memory-side metal interconnect structures, and memory-side bonding pads according to an embodiment of the present disclosure.
Figure 16B:
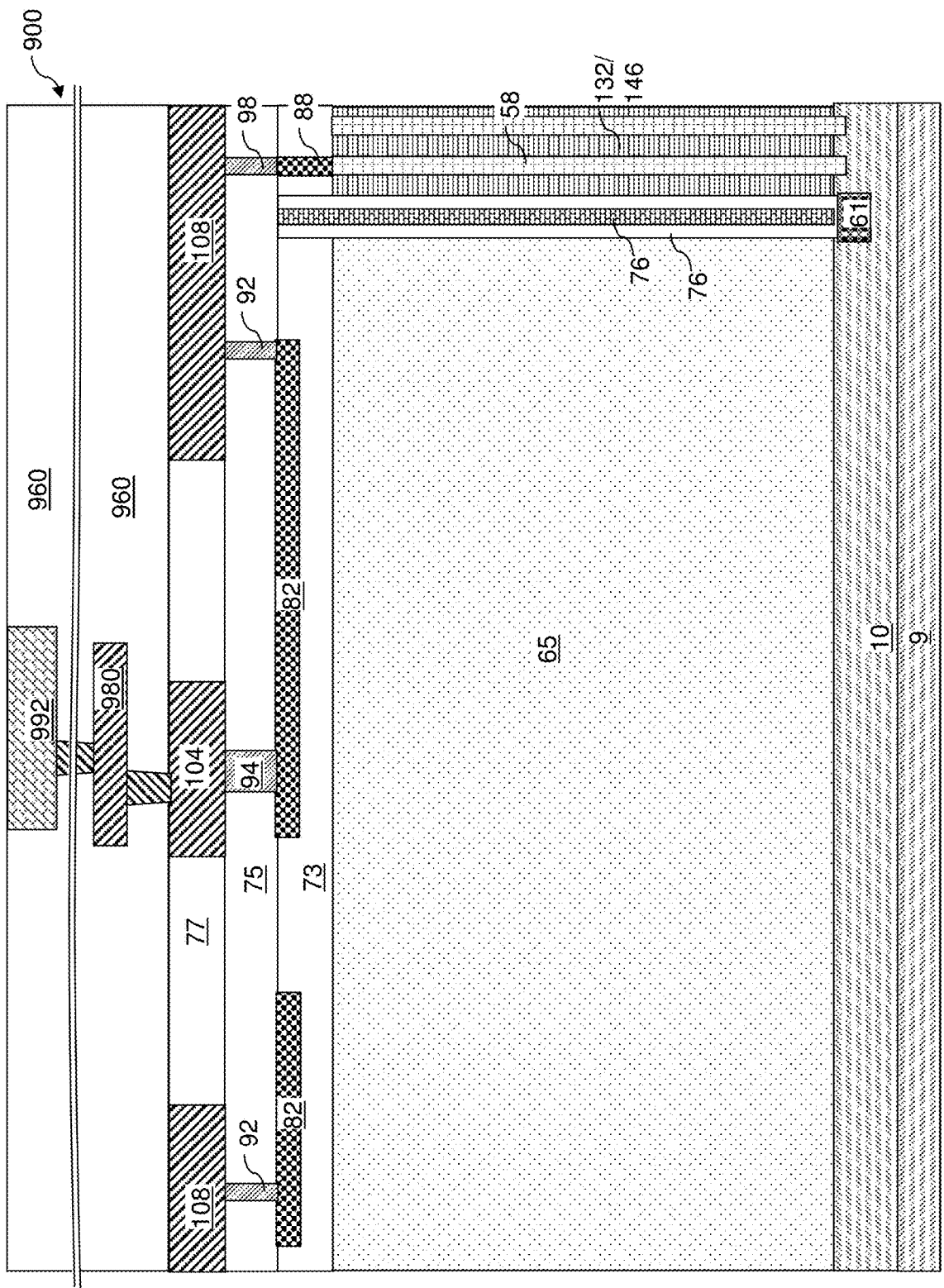
FIG. 16B is a vertical cross-sectional view of a portion of a bit line hookup region and a portion of a memory array region at the processing step of FIG. 16A.

Referring to FIGS. 16A and 16B, interconnect-level dielectric material layers 960 can be formed above the bit-line-level dielectric layer 77. The interconnect-level dielectric material layers 960 can include at least one interconnect-via-level dielectric material layer, optional at least one interconnect-line-level dielectric material layer, and a bonding-pad-level dielectric material layer. Various memory-side metal interconnect structures 980 can be formed inside the –level dielectric material layers 960 to provide various electrically conductive paths between underlying electrically conductive structures (such as the bit lines 108, the word-line-connection metal lines 106, and the metal pads 104) and memory-side bonding pads 992. The memory-side bonding pads 992 can be embedded within the bonding-pad-level dielectric material layer, which can be a topmost layer among the interconnect-level dielectric material layers 960. The memory-side bonding pads 992 can include at least one metallic material (such as copper) that enables metal-to-metal bonding. A subset of the memory-side metal interconnect structures 980 provides electrical connection between a respective pair of a memory-side bonding pad 992 among the memory-side bonding pads 992 and a metal pad 104 among the metal pads 104. The exemplary structure comprises a memory die 900 that can be bonded to a logic die to permit transmission of logic signals from the logic die to the bit lines 108 and to a selected set of drain regions 63.

The memory die 900 can include additional memory-side bonding pads 992 embedded within a portion of the topmost layer of the interconnect-level dielectric material layers 960 (such as the bonding-pad-level dielectric material layer) located in the staircase region 300. Additional metal interconnect structures 980 can be embedded in the interconnect-level dielectric material layers 960. The additional metal interconnect structures 980 can provide electrical connection between a respective pair of an additional memory-side bonding pad 992 and a respective one of the layer contact via structures 86 to enable transmission of logic signals from the logic die to the electrically conductive layers 46.

Figure 17:
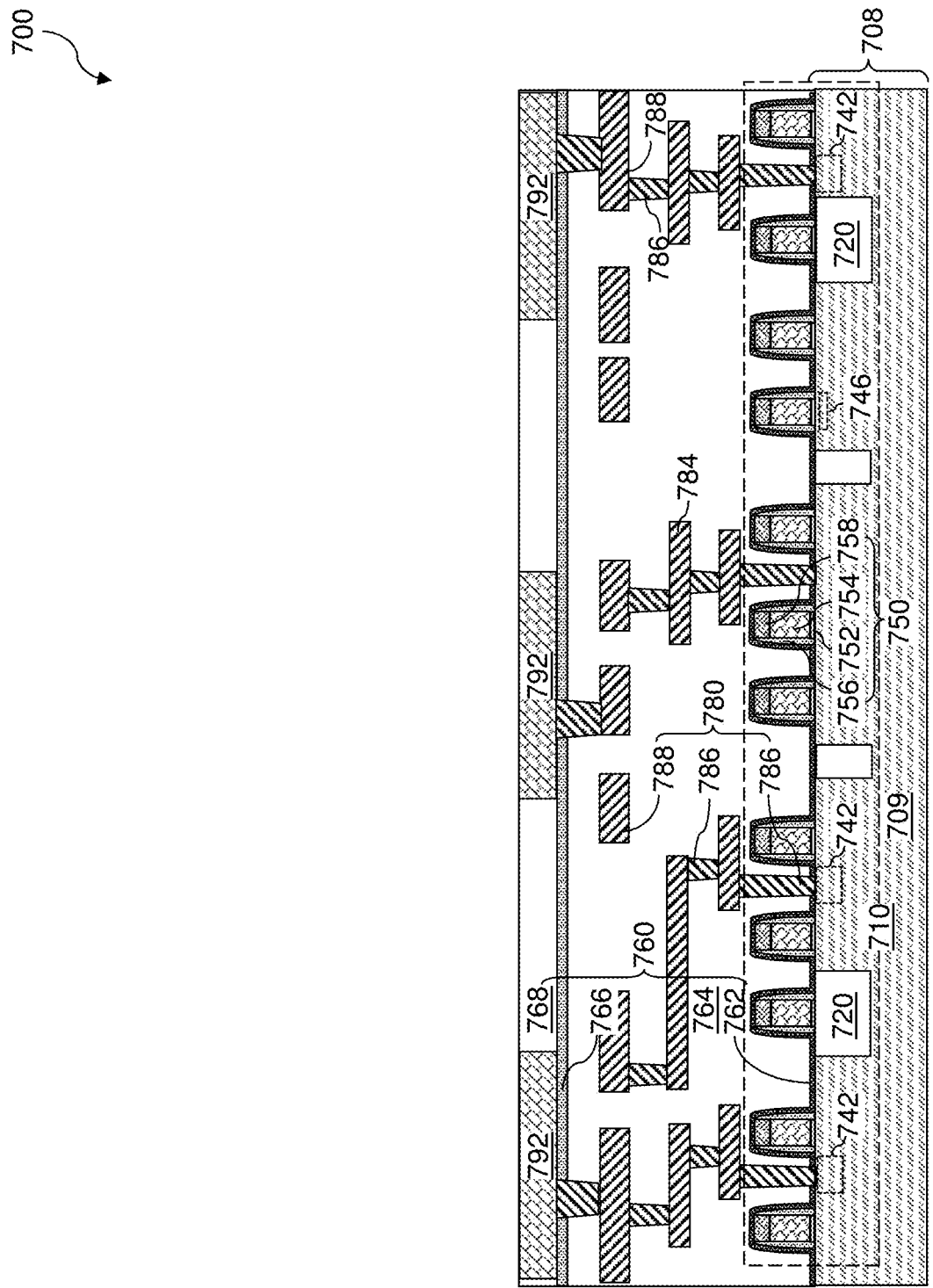
FIG. 17 is a vertical cross-sectional view of a logic die according to an embodiment of the present disclosure.

Referring to FIG. 17, a logic die 700 according to an embodiment of the present disclosure is illustrated. The logic die 700 can include a logic-die substrate 708 and semiconductor devices 710 formed thereupon. The logic-die substrate 708 includes a logic-die substrate semiconductor layer 709 at least at an upper portion thereof. Shallow trench isolation structures 720 may be formed in an upper portion of the logic-die substrate semiconductor layer 709 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The logic die 700 can have the general layout illustrated in FIGS. 1A and 1B, and can include each of the various components discussed above.

Dielectric material layers are formed over the semiconductor devices, which are herein referred to as logic-side dielectric material layers 760. The logic-side dielectric material layers 760 may include, for example, a dielectric liner 762 (such as a silicon nitride liner that blocks diffusion of mobile ions and/or apply appropriate stress to underlying structures), logic-side interconnect dielectric layers 764 that overlie the dielectric liner 762, a silicon nitride layer (e.g., hydrogen diffusion barrier) 766 that overlies the logic-side interconnect dielectric layers 764, and a logic-side bonding-pad-level dielectric layer 768.

The dielectric layer stack including the lower-level dielectric material layers 760 functions as a matrix for logic-side metal interconnect structures 780 that provide electrical connection between the semiconductor devices 710 and logic-side bonding pads 792. The logic-side bonding pads 792 are embedded within the logic-side bonding-pad-level dielectric layer 768. Each dielectric material layer within the logic-side interconnect dielectric layers 764 may include any of doped silicate glass, undoped silicate glass, organosilicate glass, silicon nitride, silicon oxynitride, and dielectric metal oxides (such as aluminum oxide). In one embodiment, the logic-side interconnect dielectric layers 764 may comprise, or consist essentially of, dielectric material layers having dielectric constants that do not exceed the dielectric constant of undoped silicate glass (silicon oxide) of 3.9. The logic-side metal interconnect structures 780 are formed within the dielectric layer stack of the lower-level dielectric material layers 760. The logic-side metal interconnect structures 780 may include various metal via structures 786 and various metal line structures 788.

Generally, the logic die 700 includes a support circuitry configured to control operation of the three-dimensional memory device within the memory die 900. The logic-side bonding pads 792 can have a mirror image pattern of a pattern of the memory-side bonding pads 992. The support circuitry can comprise a bit line driver configured to drive the bit lines 108 of the memory die 900.

Figure 18:
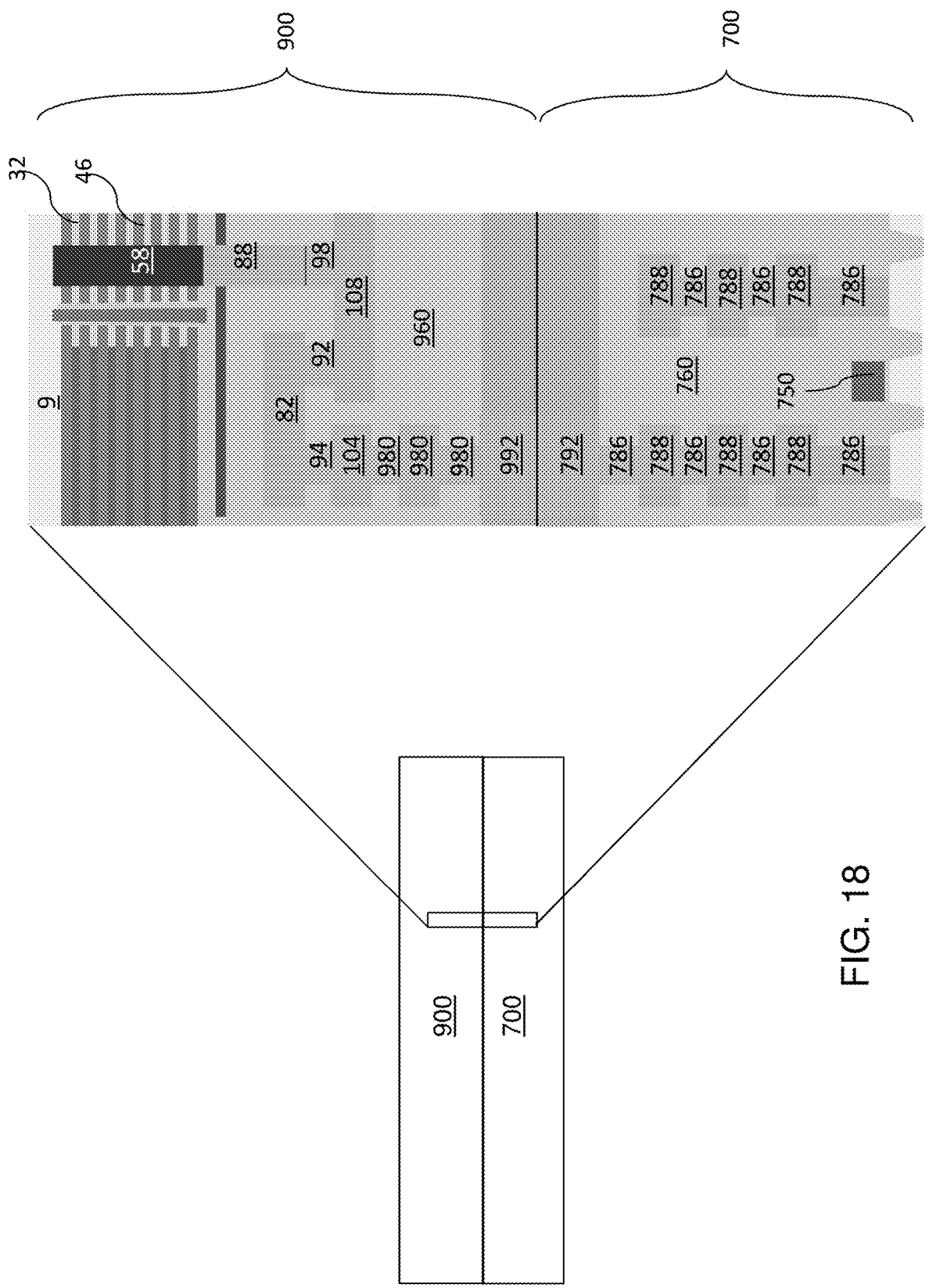
FIG. 18 is a vertical cross-sectional view of a bonded assembly of a memory die and a logic die according to an embodiment of the present disclosure.

Referring to FIG. 18, the logic die 700 can be bonded to the memory die 900. For example, the logic-side bonding pads 792 to a respective one of the memory-side bonding pads 992 through metal-to-metal bonding. In case the logic-side bonding-pad-level dielectric layer 768 and the topmost layer of the interconnect-level dielectric material layers 960 include silicon oxide, oxide-to-oxide bonding may be used in addition to, or in lieu of, metal-to-metal bonding.

Generally, the logic-side bonding pads 792 can be bonded to a respective one of the memory-side bonding pads 992. The logic die 700 includes a support circuitry configured to control operation of the three-dimensional memory device within the memory die 900. The support circuitry comprises a bit line driver connected to the bit lines 108 through the memory-side bonding pads 992 and the logic-side bonding pads 792.

The various embodiments of the present disclosure provide a new bit line connection structure that provides an increased process margin. Each of the contact-level metal interconnects 92 and the metal pads 104 have greater lateral dimensions than the bit lines 108 along the first horizontal direction hd1, i.e., along the widthwise direction of the bit lines 108. Thus, overlay between the pad-connection via structures 94 and underlying contact-level metal interconnects 82 has a large lithographic process margin. In addition, overlay between the metal interconnect structures 980 and the underlying metal pads 104 have a large lithographic process margin. Thus, it is easier to form the metal interconnect structures 980 in contact with the wider, underlying metal pads 104 than in contact with the narrower bit lines 108. Furthermore, if the metal nitride liner is omitted in the metal pads 104, then the metal pads 104 are not damaged by the wet cleaning process.

The configurations for the logic die 700 and the memory die 900 illustrated in FIGS. 1A and 1B are only exemplary. The device structure of the present disclosure can be used in many variations of the configurations illustrated in FIGS. 1A and 1B provided that a combination of a bit-line-connection via structure 92, a contact-level metal interconnect 82, a pad-connection via structure 94, and a metal pad 104 can be connected to an end portion of a bit line 104, and an overlying metal interconnect structure (such as a metal via structure) 980 can be formed directly on a top surface of the metal pad 104 instead of a top surface of the bit line 108.

Although the foregoing refers to particular embodiments, it will be understood that the disclosure is not so limited. It will occur to those of ordinary skill in the art that various modifications can be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure can be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure comprising a memory die, wherein the memory die comprises:
   an alternating stack of insulating layers and electrically conductive layers located over a substrate;
   memory stack structures vertically extending through the alternating stacks, wherein each memory stack structure comprises a memory film, a vertical semiconductor channel located adjacent to the memory film and a drain region adjoined to a top end of the vertical semiconductor channel;
   a contact-level dielectric layer overlying the alternating stack and the memory stack structures, embedding drain contact via structures that are electrically connected to a respective drain region, and embedding contact-level metal interconnects;
   a via-level dielectric layer overlying the contact-level dielectric layer, embedding drain-to-bit-line connection via structures that contact a respective one of the drain contact via structures, and embedding bit-line-connection via structures and pad-connection via structures that contact the contact-level metal interconnects; and
   a bit-line-level dielectric layer overlying the via-level dielectric layer, embedding bit lines that contact a respective subset of the drain-to-bit-line connection via structures, and embedding metal pads that contact a respective one of the pad-connection via structures and have a respective width that is at least twice a width of each of the bit lines, wherein each of the metal pads is electrically connected to a respective bit line through a series connection of a respective pad-connection via structure, a respective contact-level metal interconnect, and a respective bit-line-connection via structure.

2. The semiconductor structure of claim 1, wherein:
   the memory stack structures vertically extend through the alternating stack, and are located in a memory array region in which all layers of the alternating stack are present;
   the contact-level metal interconnects, the pad-connection via structures, and the metal pads are located in a bit line hookup region that is located outside the memory array region or that is located between two portions of the memory array region.

3. The semiconductor structure of claim 2, wherein at least one layer of the alternating stack is absent within the bit line hookup region.

4. The semiconductor structure of claim 3, wherein all layers of the alternating stack are absent within the bit line hookup region.

5. The semiconductor structure of claim 2, further comprising:
   interconnect-level dielectric material layers overlying the bit-line-level dielectric layer;
   memory-side bonding pads embedded within a topmost layer of the interconnect-level dielectric material layers; and
   metal interconnect structures embedded in the interconnect-level dielectric material layers and providing electrical connection between a respective memory-side bonding pad of the memory-side bonding pads and a respective bit line of the bit lines through a respective metal pad of the metal pads.

6. The semiconductor structure of claim 5, wherein:
the alternating stack includes stepped surfaces in a staircase region that is laterally offset from the memory array region;
electrically conductive layers comprise word lines which have lateral extents that decrease with a vertical distance from the substrate in the staircase region;
a retro-stepped dielectric material portion overlies the stepped surfaces and underlies the contact-level dielectric layer in the staircase region; and
layer contact via structures extending through the contact-level dielectric layer and the retro-stepped dielectric material portion contact a respective one of the electrically conductive layers.

7. The semiconductor structure of claim 6, further comprising:
additional memory-side bonding pads embedded within a portion of the topmost layer of the interconnect-level dielectric material layers located in the staircase region; and
additional metal interconnect structures embedded in the interconnect-level dielectric material layers and providing electrical connection between a respective pair of an additional memory-side bonding pad of the additional memory-side bonding pads and a respective one of the layer contact via structures.

8. The semiconductor structure of claim 5, further comprising a logic die bonded to the memory die, wherein the logic die comprises:
logic-side bonding pads that are bonded to a respective one of the memory-side bonding pads; and
a support circuitry configured to control operation of the three-dimensional memory device.

9. The semiconductor structure of claim 8, wherein the support circuitry comprises a bit line driver electrically connected to the bit lines through the memory-side bonding pads and the logic-side bonding pads.

10. The semiconductor structure of claim 2, wherein:
each of the bit lines laterally extends across the memory array region and into the bit line hookup region; and
the bit-line-connection via structures contact a bottom surface of a respective one of the bit lines in the bit line hookup region.

11. The semiconductor structure of claim 10, wherein:
each one-dimensional array of metal pads overlies a portion of a respective one of the contact-level metal interconnects; and
at least one contact-level metal interconnect that underlies a respective metal pad comprises:
a first segment that extends along the second horizontal direction and contacting a respective bit-line-connection via structure;
a second segment contacting a pad-connection via structure; and
at least one third segment that connects the first segment to the second segment.

12. The semiconductor structure of claim 10, wherein:
the bit line hook up region is located between two portions of the memory array region;
the bit lines are cut into first and second portions in a unit connection region of the bit line hookup region, such that the first portions of the bit lines are located on the first side of the unit connection region, and the second portions of the bit lines are located on the second side of the unit connection region;
the first portions of the bit lines are electrically connected to first ends of the contact-level metal interconnects; and
the second portions of the bit lines are electrically connected to second ends of the contact-level metal interconnects which are opposite to the first ends.

13. The semiconductor structure of claim 10, wherein:
the bit line hook up region is located outside the memory array region;
the bit lines are cut into first and second portions in a unit connection region of the bit line hookup region, such that the first portions of the bit lines are located on the first side of the unit connection region located proximal to the memory array region, and the second portions of the bit lines comprise dummy bit lines that are not electrically connected to an input or output connection and that are located on the second side of the unit connection region distal from the memory array region;
the first portions of the bit lines are electrically connected to first ends of the contact-level metal interconnects; and
the second portions of the bit lines are not electrically connected to the contact-level metal interconnects.

14. The semiconductor structure of claim 1, wherein:
the bit lines have a uniform width along a first horizontal direction and laterally extend along a second horizontal direction;
the metal pads are arranged as multiple clusters, wherein each cluster of metal pads comprises a one-dimensional array of metal pads that are arranged along the second horizontal direction;
the bit lines have a uniform pitch along the first horizontal direction;
each cluster of metal pads has a lateral extent along the first horizontal direction that is at least three times the uniform pitch of the bit lines; and
the contact-level metal interconnects have a respective width that is at least twice the uniform width of the bit lines.

15. A method of forming a semiconductor structure comprising forming a memory die by:
forming an alternating stack of insulating layers and spacer material layers over a substrate, wherein the spacer material layers are formed as, or are replaced with, electrically conductive layers;
forming memory stack structures vertically extending through the alternating stacks, wherein each memory stack structure comprises a memory film, a vertical semiconductor channel located adjacent to the memory film and a drain region adjoined to a top end of the vertical semiconductor channel;
forming a contact-level dielectric layer over the alternating stack and the memory stack structures, wherein the contact-level dielectric layer embeds drain contact via structures that are electrically connected to a respective drain region, and embedding contact-level metal interconnects;
forming a via-level dielectric layer over the contact-level dielectric layer, wherein the via-level dielectric layer embeds drain-to-bit-line connection via structures that contact a respective one of the drain contact via structures, and embeds bit-line-connection via structures and pad-connection via structures that contact the contact-level metal interconnects; and
forming a bit-line-level dielectric layer over the via-level dielectric layer, wherein the bit-line-level dielectric layer embeds bit lines that contact a respective subset of the drain-to-bit-line connection via structures, and embeds metal pads that contact a respective one of the pad-connection via structures and have a respective width that is at least twice a width of each of the bit lines, wherein each of the metal pads is electrically connected to a respective bit line through a series connection of a respective pad-connection via structure, a respective contact-level metal interconnect, and a respective bit-line-connection via structure.

16. The method of claim 15, further comprising forming interconnect-level dielectric material layers embedding memory-side bonding pads and metal interconnect structures over the bit-line-level dielectric layer, wherein the metal interconnect structures provide electrical connection between a respective pair of a memory-side bonding pad of the memory-side bonding pads and a metal pad of the metal pads.

17. The method of claim 16, further comprising:
patterning the alternating stack to provide stepped surfaces in a staircase region, wherein the spacer material layers have lateral extents that decrease with a vertical distance from the substrate in the staircase region;
forming a retro-stepped dielectric material portion over the stepped surfaces, wherein the contact-level dielectric layer is formed over the retro-stepped dielectric material portion; and
forming layer contact via structures through the contact-level dielectric layer and the retro-stepped dielectric material portion, wherein the layer contact via structures contact a respective one of the electrically conductive layers.

18. The method of claim 16, further comprising:
providing a logic die including a support circuitry configured to control operation of a three-dimensional memory device within the memory die, wherein the logic die comprises logic-side bonding pads having a mirror image pattern of a pattern of the memory-side bonding pads; and
bonding the logic-side bonding pads to a respective one of the memory-side bonding pads.

19. The method of claim 18, wherein the support circuitry comprises a bit line driver electrically connected to the bit lines through a respective mating pair of a memory-side bonding pads and a logic-side bonding pads.

20. The method of claim 15, wherein:
the memory stack structures are formed in a memory array region in which all layers of the alternating stack are present;
each of the bit lines laterally extends across the memory array region and into a bit line hookup region that is adjacent to the memory array region; and
the bit-line-connection via structures contact a bottom surface of a respective one of the bit lines in the bit line hookup region.

* * * * *